United States Patent
Shanan

(10) Patent No.: US 10,277,233 B2
(45) Date of Patent: Apr. 30, 2019

(54) APPARATUS AND METHODS FOR FREQUENCY TUNING OF ROTARY TRAVELING WAVE OSCILLATORS

(71) Applicant: ANALOG DEVICES, INC., Norwood, MA (US)

(72) Inventor: Hyman Shanan, Franklin Park, NJ (US)

(73) Assignee: Analog Devices, Inc., Norwood, MA (US)

( * ) Notice: Subject to any disclaimer, the term of this patent is extended or adjusted under 35 U.S.C. 154(b) by 136 days.

(21) Appl. No.: 15/288,313

(22) Filed: Oct. 7, 2016

(65) Prior Publication Data
US 2018/0102781 A1    Apr. 12, 2018

(51) Int. Cl.
*H03L 7/06* (2006.01)
*H03L 7/099* (2006.01)
*H03B 5/18* (2006.01)

(52) U.S. Cl.
CPC ......... *H03L 7/0995* (2013.01); *H03B 5/1841* (2013.01); *H03B 2200/0016* (2013.01); *H03B 2201/0208* (2013.01); *H03L 2207/50* (2013.01)

(58) Field of Classification Search
CPC . H03L 7/0994; H03B 5/18; H03B 2201/0208; H03B 2207/50
USPC ........................................................ 327/159
See application file for complete search history.

(56) References Cited

U.S. PATENT DOCUMENTS

| 3,516,021 A | 6/1970 | Kohn |
| 3,538,450 A | 11/1970 | Andrea et al. |
| 4,246,550 A | 1/1981 | Cohen |
| 4,246,555 A | 1/1981 | Williams |

(Continued)

FOREIGN PATENT DOCUMENTS

| DE | 4322701 C1 | 7/1993 |
| EP | 0583839 A1 | 2/1994 |

(Continued)

OTHER PUBLICATIONS

Bubmann, Matthias, et al., "Active Compensation of Interconnect Losses for Multi-GHz Clock Distribution Networks," IEEE Transactions on Circuits and Systems-II: Analog and Digital Signal Processing, vol. 39, No. 11, Nov. 1992, pp. 790-798.

(Continued)

*Primary Examiner* — Ryan Jager
(74) *Attorney, Agent, or Firm* — Knobbe Martens Olson & Bear LLP

(57) ABSTRACT

Apparatus and methods for frequency tuning of rotary traveling wave oscillators (RTWOs) are provided herein. In certain configurations, distributed quantized tuning is used to tune a frequency of the RTWO. The RTWO includes a plurality of segments distributed around the RTWO's ring, and the segments include tuning capacitors and other circuitry. The distributed quantized frequency tuning is used to control the tuning capacitors in the RTWO's segments using separately controllable code values, thereby enhancing the RTWO's frequency step size or resolution. Moreover, in configurations including multiple RTWO rings that are locked to one another to reduce phase noise, the distributed quantized frequency tuning can be used to separately set the tuning capacitors across multiple RTWO rings that are coupled to one another.

20 Claims, 24 Drawing Sheets

(56) References Cited

U.S. PATENT DOCUMENTS

| | | |
|---|---|---|
| 4,514,707 A | 4/1985 | Dydyk et al. |
| 4,686,407 A | 8/1987 | Ceperley |
| 4,749,963 A | 6/1988 | Makimoto et al. |
| 4,875,046 A | 10/1989 | Lewyn |
| 5,117,206 A | 5/1992 | Imamura |
| 5,235,335 A | 8/1993 | Hester et al. |
| 5,302,920 A | 4/1994 | Bitting |
| 5,361,277 A | 11/1994 | Grover |
| 5,493,715 A | 2/1996 | Humphreys et al. |
| 5,546,023 A | 8/1996 | Borkar et al. |
| 5,584,067 A | 12/1996 | Buer et al. |
| 5,592,126 A | 1/1997 | Boudewijns et al. |
| 5,640,112 A | 6/1997 | Goto et al. |
| 5,652,549 A | 7/1997 | Unterricker et al. |
| 5,754,833 A | 5/1998 | Singh et al. |
| 5,825,211 A | 10/1998 | Smith et al. |
| 5,945,847 A | 8/1999 | Ransijn |
| 5,963,086 A | 10/1999 | Hall |
| 5,973,633 A | 10/1999 | Hester |
| 6,002,274 A | 12/1999 | Smith et al. |
| 6,078,202 A | 6/2000 | Tomatsuri et al. |
| 6,133,798 A | 10/2000 | Nagano et al. |
| 6,150,886 A | 11/2000 | Shimomura |
| 6,157,037 A | 12/2000 | Danielson |
| 6,239,663 B1 | 5/2001 | Mizutani |
| 6,249,189 B1 | 6/2001 | Wu et al. |
| 6,259,327 B1 | 7/2001 | Balistreri et al. |
| 6,259,747 B1 | 7/2001 | Gustafsson et al. |
| 6,281,759 B1 | 8/2001 | Coffey |
| 6,323,737 B1 | 11/2001 | Broekaert |
| 6,396,359 B1 | 5/2002 | Hajimiri et al. |
| 6,426,662 B1 | 7/2002 | Arcus |
| 6,525,618 B2 | 2/2003 | Wood |
| 6,556,089 B2 | 4/2003 | Wood |
| 6,566,968 B2 | 5/2003 | Aghahi |
| 6,574,288 B1 * | 6/2003 | Welland .................. H03L 7/099 375/327 |
| 6,683,503 B2 | 1/2004 | Mizuno et al. |
| 6,781,424 B2 | 8/2004 | Lee et al. |
| 6,816,020 B2 | 11/2004 | Wood |
| 6,856,208 B2 | 2/2005 | Lee et al. |
| 6,870,431 B2 | 3/2005 | Afghahi |
| 6,900,699 B1 | 5/2005 | Kim |
| 6,909,127 B2 | 6/2005 | O'Mahony et al. |
| 6,943,599 B2 | 9/2005 | Ngo |
| 6,995,620 B2 | 2/2006 | Afghahi |
| 7,005,930 B1 | 2/2006 | Kim et al. |
| 7,085,668 B2 | 8/2006 | Johnson |
| 7,088,154 B2 | 8/2006 | Ngo |
| 7,091,802 B2 | 8/2006 | Ham et al. |
| 7,130,604 B1 | 10/2006 | Wong et al. |
| 7,203,914 B2 | 4/2007 | Wood |
| 7,209,065 B2 | 4/2007 | Wood |
| 7,224,199 B1 | 5/2007 | Kang |
| 7,224,235 B2 | 5/2007 | De Ranter et al. |
| 7,236,060 B2 | 6/2007 | Wood |
| 7,242,272 B2 | 7/2007 | Ham et al. |
| 7,274,262 B2 | 9/2007 | Ham et al. |
| 7,280,001 B2 | 10/2007 | Maligeorgos et al. |
| 7,295,076 B2 | 11/2007 | Kim et al. |
| 7,307,483 B2 | 12/2007 | Tzartzanis et al. |
| 7,315,219 B2 | 1/2008 | Chiang |
| 7,339,439 B2 | 3/2008 | Roubadia et al. |
| 7,378,893 B1 | 5/2008 | Kang |
| 7,397,230 B2 | 7/2008 | Tabaian et al. |
| 7,409,012 B2 | 8/2008 | Martin et al. |
| 7,439,777 B2 | 10/2008 | Wood |
| 7,446,578 B2 | 11/2008 | Huang |
| 7,471,153 B2 | 12/2008 | Kee et al. |
| 7,482,884 B2 | 1/2009 | Wang et al. |
| 7,504,895 B2 | 3/2009 | Neidorff |
| 7,511,588 B2 | 3/2009 | Gabara |
| 7,513,873 B2 | 4/2009 | Shifrin |
| 7,515,005 B2 | 4/2009 | Dan |
| 7,541,794 B2 | 6/2009 | Tabaian et al. |
| 7,545,225 B2 | 6/2009 | Beccue |
| 7,551,038 B2 | 6/2009 | Jang et al. |
| 7,571,337 B1 | 8/2009 | Zhai et al. |
| 7,577,225 B2 | 8/2009 | Azadet et al. |
| 7,609,756 B2 | 10/2009 | Wood |
| 7,612,621 B2 | 11/2009 | Kim et al. |
| 7,616,070 B2 | 11/2009 | Tzartzanis et al. |
| 7,656,239 B2 | 2/2010 | Bietti et al. |
| 7,656,336 B2 | 2/2010 | Wood |
| 7,656,979 B2 | 2/2010 | Leydier et al. |
| 7,663,328 B2 | 2/2010 | Gonder |
| 7,715,143 B2 | 5/2010 | Bliss et al. |
| 7,741,921 B2 | 6/2010 | Ismailov |
| 7,782,988 B2 | 8/2010 | Ziesler |
| 7,805,697 B2 | 9/2010 | Wood |
| 7,833,158 B2 | 11/2010 | Bartz |
| 7,847,643 B2 | 12/2010 | Da Dalt |
| 7,885,625 B2 | 2/2011 | Muhammad et al. |
| 7,893,778 B2 | 2/2011 | Mohtashemi et al. |
| 7,907,023 B2 | 3/2011 | Liang et al. |
| 7,911,284 B2 | 3/2011 | Kuwano |
| 7,924,076 B2 | 4/2011 | Suzuki et al. |
| 7,936,193 B2 | 5/2011 | Van Der Wel et al. |
| 7,944,316 B2 | 5/2011 | Watanabe et al. |
| 7,952,439 B1 | 5/2011 | Heggemeier et al. |
| 7,973,609 B2 | 7/2011 | Ohara et al. |
| 7,978,012 B2 | 7/2011 | Wood |
| 7,995,364 B2 | 8/2011 | Shiu |
| 8,008,981 B2 | 8/2011 | Hong et al. |
| 8,049,563 B2 | 11/2011 | Aoki et al. |
| 8,089,322 B2 | 1/2012 | Martchovsky et al. |
| 8,115,560 B2 | 2/2012 | Chung |
| 8,169,267 B2 | 5/2012 | De Mercey |
| 8,193,870 B2 | 6/2012 | Takinami et al. |
| 8,410,858 B2 | 4/2013 | Wood |
| 8,629,807 B2 | 1/2014 | Wood et al. |
| 8,742,857 B2 | 6/2014 | Martchovsky et al. |
| 9,209,745 B2 | 12/2015 | Beccue |
| 9,473,069 B1 | 10/2016 | Beccue |
| 9,838,026 B2 * | 12/2017 | Van Brunt ............ H03L 7/1974 |
| 2003/0128075 A1 | 7/2003 | Wood |
| 2003/0151465 A1 * | 8/2003 | Wood .................. H03B 5/1852 331/107 SL |
| 2004/0233022 A1 | 11/2004 | Tsuzuki et al. |
| 2005/0068116 A1 | 3/2005 | Ham |
| 2006/0208776 A1 | 9/2006 | Tonietto et al. |
| 2008/0074202 A1 | 3/2008 | Gabara |
| 2008/0252386 A1 | 10/2008 | Kim |
| 2009/0215423 A1 | 8/2009 | Hwang et al. |
| 2009/0322394 A1 | 12/2009 | Song et al. |
| 2010/0066416 A1 * | 3/2010 | Ohara .................. H03L 7/085 327/107 |
| 2010/0117744 A1 | 5/2010 | Takinami et al. |
| 2010/0156549 A1 | 6/2010 | Uemura et al. |
| 2010/0321121 A1 | 12/2010 | Mohtashemi |
| 2011/0095833 A1 | 4/2011 | Mohtashemi et al. |
| 2011/0156760 A1 | 6/2011 | Bhuiyan et al. |
| 2011/0156773 A1 | 6/2011 | Beccue |
| 2011/0195683 A1 | 8/2011 | Brekelmans et al. |
| 2011/0286510 A1 | 11/2011 | Levantino et al. |
| 2012/0008717 A1 | 1/2012 | van Sinderen et al. |
| 2012/0013363 A1 | 1/2012 | Takinami et al. |
| 2012/0013407 A1 | 1/2012 | Takinami et al. |
| 2012/0025918 A1 | 2/2012 | Wang et al. |
| 2012/0112841 A1 | 5/2012 | Hayashi |
| 2012/0185623 A1 | 7/2012 | Ross et al. |
| 2013/0154750 A1 | 6/2013 | Martchovsky |
| 2013/0271190 A1 * | 10/2013 | Booth .................. H03L 7/0996 327/155 |
| 2016/0204764 A1 | 7/2016 | Ferriss |
| 2018/0102781 A1 * | 4/2018 | Shanan ................ H03L 7/0994 |
| 2018/0102782 A1 * | 4/2018 | Shanan ................ H03L 7/0995 |

FOREIGN PATENT DOCUMENTS

| | | |
|---|---|---|
| EP | 0633662 A1 | 1/1995 |
| EP | 0696843 A1 | 2/1996 |
| EP | 0478134 B1 | 6/1997 |
| EP | 0891045 B1 | 1/2002 |

(56) References Cited

FOREIGN PATENT DOCUMENTS

| GB | 1247199 | 9/1971 |
|---|---|---|
| GB | 2358562 | 7/2001 |
| JP | 60224205 | 11/1985 |
| JP | 4165809 | 6/1992 |
| WO | WO 95/12263 | 5/1995 |
| WO | WO 00/44093 | 7/2000 |

OTHER PUBLICATIONS

Deutsch, et al., "Modeling and Characterization of Long On-Chip Interconnections for High-Performance Microprocessors," IBM J Res. Develop., vol. 39, No. 5, Sep. 1995, pp. 547-567.

Divina et al., "The Distributed Oscillator at 4 GHZ," IEEE, Department Electromagnetic Field, May 1998, Czech Technical University in Prague, Technicka 2, 166 27 Praha 6, Czech Republic, pp. 1-4.

Dunning, Jim, "An All-Digital Phase-Locked Loop with 50-Cycle Lock Time Suitable for High-Performance Microprocessors," IEEE Journal of Solid-State Circuits, vol. 30, No. 4, Apr. 1995, pp. 412-422.

Hall, et al., "Clock Distribution Using Cooperative Ring Oscillators," IEEE, Proceedings of the 17th Conference on Advanced Research in VLSI, Ann Arbor, MI (Sep. 15-16, 1997) pp. 62-75.

Kato, Hatsuhiro, "A Dynamic Formulation of Ring Oscillator as Solitary-Wave Propagator," IEEE Transactions on Circuits and Systems-I: Fundamental Theory and Applications, vol. 45, No. 1, Jan. 1998, pp. 98-101.

Kim, et al., "A Low Phase-Noise CMOS LC Oscillator with a Ring Structure," 2000 IEEE International Solid-State Circuits Conference, 3 pages.

Kleveland, B. et al., "Line Inductance Extraction and Modeling in a Real Chip With Power Grid," IEEE IEDM Conference, 1999, Washington, D.C. pp. 1-4.

Kleveland, et al., "50 GHz Interconnect Design in Standard Silicon Technology," IEEE MIT-S International Microwave Symposium, Baltimore, Maryland, Jun. 1998, 4 pages.

Kleveland, et al., "Monolithic CMOS Distributed Amplifier and Oscillator," 1999 IEEE International Solid-State Circuits Conference, 1999, 9 pages.

Kral, et al., "RF-CMOS Oscillators With Switched Tuning," Proceedings of the IEEE 1998 Custom Integrated Circuits Conference, pp. 555-558.

Larsson, Hakan, 37 Distributed Synchronous Clocking Using Connected Ring Oscillators, Master's Thesis in Computer Systems Engineering, Centre for Computer Systems Architecture, Halmstad University: Halmstad, Sweden, Technical Report CCA—9705, Jan. 1997, pp. i-43.

Miller, Brian, "A Multiple Modulator Fractional Divider," IEEE Transactions on Instrumentation and Measurement, vol. 40, No. 3, Jun. 1991, pp. 578-583.

Nagashino, Hirofumi, et al., "Generation of Traveling Wave Mode in a Chained Neural Oscillator Network Model," IEEE, Proc. of the Int. Conference on Neural Networks (ICNN), New York, Mar. 1993, pp. 1550-1557.

Skvor, Z., et al., "Novel Decade Electronically Tunable Microwave Oscillator Based on the Distributed Amplifier," IEEE Explore, Electronic Letters, vol. 28, No. 17, Aug. 1992, pp. 1647-1648.

Takinami, et al., "A Distributed Oscillator Based All-Digital PLL With a 32-Phase Embedded Phase-to-Digital Converter," IEEE J Solid-State Circuits, vol. 46, No. 11, Nov. 2011, pp. 2650-2660.

Wilson, et al., "A CMOS Self-Calibrating Frequency Synthesizer," IEEE Journal of Solid-State Circuits, vol. 35, No. 10, Oct. 2000, pp. 1437-1444.

Wood, et al., "Rotary Traveling-Wave Oscillator Arrays: A New Clock Technology," IEEE J Solid-State Circuits, vol. 36, No. 11, Nov. 2001, pp. 1654-1665.

Yabuki, Hiroyuki, et al., "Miniaturized Stripline Dual-Mode Ring Resonators and Their Application to Oscillating Devices," IEEE MIT-S International Microwave Symposium Digest, New York, May 16, 1995, pp. 1313-1316.

Yue, et al., "On-Chip Spiral Inductors with Patterned Ground Shields for Si-Based RF IC's," IEEE Journal of Solid-State Circuits, vol. 33, No. 5, 1998, pp. 743-752.

International Search Report and Written Opinion for International Application No. PCT/US2017/054529 dated Jan. 18, 2018. (13 pages).

\* cited by examiner

FIG. 8A — FIG. 8I

FIG. 8A (201): Distributed PVT Tuning (baseline, all zeros)

FIG. 8B (202): $\Delta C = C_{LSB}$, $\Delta f = f_{LSB}$, Distributed PVT Tuning

FIG. 8C (203): $\Delta C = 2C_{LSB}$, $\Delta f = 2f_{LSB}$, Distributed PVT Tuning

FIG. 8D (204): $\Delta C = 3C_{LSB}$, $\Delta f = 3f_{LSB}$, Distributed PVT Tuning

FIG. 8E (205): $\Delta C = 4C_{LSB}$, $\Delta f = 4f_{LSB}$, Distributed PVT Tuning

FIG. 8F (206): $\Delta C = 5C_{LSB}$, $\Delta f = 5f_{LSB}$, Distributed PVT Tuning

FIG. 8G (207): $\Delta C = 6C_{LSB}$, $\Delta f = 6f_{LSB}$, Distributed PVT Tuning

FIG. 8H (208): $\Delta C = 7C_{LSB}$, $\Delta f = 7f_{LSB}$, Distributed PVT Tuning

FIG. 8I (209): $\Delta C = 8C_{LSB}$, $\Delta f = 8f_{LSB}$, Distributed PVT Tuning

210

| 0 | 1 0 0 1 0 0 | 0 |
|---|---|---|
| 0 0 1 0 1 0 | $\Delta C = 9C_{LSB}$ $\updownarrow$ $\Delta f = 9f_{LSB}$ DISTRIBUTED PVT TUNING | 1 0 1 0 0 0 |
| 0 | 0 0 1 ⊠ 0 0 1 | 0 |

| 0 | 1 0 1 0 1 0 0 | 0 |
|---|---|---|
| 0 0 1 0 0 0 | $\Delta C = 10C_{LSB}$ $\updownarrow$ $\Delta f = 10f_{LSB}$ DISTRIBUTED PVT TUNING | 1 0 0 0 0 0 |
| 0 | 0 0 1 ⊠ 0 0 1 | 0 |

| 0 | 1 0 1 0 1 0 0 | 0 |
|---|---|---|
| 0 0 1 0 1 0 | $\Delta C = 11C_{LSB}$ $\updownarrow$ $\Delta f = 11f_{LSB}$ DISTRIBUTED PVT TUNING | 1 0 1 0 0 0 |
| 0 | 0 0 1 ⊠ 0 0 1 | 0 |

| 0 | 1 0 1 0 1 0 0 | 0 |
|---|---|---|
| 0 0 1 0 1 0 1 | $\Delta C = 12C_{LSB}$ $\updownarrow$ $\Delta f = 12f_{LSB}$ DISTRIBUTED PVT TUNING | 1 0 1 0 1 0 0 |
| 0 | 0 0 1 ⊠ 1 0 1 | 0 |

| 0 | 1 0 1 0 1 0 0 | 0 |
|---|---|---|
| 1 0 1 0 1 0 1 | $\Delta C = 13C_{LSB}$ $\updownarrow$ $\Delta f = 13f_{LSB}$ DISTRIBUTED PVT TUNING | 1 0 1 0 1 0 0 |
| 0 | 0 0 1 ⊠ 1 0 1 | 0 |

| 0 | 1 0 1 0 1 0 1 | 0 |
|---|---|---|
| 1 0 1 0 1 0 1 | $\Delta C = 14C_{LSB}$ $\updownarrow$ $\Delta f = 14f_{LSB}$ DISTRIBUTED PVT TUNING | 1 0 1 0 1 0 0 |
| 0 | 0 0 1 ⊠ 1 0 1 | 0 |

| 0 | 1 0 1 0 1 0 1 | 0 |
|---|---|---|
| 1 0 1 0 1 0 1 | $\Delta C = 15C_{LSB}$ $\updownarrow$ $\Delta f = 15f_{LSB}$ DISTRIBUTED PVT TUNING | 1 0 1 0 1 0 1 |
| 0 | 0 0 1 ⊠ 1 0 1 | 0 |

| 0 | 1 0 1 0 1 0 1 | 0 |
|---|---|---|
| 1 0 1 0 1 0 1 | $\Delta C = 16C_{LSB}$ $\updownarrow$ $\Delta f = 16f_{LSB}$ DISTRIBUTED PVT TUNING | 1 0 1 0 1 0 1 |
| 0 | 1 0 1 ⊠ 1 0 1 | 0 |

| 1 | 1 1 1 1 1 1 1 | 1 |
|---|---|---|
| 1 1 1 1 1 1 1 | $\Delta C = 32C_{LSB}$ $\updownarrow$ $\Delta f = 32f_{LSB}$ DISTRIBUTED PVT TUNING | 1 1 1 1 1 1 1 |
| 1 | 1 1 1 ⊠ 1 1 1 | 1 |

FIG.8R

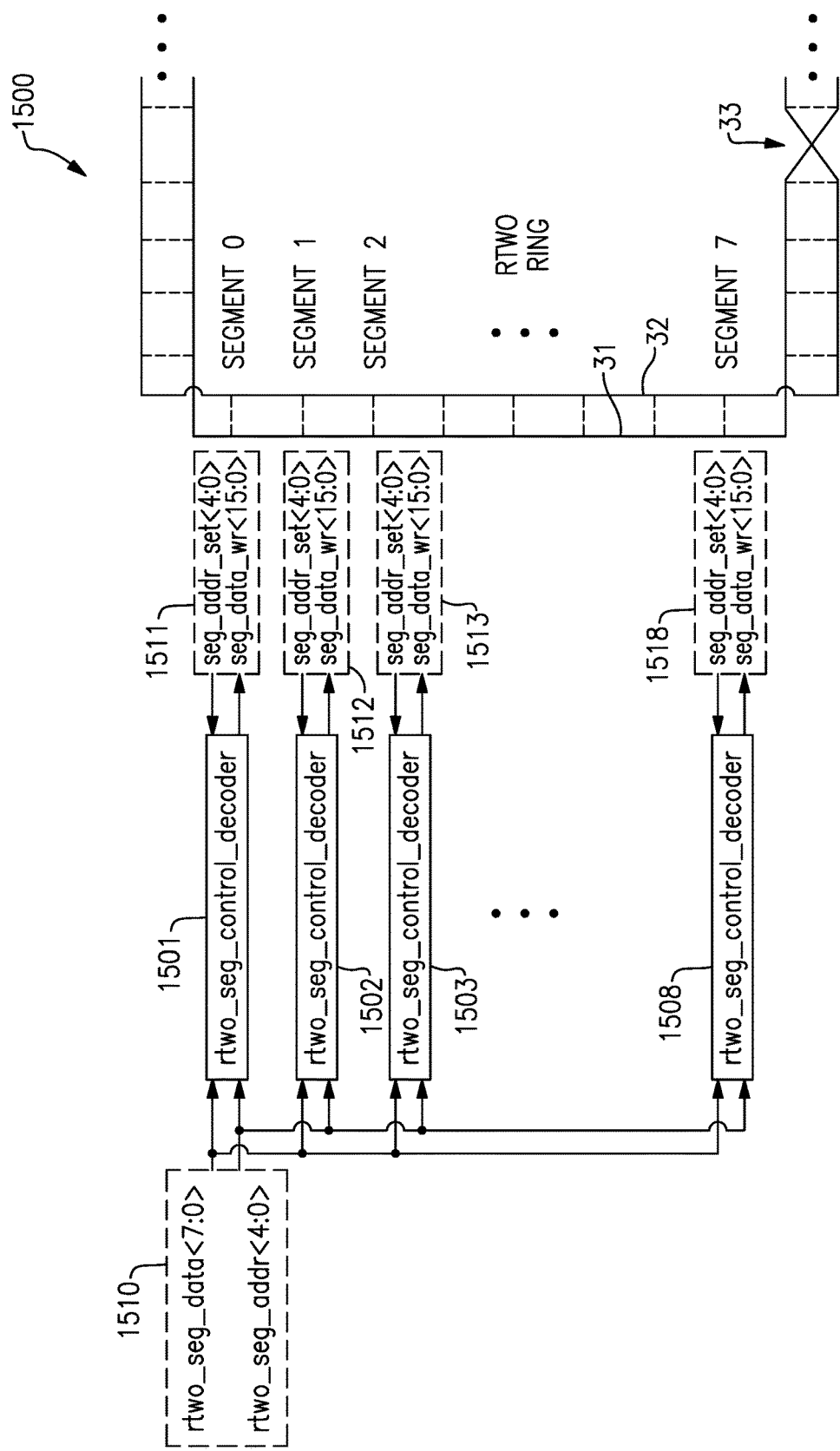

APPARATUS AND METHODS FOR FREQUENCY TUNING OF ROTARY TRAVELING WAVE OSCILLATORS

FIELD OF THE DISCLOSURE

Embodiments of the invention relate to electronic systems, and more particularly, to rotary traveling wave oscillators (RTWOs).

BACKGROUND

Rotary traveling wave oscillators (RTWOs) can be used in a variety of applications, including, for example, telecommunications systems, optical networks, and/or chip-to-chip communication. For instance, an RTWO can be used in a frequency synthesizer to generate an output clock signal having a controlled phase and frequency relationship to a reference clock signal.

SUMMARY OF THE DISCLOSURE

In one aspect, an RTWO is provided. The RTWO includes an RTWO ring including a first transmission line conductor and a second transmission line conductor and configured to carry a traveling wave, and a plurality of segments positioned around the RTWO ring. Additionally, a first segment of the plurality of segments includes a pair of metal stubs including a first metal stub electrically connected to the first transmission line conductor and a second metal stub electrically connected to the second transmission line conductor, and one or more capacitor tuning banks electrically connected to the pair of metal stubs and operable to control an oscillation frequency of the RTWO.

In some embodiments, the first segment further includes a TDC latch electrically connected between the first metal stub and the second metal stub and operable to detect passage of the traveling wave.

In a number of embodiments, the first metal stub and the second metal stub have substantially equal length.

According to various embodiments, the first metal stub and the second metal stub each have a length of at least a factor of 0.05 of a wavelength of the traveling wave.

In some embodiments, the first metal stub and the second metal stub each have a length of at least about 25 µm.

According to a number of embodiments, the first segment further includes a first tap buffer including an input electrically connected to the first metal stub, and a second tap buffer including an input electrically connected to the second metal stub.

In several embodiments, the first segment further includes a regeneration circuit electrically connected between the first metal stub and the second metal stub and configured to provide energy to the traveling wave to compensate for a loss of the differential transmission line.

In various embodiments, each of the plurality of segments includes a plurality of tuning capacitor banks operable to provide a LSB tuning resolution of 50 kHz/LSB or smaller and a tuning range of 4 GHz or greater.

In some embodiments, the one or more capacitor tuning banks includes a fine tuning capacitor bank electrically connected between the first metal stub and the second metal stub, and a coarse tuning capacitor bank electrically connected between the first metal stub and the second metal stub. According to a number of embodiments, the one or more capacitor tuning banks further includes a PVT tuning capacitor bank electrically connected between the first metal stub and the second metal stub.

In various embodiments, each of the segments includes a TDC latch, and the RTWO further includes a clock distribution tree and a reference clock buffer configured to provide a reference clock signal to the TDC latch of each of the segments via the clock distribution tree.

In another aspect, a PLL is provided. The PLL includes a PLL core configured to generate one or more frequency tuning codes and an RTWO including a ring including a first transmission line conductor and a second transmission line conductor and configured to carry a traveling wave, and a plurality of segments positioned around the ring. Each of the segments includes a pair of metal stubs including a first metal stub electrically connected to the first transmission line conductor and a second metal stub electrically connected to the second transmission line conductor, and one or more capacitor tuning banks electrically connected to the pair of metal stubs and operable to control an oscillation frequency of the RTWO based on the one or more frequency tuning codes.

In some embodiments, the first metal stub and the second metal stub each have a length of at least a factor of 0.05 of a wavelength of the traveling wave.

In various embodiments, the RTWO is configured to operate in the PLL as both a digitally controlled oscillator and a time to digital converter.

In a number of embodiments, the one or more capacitor tuning banks includes a fine tuning capacitor bank and a coarse tuning capacitor bank, and the one or more frequency tuning codes includes a coarse tuning code and a fine integer tuning code.

In another aspect, an RTWO is provided. The RTWO includes at least one RTWO ring, a plurality of segments positioned around the at least one RTWO ring, and a segment decoder system. Each of the plurality of segments includes one or more configurable circuits, and the segment decoder system is electrically connected to the plurality of segments and is configured to control writing of configuration data to the one or more configurable circuits based on a segment address signal.

In some embodiments, each of the plurality of segments are individually addressable via the segment address signal.

In various embodiments, the segment decoder system includes a plurality of segment decoders each of which is connected to a corresponding one of the plurality of segments.

In several embodiments, the RTWO further includes a serial interface configured to provide a segment data signal and the segment address signal to the segment decoder system. In a number of embodiments, the segment decoder system is configured to select a segment of the plurality of segments based on a value of the segment address signal, and to write a plurality of bits of the segment data signal to the selected segment. According to some embodiments, the segment decoder system is configured to write the plurality of bits of the segment data signal to the selected segment in multiple clock cycles over one or more wires of fewer number than the plurality of bits. In various embodiments, the segment decoder system is configured to select a segment of the plurality of segments based on a value of the segment address signal, and to read one or more bits from the selected segment. In a number of embodiments, the serial interface includes a local SPI.

In some embodiments, the one or more configurable circuits includes at least one of a regeneration circuit, a latch, a tuning capacitor, or a tap buffer.

In various embodiments, the configuration data is operable to control at least one of a bias current, a resistance value, a capacitance value, or a transistor width of the one or more configurable circuits.

In another aspect, an RTWO is provided. The RTWO includes a first RTWO ring, a plurality of segments positioned around the first RTWO ring and including a plurality of tuning capacitors that are selectable to control an oscillation frequency of the RTWO, and decoder circuitry operable to control selection of the plurality of tuning capacitors based on one or more frequency tuning codes. The selection of the plurality of tuning capacitors is quantized across the plurality of segments.

In some embodiments, the decoder circuitry includes a plurality of local decoders each configured to control a number of selected capacitors for a corresponding one of the plurality of segments, and a plurality of tuning decoders configured to control the plurality of local decoders based on the one or more frequency tuning codes.

In a number of embodiments, the one or more frequency tuning codes includes a fine frequency tuning code, wherein the decoder circuitry is implemented such that a selection of one or more tuning decoders in response to a given value of the fine frequency tuning code is dynamically chosen. In various embodiments, the decoder circuitry is implemented such that a sequence of selecting each of the plurality of tuning decoders is different for a first ramp of the fine frequency tuning code relative to a second ramp of the fine frequency tuning code. In several embodiments, the sequence of selecting rotates through a plurality of different selection sequences. According to several embodiments, the sequence of selecting is chosen randomly or pseudo-randomly.

In a variety of embodiments, the decoder circuitry is implemented such that a selection of one or more tuning capacitors in response to a given value of the one or more frequency tuning codes is dynamically chosen.

In some embodiments, the first RTWO ring includes a plurality of sides, and the decoder circuitry is further configured to balance a number of selected tuning capacitors for each side of the RTWO ring. Accordingly to various embodiments, the decoder circuitry is implemented such that the number of selected tuning capacitors per side of the RTWO ring is at most one tuning capacitor apart for each value of the one or more frequency tuning codes.

In various embodiments, the RTWO further includes a second RTWO ring locked to the first RTWO ring, and the decoder circuitry separately controls a number of selected capacitors of the first RTWO ring and the second RTWO ring. In accordance with a number of embodiments, the decoder circuitry is further configured to balance a number of selected tuning capacitors for the first and second RTWO rings. According to some embodiments, the decoder circuitry is implemented such that a number of selected tuning capacitors per RTWO ring is at most one tuning capacitor apart for each value of the one or more frequency tuning codes.

In a number of embodiments, the plurality of tuning capacitors includes at least one of a plurality of coarse tuning capacitors, a plurality of fine tuning capacitors, or a plurality of PVT tuning capacitors.

In several embodiments, the one or more frequency tuning codes includes a fine frequency tuning code, and the decoder circuitry is further configured to receive an offset code operable to provide a capacitance adjustment to a particular segment of the plurality of segments by adjusting a value of the fine frequency tuning code. In various embodiments, the offset code is configured to provide a dynamic capacitance adjustment to the plurality of segments while the RTWO is operational to linearize the RTWO.

In another aspect, a PLL with fine frequency tuning resolution is provided. The PLL includes a PLL core configured to generate one or more frequency tuning codes, and an RTWO. The RTWO includes a first RTWO ring, a plurality of segments positioned around the first RTWO ring and including a plurality of tuning capacitors that are selectable to control an oscillation frequency of the RTWO, and decoder circuitry operable to control selection of the plurality of tuning capacitors based on the one or more frequency tuning codes. The selection of the plurality of tuning capacitors is quantized across the plurality of segments.

In various embodiments, the decoder circuitry includes a plurality of local decoders each configured to control a number of selected capacitors for a corresponding one of the plurality of segments, and a plurality of tuning decoders configured to control the plurality of local decoders based on the one or more frequency tuning codes.

In some embodiments, the one or more frequency tuning codes includes a fine frequency tuning code, wherein the decoder circuitry is implemented such that a selection of one or more tuning decoders in response to a given value of the fine frequency tuning code is dynamically chosen. In several embodiments, the decoder circuitry is implemented such that a sequence of selecting each of the plurality of tuning decoders is different for a first ramp of the fine frequency tuning code relative to a second ramp of the fine frequency tuning code.

In a number of embodiments, the PLL further includes a second RTWO ring locked to the first RTWO ring, and the decoder circuitry separately controls a number of selected capacitors of the first RTWO ring and the second RTWO ring. In various embodiments, the one or more frequency tuning codes includes a fine frequency tuning code, and the decoder circuitry is further configured to receive an offset code operable to provide a capacitance adjustment to a particular segment of the plurality of segments by adjusting a value of the fine frequency tuning code.

In some embodiments, the PLL core is configured to control the value of the offset code to dynamically change a capacitance of the plurality of segments to linearize the RTWO.

In a number of embodiments, the frequency step size of the RTWO corresponds to a frequency change resulting from selection of one tuning capacitor of one segment.

In another aspect, an RTWO is provided. The RTWO includes a first RTWO ring, a plurality of segments positioned around the first RTWO ring and including a plurality of tuning capacitors that are selectable to control an oscillation frequency of the RTWO, and decoder circuitry including a plurality of local decoders each configured to control a number of selected tuning capacitors in a respective one of the plurality of segments. Additionally, a plurality of input codes to the plurality of local decoders are separately controllable.

In some embodiments, the decoder circuitry further includes a plurality of tuning decoders configured to control the plurality of input codes based on one or more frequency tuning codes.

In a number of embodiments, the one or more frequency tuning codes includes a fine frequency tuning code, and the decoder circuitry is implemented such that a selection of one or more tuning decoders in response to a given value of the fine frequency tuning code is dynamically chosen.

In several embodiments, the RTWO further includes a second RTWO ring locked to the first RTWO ring, and the decoder circuitry separately controls a number of selected capacitors of the first RTWO ring and the second RTWO ring.

According to some embodiments, the one or more frequency tuning codes includes a fine frequency tuning code, and the decoder circuitry is further configured to receive an offset code operable to provide a capacitance adjustment to a particular segment of the plurality of segments by adjusting a value of the fine frequency tuning code.

BRIEF DESCRIPTION OF THE DRAWINGS

FIGS. 8A-8R illustrates an RTWO tuning capacitor sequence for process, voltage, and temperature (PVT) tuning according to one embodiment.

FIGS. 13A-1 and 13A-2 illustrate one embodiment of dynamic element matching for segment selection of an RTWO.

FIGS. 13B-1 and 13B-2 illustrate another embodiment of dynamic element matching for segment selection of an RTWO.

FIGS. 13C-1 and 13C-2 illustrate another embodiment of dynamic element matching for segment selection of an RTWO.

FIG. 14 illustrates one embodiment of an RTWO with segmented digital addressing.

DETAILED DESCRIPTION OF EMBODIMENTS

Figure 1:
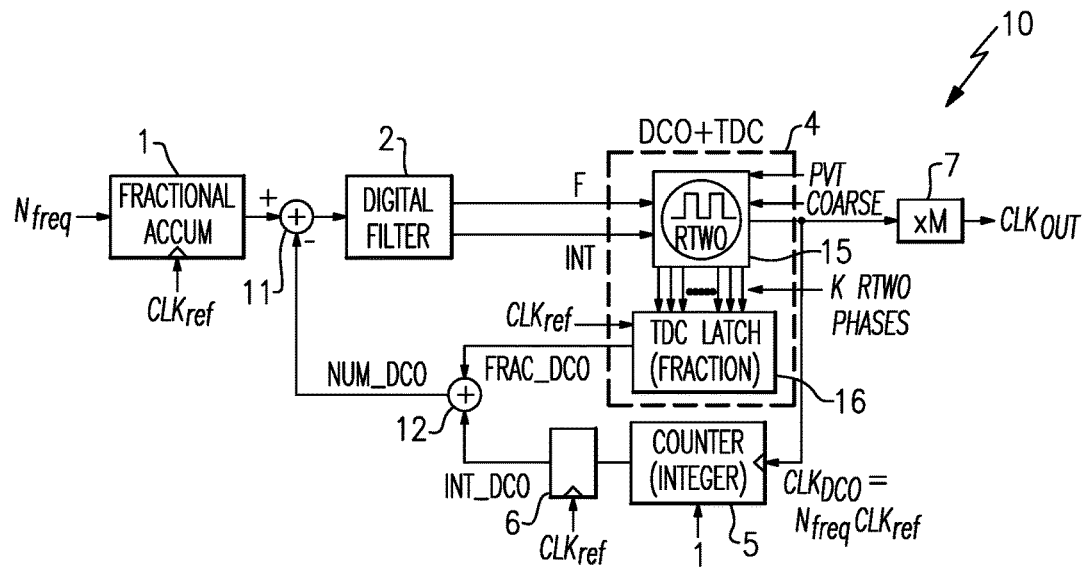
FIG. 1 is a schematic diagram of an all-digital phase-locked loop (ADPLL) according to one embodiment.

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

As persons having ordinary skill in the art will appreciate, a rotary traveling wave oscillator (RTWO) can include a differential transmission line connected in a ring with an odd number of one or more crossovers, and a plurality of regeneration circuits electrically connected along a path of the differential transmission line. Additionally, each of the crossovers can reverse the polarity of a wave propagating along the differential transmission line, and the regeneration circuits can provide energy to the wave to compensate for the differential transmission line's losses. Additional details of RTWOs can be as described in U.S. Pat. No. 6,556,089, issued Apr. 29, 2003, and titled "ELECTRONIC CIRCUITRY," which is hereby incorporated by reference in its entirety herein.

Apparatus and methods for RTWOs are provided herein.

In a first aspect, an RTWO includes a differential transmission line connected in a ring and a plurality of segments distributed around the ring. The segments include metal stubs extending from the RTWO's differential transmission line. The metal stubs aid in providing access to additional layout resources for tuning capacitors and other circuitry of the RTWO's segments, while permitting the length of RTWO's ring to be relative short. Thus, the metal stubs do not inhibit the RTWO from operating with relatively high oscillation frequency, for instance, 10 GHz or more, while providing connectivity to tuning capacitors that tune the RTWO's oscillation frequency over a wide tuning range and/or provide fine frequency step size. In certain implementations, the RTWO is tunable via coarse and fine tuning capacitors to provide wide tuning range, temperature tracking, and wide bandwidth frequency ramps, for instance, ramps up to about 1 GHz at 10 GHz.

In a second aspect, a distributed quantized scheme is provided for tuning a frequency of the RTWO. The RTWO includes a plurality of segments distributed around the RTWO's ring, and the segments include tuning capacitors and other circuitry. The distributed quantized frequency tuning is used to control the tuning capacitors in the RTWO's segments using separately controllable code values, thereby enhancing the RTWO's frequency step size or resolution. Moreover, in configurations including multiple RTWO rings that are locked to one another to reduce phase noise, the distributed quantized frequency tuning can be used to separately set the tuning capacitors across multiple RTWO rings that are coupled to one another, for instance, a 4-coupled ring RTWO configuration. Implementing the RTWO with distributed quantized frequency tuning achieves a relatively fine frequency resolution, for instance, a least significant bit (LSB) tuning resolution of 50 kHz/LSB or smaller and a relatively wide tuning range, for instance 4 GHz or greater. The distributed quantized scheme can be used for a variety of types of tuning, including, but not limited to, coarse tuning, fine tuning, and process, voltage, and temperature (PVT) tuning.

In a third aspect, a segmented decoding scheme is provided for RTWO frequency tuning codes to reduce decoding complexity. The segmented decoding scheme can operate using a combination of global and local decoding for the frequency tuning codes from a phase-locked loop (PLL)

core to reduce the number of wires or conductors between the PLL core and the RTWO by a relatively large amount, for instance, a factor of 10 or more.

In a fourth aspect, a dynamic element matching scheme is provided to linearize the fine-tuning gain characteristics of the RTWO. For example, dynamic element matching can be used to reduce or eliminate periodicity of a fixed sequence of segment selection used in the segmented decoding scheme for the RTWO. By reducing or eliminating periodicity in segment sequence selection, undesirable spurious frequency components can be mitigated. In contrast, a fixed sequence of selecting RTWO segments can degrade spectral integrity by generating spurious frequency components due to the non-linearity of the fine tuning characteristics of the RTWO.

In a fifth aspect, a segmented digital addressing scheme is provided to individually control parameters of an RTWO's segments. In certain implementations, a serial interface communicates with the segments via segment decoders that operate with shared or common wires to reduce routing congestion. The controllable parameters can include, but are not limited to, bias settings (for instance, a bias current level) of the amplifiers used in the RTWO's regeneration circuits, bias settings of a sampling latch of the RTWO (for instance, for a time-to-digital converter function), and/or to provide a segment-specific capacitance adjustment to provide a linearity correction. Thus, the settings of a particular RTWO segment can be selected to provide adjustments or corrections for linearity or other operating characteristics, thereby enhancing performance.

The teachings herein can be used to provide a number of advantages. In one example, an RTWO-based all-digital phase-locked loop (ADPLL) operates with relatively wide frequency tuning range and/or fine frequency tuning resolution. Moreover, the RTWO-based ADPLL can operate with superior robustness to maintaining lock in the presence of process, temperature, and/or voltage variations.

The RTWOs herein can exhibit relatively low phase noise. In one example, a four-coupled ring RTWO achieves a single sideband (SSB) phase noise of −121 dBc/Hz at 8.8 GHz.

The RTWOs herein can also be implemented with relatively compact area and exhibit relatively low power dissipation. In one example, an RTWO with four coupled rings consumes less than about 190 mW when operating at about 0.9V, and occupies an area of less than about 1.2 mm$^2$.

The RTWOs herein can also exhibit a relatively wide tuning range. In one example, an RTWO is tunable over a frequency range of more than 3 GHZ, for instance, between about 8.8 GHz and 12 GHz for one implementation with four coupled rings.

The wide tuning range can provide a number of advantages. For example, an RTWO can be used in a PLL, which can remain locked over a wide range of temperature variation. For instance, the RTWO can be calibrated an extreme end of an operating temperature range, and the PLL's loop can remain locked as temperature varies to the opposite end of the temperature range. In one example, the RTWO is calibrated at a low end of a temperature range, for instance, −40° C., and the PLL remains locked as the temperature is gradually increased to a high end of the temperature range, for instance, 125° C. In another example, the RTWO is calibrated the high end of the temperature range, and the PLL remains locked as the temperature is gradually decreased to the low end of the temperature range. For instance, in such examples, the RTWO may utilize 40% or less of the RTWO's fine tuning range in response to the change in operating temperature.

When used in a PLL, the RTWO can provide a relatively small amount of output clock jitter. In one example implementation, across the RTWO's tuning range, an ADPLL achieved a closed-loop root mean square (RMS) jitter of about 240 fs or less when operating between about 1 kHz and 100 MHz over a temperature range of about −40° C. to about 125° C.

Example of an all-Digital Phase-Locked Loop with a Rotary Traveling Wave Oscillator In certain configurations herein, an all-digital phase-locked loop (ADPLL) including a rotary traveling wave oscillator (RTWO) is provided. The ADPLL can be used in a variety of applications, including, but not limited to, telecommunications, chip-to-chip communication, and/or automatic test equipment. In one example, the ADPLL generates an output clock signal having a wide variety of frequency ramp profiles and/or rates.

In contrast, an analog PLL with charge pumps can suffer from supply voltage variation, narrow tuning voltage range, and/or variation in loop dynamics. These drawbacks can be exacerbated in implementations using relatively small geometry processes, for instance, fine line CMOS processes. Although an ADPLL architecture can provide a number of advantages, the teachings herein are also applicable to RTWOs used in other electronic systems, such as analog PLLs using RTWOs.

In certain implementations, an ADPLL includes an RTWO that operates both as a digitally-controlled oscillator (DCO) and as a time-to-digital converter (TDC). Implementing the RTWO to provide a multitude of functions enhances a compactness of a design by using the RTWO for multiple purposes.

By using an RTWO in the ADPLL, a low figure of merit (FOM) can be achieved. The superior FOM is achieved in part by a fine resolution of the RTWO's TDC.

Although the RTWOs described herein can be used in ADPLLs, an RTWO implemented in accordance with the teachings herein can be used in a wide range of electronic systems and applications.

FIG. 1 is a schematic diagram of an ADPLL 10 according to one embodiment. The ADPLL 10 includes a fractional accumulator 1, a digital filter 2, a combined digitally controlled oscillator (DCO) and time-to-digital converter (TDC) 4, a counter 5, counter latches 6, a multiplier 7, a subtraction block 11, and an addition block 12. The combined DCO and TDC 4 includes an RTWO 15 and TDC latches 16.

As shown in FIG. 1, the ADPLL 10 includes the fractional accumulator 1, which accumulates a digital tuning word or code $N_{freq}$ at the rate of a reference clock signal $CLK_{REF}$. The digital tuning code $N_{freq}$ can be used to control an output frequency of the ADPLL 10. In the illustrated embodiment, for each cycle of the reference clock signal $CLK_{REF}$, the subtraction block 11 generates a difference signal based on a difference between an output of the fractional accumulator 1 and a number of DCO clocks NUM_DCO generated in part by the RTWO 15. The number of DCO clocks NUM_DCO corresponds to a digital code represented in integer and fractional form.

As shown in FIG. 1, the RTWO 15 and the TDC latches 16 operate to generate a fractional number of DCO clocks FRAC_DCO, which the addition block 12 combines with an integer number of DCO clocks INT_DCO to generate the number of DCO clocks NUM_DCO. In particular, the RTWO 15 generates K clock phases that are provided to the TDC latches 16. The TDC latches 16 process the K clock phases from the RTWO 15 based on timing of the reference clock signal $CLK_{REF}$ to determine the fractional number of DCO clocks FRAC_DCO. The K clock phases have the same oscillation frequency as one another, but different phases. In one embodiment, the RTWO outputs 64 or more phases to the TDC latches 16. However, other implementations are possible.

Although the TDC latches 16 are illustrated as a separate block from the RTWO 15, in certain implementations the TDC latches 16 are integrated into a layout of the RTWO 15, such as incorporated into the layout of the RTWO's segments.

With continuing reference to FIG. 1, the RTWO 15 outputs a DCO clock signal $CLK_{DCO}$, which can correspond to one of the K clock phases in certain implementations. In the illustrated embodiment, the DCO clock signal $CLK_{DCO}$ serves as an input to the multiplier 7, which multiplies the DCO clock signal $CLK_{DCO}$ by a multiplication factor M to generate an output clock signal $CLK_{OUT}$. Including the multiplier 7 enhances flexibility of the ADPLL 10 by expanding a range of frequencies that the output clock signal $CLK_{OUT}$ can be controlled. For instance, the multiplier 7 can be used to control the output clock signal $CLK_{OUT}$ to frequencies greater than a maximum oscillation frequency of the RTWO 15, and thus can serve as a frequency multiplier.

In one example, an RTWO is multiplied by a multiplication factor M. In another example, a multiplier is omitted.

As shown in FIG. 1, the DCO clock signal $CLK_{DCO}$ is provided to the integer counter 5, which operates in combination with the counter latches 6 to generate the integer number of DCO cycles INT_DCO. In the illustrated embodiment, the integer counter 5 counts a number of cycles of the DCO clock signal $CLK_{DCO}$. For example, the integer counter 5 can be loaded with an initial value of 1, and thereafter increment by 1 for each cycle of the DCO clock signal $CLK_{DCO}$.

The difference signal generated by the subtraction block 11 is filtered by the digital filter 2. Additionally, the filtered difference signal is used to tune RTWO 15 with both an integer digital tuning code INT and a fractional digital tuning code F, in this embodiment.

The RTWO 15 of FIG. 1 is tuned by the integer digital tuning code INT and the fractional digital tuning code F to change the RTWO's fundamental oscillation frequency. In certain implementations, the RTWO 15 can employ additional tuning, including, for example, coarse tuning and/or process, voltage, and temperature (PVT) tuning.

Accordingly, in certain implementations, the fractional digital tuning code F provides fine fractional tuning of the RTWO 15, and the integer digital tuning code INT provides fine integer tuning.

The RTWO 15 can be implemented to include one or more features disclosed herein. In one embodiment, the RTWO 15 is implemented with at least one of distributed quantized tuning, segmented decoding, dynamic element matching, segmented digital addressing, or segments including metal stubs.

The ADPLL 10 illustrates one example of an electronic system that can include an RTWO implemented in accordance with the teachings herein. However, the RTWOs described herein can be used in a wide variety of electronic systems, including, but not limited to, a wide variety of data converters and/or frequency synthesizers.

Figure 2:
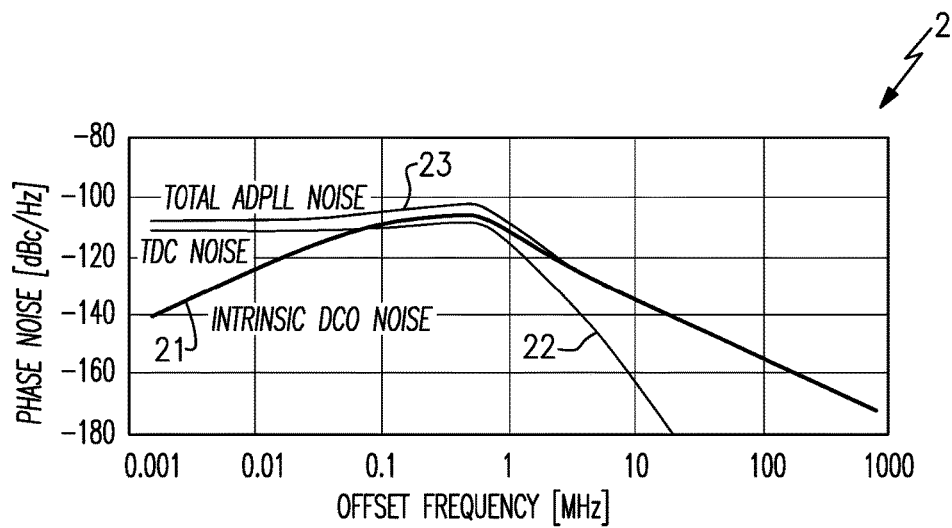
FIG. 2 is an example of a graph of phase noise versus offset frequency for one implementation of the ADPLL of FIG. 1.

FIG. 2 is an example of a graph 20 of phase noise versus offset frequency for one implementation of the ADPLL 10 of FIG. 1.

The graph 20 includes a first plot 21 of intrinsic DCO phase noise for the combined DCO and TDC 4, a second plot 22 of TDC phase noise for the combined DCO and TDC 4, and a third plot 23 of total ADPLL phase noise.

As shown by FIG. 2, the RTWO TDC and DCO functions substantially dominate the ADPLL phase noise at low frequency and high frequency offsets, respectively.

Although one example graph of phase noise for offset frequency is shown in FIG. 2, other phase noise versus offset frequency characteristics are possible.

Figure 3:
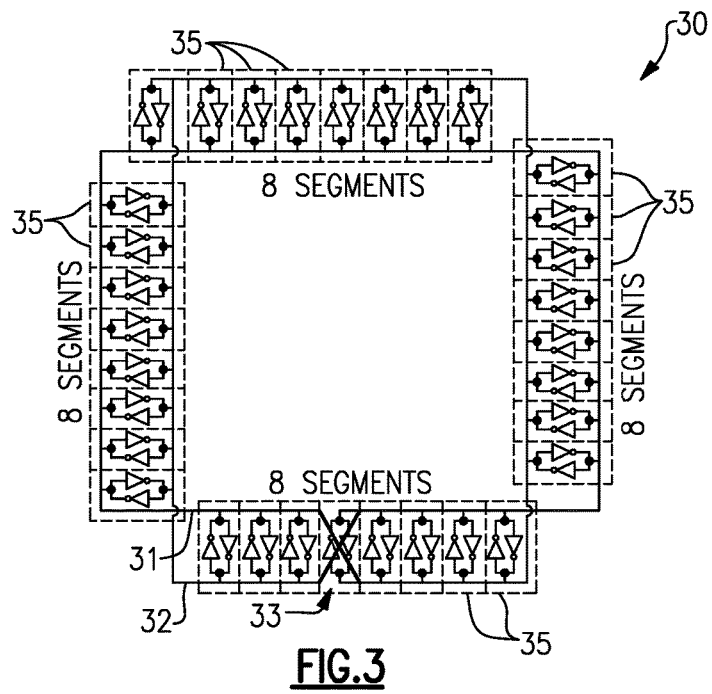
FIG. 3 is a schematic diagram of one implementation of a rotary traveling wave oscillator (RTWO).

FIG. 3 is a schematic diagram of one implementation of an RTWO 30. The RTWO 30 includes a differential transmission line including a first conductor 31 and a second conductor 32. As shown in FIG. 3, the differential transmission line 31, 32 is connected in a closed-loop or ring, and the differential transmission line includes a crossover 33 to provide inversion to a traveling wave propagating around the ring. The RTWO 30 of FIG. 3 further includes a plurality of segments 35 each including a regeneration circuit.

The illustrated RTWO 30 includes one crossover and thirty-two regeneration circuits, each implemented using back-to-back inverters, in this example. However, other configurations are possible, including, for example, configurations using a different number of crossovers, more or fewer segments, more or fewer regeneration circuits, and/or regeneration circuits implemented in other ways. Furthermore, the RTWO 30 can include other circuitry, including, but not limited to, tuning capacitors, latches, buffers, and/or other circuitry in the segments 35.

As shown in FIG. 3, the RTWO's differential transmission line is connected in a closed-loop and is folded at each of four corners. However, the RTWO's differential transmission line can be implemented in other ways, including, for example, different implementations of folding and/or routing of the conductors 31, 32. For instance, the teachings herein are applicable not only to RTWOs implemented using rectangular or square rings, but also to RTWOs including transmission lines shaped in other ways. Thus, although the illustrated RTWO includes four sides, the teachings herein are applicable to RTWOs including more or fewer sides as well as to RTWOs with curved rings.

In the illustrated embodiment, the RTWO 30 includes segments 35, which each include a regeneration circuit distributed at substantially regular intervals around the differential transmission line. Distributing the regeneration circuits uniformly aids in maintaining a uniform characteristic impedance of the differential transmission line and substantially constant wave velocity. Although each segment 35 includes one pair of back-to-back inverters, the teachings herein are applicable to segments including other numbers of regeneration circuits and/or different implementations of regeneration circuits.

In the illustrated embodiment, the RTWO 30 is segmented into 8 segments per side. Since each of the conductors 31, 32 provides a clock signal phase, the 32 illustrated segments 35 operate with 64 total clock signal phases. However, other implementations are possible.

The oscillation frequency $f_{OSC}$ of the RTWO 30 is based on a speed of a traveling wave propagating along the transmission line divided by a total length or distance the wave travels in a cycle. In certain implementations, the oscillation frequency $f_{OSC}$ of the RTWO 30 is given by Equation 1 below, where $v_p$ is the wave phase velocity, l is the length of the transmission line loop or ring, $L_{TL}$ is the transmission line inductance, and $C_{TL}$ in the transmission line capacitance.

$$f_{osc} = \frac{v_p}{2l} = \frac{1}{2\sqrt{L_{TL}C_{TL}}}$$ Equation 1

In certain configurations herein, an RTWO's segments (for instance, the segments 35 of the RTWO 30) include one or more tuning capacitors having a capacitance that is digitally controllable to set an oscillation frequency of the RTWO.

It can be difficult to meet RTWO specifications with respect to tuning range and frequency tuning step size. Such challenges can be exacerbated in configurations in which the RTWO is specified to operate with a relatively high oscillation frequency. For example, an RTWO with relatively high oscillation frequency can have a relatively short transmission line loop, and thus can be constrained by available layout resources, such as available transistor active area and/or metal routing channels.

For example, the RTWO 30 can be included in the ADPLL 10 of FIG. 1. However, in certain applications, it can be desirable for the ADPLL 10 to operate at a relatively high oscillation frequency $f_{OSC}$ (for instance, 10 GHz or more), with a relatively wide tuning range (for instance 625 MHz or more), and with a relatively fine tuning resolution (for instance 200 kHz or less).

Figure 4:
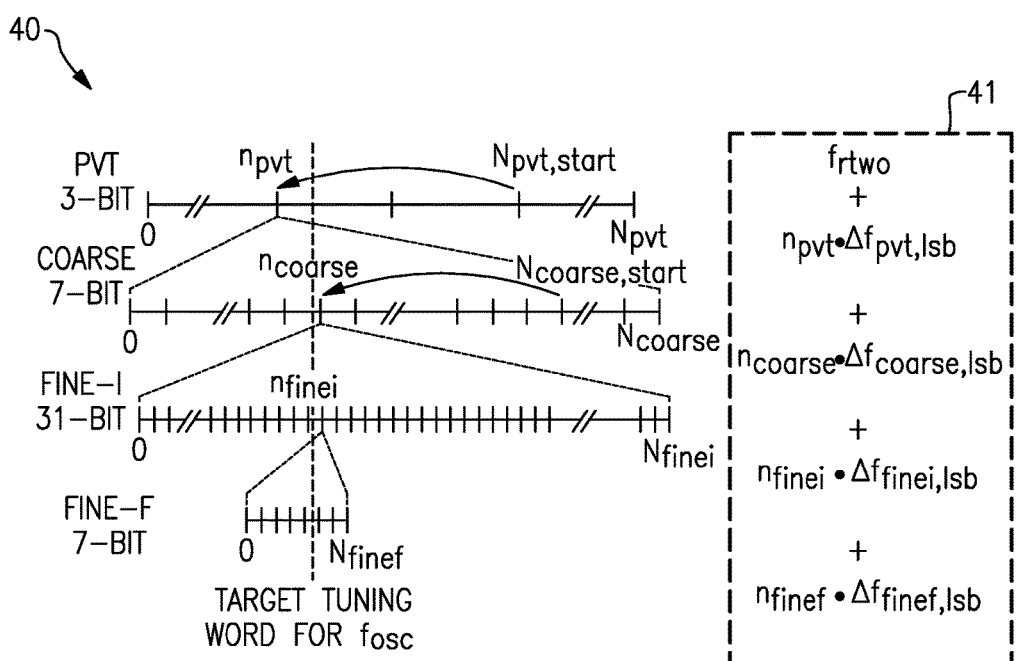
FIG. 4 illustrates one implementation of segmented tuning for an RTWO.

FIG. 4 illustrates one implementation of segmented tuning for an RTWO. The segmented tuning includes PVT tuning (3-bits, in this example), coarse tuning (7-bits, in this example), fine integer tuning (31-bits, in this example), and fine fractional tuning (7-bits, in this example).

As shown in FIG. 4, PVT tuning is controlled by a PVT tuning code with a value ranging from 0 to $N_{pvt}$, coarse tuning is controlled by a coarse tuning code with a value ranging from 0 to $N_{coarse}$, fine integer tuning is controlled by a fine integer tuning code with a value range from 0 to $N_{finei}$, and fine fractional tuning is controlled by a fine fractional tuning code with a value range from 0 to $N_{finef}$.

Although one specific implementation of segmented tuning is shown, the RTWOs herein can be implemented with a wide range of segmented tuning schemes, including, but not limited to, segmentations using more or fewer bits and/or more or fewer tuning codes.

As shown in box 41 of FIG. 4, the RTWO can operate with an oscillation frequency given by Equation 2 below, in which $f_{rtwo}$ is the RTWO's oscillation frequency with all tuning capacitors deselected, $n_{pvt}$ is the selected value of PVT tuning, $\Delta f_{pvt,lsb}$ is the PVT LSB frequency resolution (for instance, 16 MHz), $n_{coarse}$ is the selected value of coarse tuning, $\Delta f_{coarse,lsb}$ is the coarse LSB frequency resolution (for instance, 9 MHz), $n_{finei}$ is the selected value of fine integer tuning, $\Delta f_{finei,lsb}$ is the fine integer LSB frequency resolution (for instance, 200 KHz), $n_{finef}$ is the selected value of fine fractional tuning, and $\Delta f_{finef,lsb}$ is the fine fractional LSB frequency resolution (for instance, 200 KHz).

$$f_{osc} = f_{rtwo} + n_{pvt,lsb} + n_{coarse} * \Delta f_{coarse,lsb} + n_{finei} * \Delta f_{finei,lsb} + n_{finef} * \Delta f_{finef,lsb}$$ Equation 2

Implementing an RTWO using segmented tuning can reduce a number of tuning capacitors per segment in the RTWO's layout. For example, for specifications of 625 MHz tuning range and 200 kHz tuning resolution, an RTWO implemented with equally sized tuning capacitors and without segmentation can have about 12 bits and $2^{12}$=4096 tuning capacitors per segment, in addition to tuning capacitors for PVT variations. In view of layout resource constraints, routing and control of this number of tuning capacitors per segment would be unfeasible. In contrast, an RTWO using the segmented tuning of FIG. 4 can meet these specifications with about 38 tuning capacitors per segment for coarse and fine integer tuning, 3 tuning capacitors per segment for PVT variations, and an additional 7 tuning capacitors connected to the RTWO's ring for fine fractional tuning.

The selection of values for the segmented tuning can be provided in a variety of ways. In one example, a PVT code is first selected to compensate for PVT variation. Thereafter, a coarse tuning code can be selected. Furthermore, both fine integer and fine fractional tuning codes can be controlled in a loop (for instance, by the ADPLL 10 of FIG. 1). Accordingly, a resolution of the fine fractional tuning capacitor bank can control an overall frequency resolution of the RTWO. Thus, providing segmenting can provide the both benefits of fine frequency tuning resolution and a reduced number of tuning capacitors per segment.

In certain implementations, an RTWO is tuned to a target frequency by firstly selecting a value of the PVT tuning code, secondly selecting a value of the coarse tuning code, and finally selecting values of the fine integer tuning code and the fine fractional tuning code via a PLL loop (for instance, the ADPLL 10 of FIG. 1). For example, an algorithm can be used to select a value of the PVT tuning code that provides a frequency step equal to $n_{pvt} * \Delta f_{pvt,lsb}$. The selected PVT code can be greater than or less than the initial PVT code $N_{pvt,start}$. Next, for this selected PVT code, the algorithm is re-run beginning with a starting coarse tuning code $N_{coarse,start}$, and selects a coarse tuning code that provides a frequency step equal to $n_{coarse} * \Delta f_{coarse,lsb}$. The selected coarse tuning code can be greater than or less than the initial PVT code $N_{pvt,start}$. Thereafter, the ADPLL loop is closed, and the correct fine integer code and fine fractional code are reached via the ADPLL's loop feedback to tune the RTWO to the correct frequency.

In certain implementations, an RTWO includes a plurality of segments distributed around the RTWO's ring. Additionally, each of the RTWO's segments includes a PVT tuning capacitor bank, a coarse tuning capacitor bank, and a fine integer tuning capacitor bank. In certain implementations, an RTWO includes one instantiation of a fine fractional tuning capacitor bank and multiple instantiations of fine integer tuning capacitor banks, coarse tuning capacitor banks, and PVT tuning capacitor banks. However, other implementations are possible.

Figure 5:
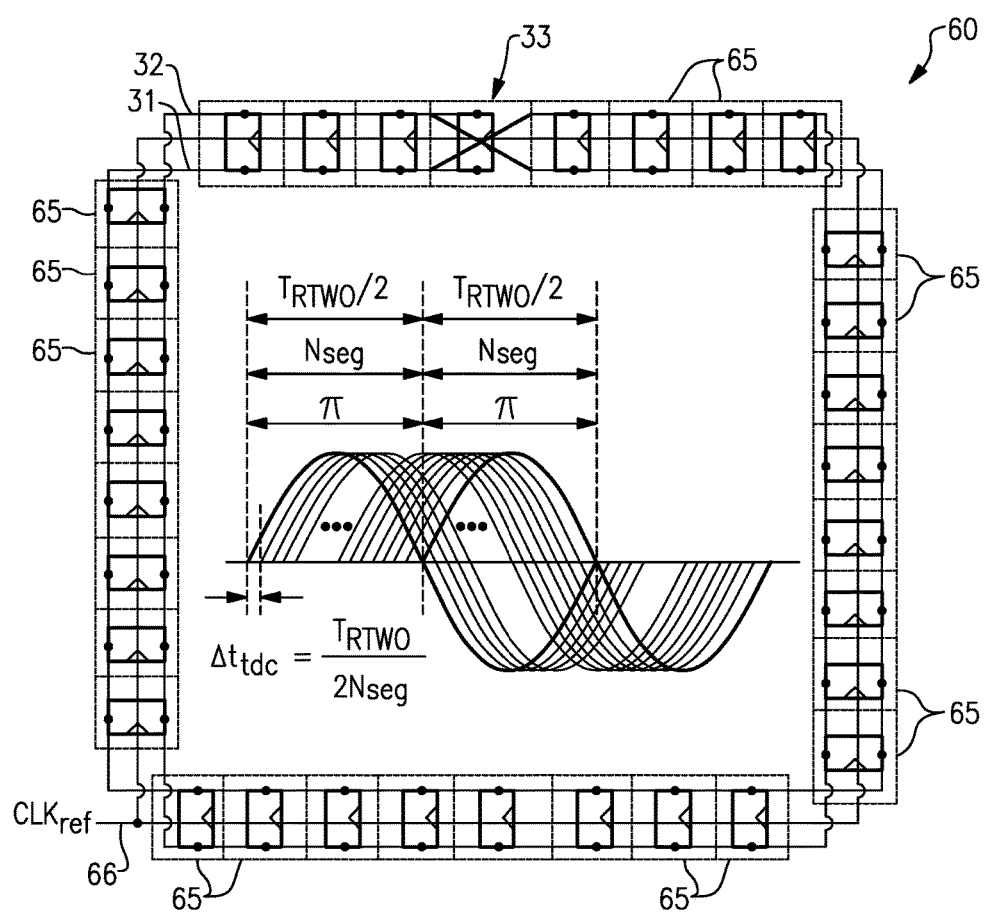
FIG. 5 is a schematic diagram of one implementation of an RTWO with overlaid transit waveforms of a traveling wave.

FIG. 5 is a schematic diagram of one implementation of an RTWO 60 with overlaid transit waveforms of a traveling wave. The RTWO 60 includes a differential transmission line including a first conductor 31, a second conductor 32, and a crossover 33. The RTWO 60 further includes and plurality of segments 65 each including a TDC latch.

Although one specific RTWO implementation is shown, the teachings herein are applicable to RTWO implemented in a wide variety of ways. Although the illustrated segments 65 are each illustrated as including TDC latch, the segments 65 include additional circuitry that has been omitted from FIG. 5 for clarity of the figures.

The illustrated RTWO 60 operates as a time-to-digital converter (TDC). The time-to-digital conversion function is provided via a delay of the traveling wave propagating around the RTWO's ring. For example, the illustrated RTWO 60 is partitioned into thirty-two segments 65. Additionally, a traveling wave propagating along the RTWO's transmission line traverses each of the segments 65 twice is an RTWO cycle.

For example, during operation, the traveling wave travels a lap around the transmission line and completes half of an RTWO cycle (180° of phase) by passing by all of the segments 65. After being inverted, the wave passes by each of the segments 65 again to complete a second lap around the transmission line and finish the RTWO cycle (360° of phase).

As shown in FIG. 5, the traveling wave experiences a fixed time delay at each segment 65 of the RTWO. The time delay of the wave at a segment corresponds to a time-to-digital conversion resolution, corresponding to about one-half the RTWO's period divided by a number of the segments 65.

Accordingly, a number of segments 65 can be selected to control a resolution of an RTWO that provides a time-to-digital conversion function.

In one example, an RTWO operates with a period of about 1/10 GHz and includes 32 segments, and has a corresponding time-to-digital conversion resolution $\Delta t_{tdc}$ of about 1.56 ps.

In the illustrated configuration, each of the segments 65 includes a TDC latch used to sample the RTWO phases at a frequency of a reference clock signal $CLK_{REF}$. Additionally, the reference clock signal reference clock signal $CLK_{REF}$ is provided to the TDC latches of the segments 65 via a clock conductor 66 that is connected as a ring, in this example.

With reference to FIGS. 3-5 and Equation 1, an RTWO's oscillation frequency is based on a length of the RTWO's loop or ring. To provide an RTWO with high oscillation frequency, a relatively short transmission line loop is desired. However, to provide wide frequency tuning range and fine frequency tuning resolution, a relatively large number of tuning capacitors are desired. Moreover, to provide a fine resolution time-to-digital conversion function, a large number of segments are desired.

Accordingly, a complex trade-off is present between RTWO frequency characteristics (for instance, oscillation frequency, tuning range, and/or frequency step size) and implementation of an RTWO's segments (for instance, number of segments, layout of segments, and/or circuitry of segments).

Examples of Rotary Traveling Wave Oscillators with Metal Stubs

An RTWO's segments can include a wide variety of circuitry, including, for example, regeneration circuits (for instance, sustaining amplifiers), tuning capacitors, latches, buffers, and/or other circuitry. In a first example, to achieve sufficient tuning range, each RTWO segment can include multiple tuning capacitor banks, for instance, three or more tuning capacitor banks as discussed earlier with respect to FIG. 4. In a second example, an RTWO's segments include TDC latches to provide time-to-digital conversion. In a third example, the RTWO's segments each include at least one tap buffer (for instance, a non-inverting or inverting buffer) used to obtain or extract a clock signal of a particular phase from the RTWO's ring.

Although it is desirable for an RTWO's segments to include a large number of circuits and/or circuits of relatively large size, the RTWO can be constrained by available layout resources, such as available active area and/or routing tracks. Moreover, providing additional layout resources by increasing the length of the RTWO's segments can undesirably increase the length of the RTWO's ring, which in turn lowers the RTWO's oscillation frequency.

In certain configurations herein, an RTWO includes segments having metal stubs extending from the RTWO's differential transmission line. The metal stubs provide connectivity to additional layout resources. For example, the segment layouts can be relatively wide (for example, in a first dimension substantially perpendicular to a local portion of the RTWO's transmission line) and can include tuning capacitors and other circuitry that are connected to the metal stubs. However, the segment layouts have a relatively short length (for example, in a second dimension substantially parallel to a local portion of the RTWO's transmission line) such that the RTWO's transmission line loop is relative short to provide high oscillation frequency, for instance, 10 GHz or more.

Accordingly, the metal stubs extend from the RTWO's differential transmission line to provide connection to tuning capacitors and/or other circuitry that facilitate implementation of wide tuning range, fine frequency step size, high oscillation frequency, and/or provide the RTWO with additionally functionality, such as time-to-digital conversion functionality and/or segment programmability.

Figure 6A:
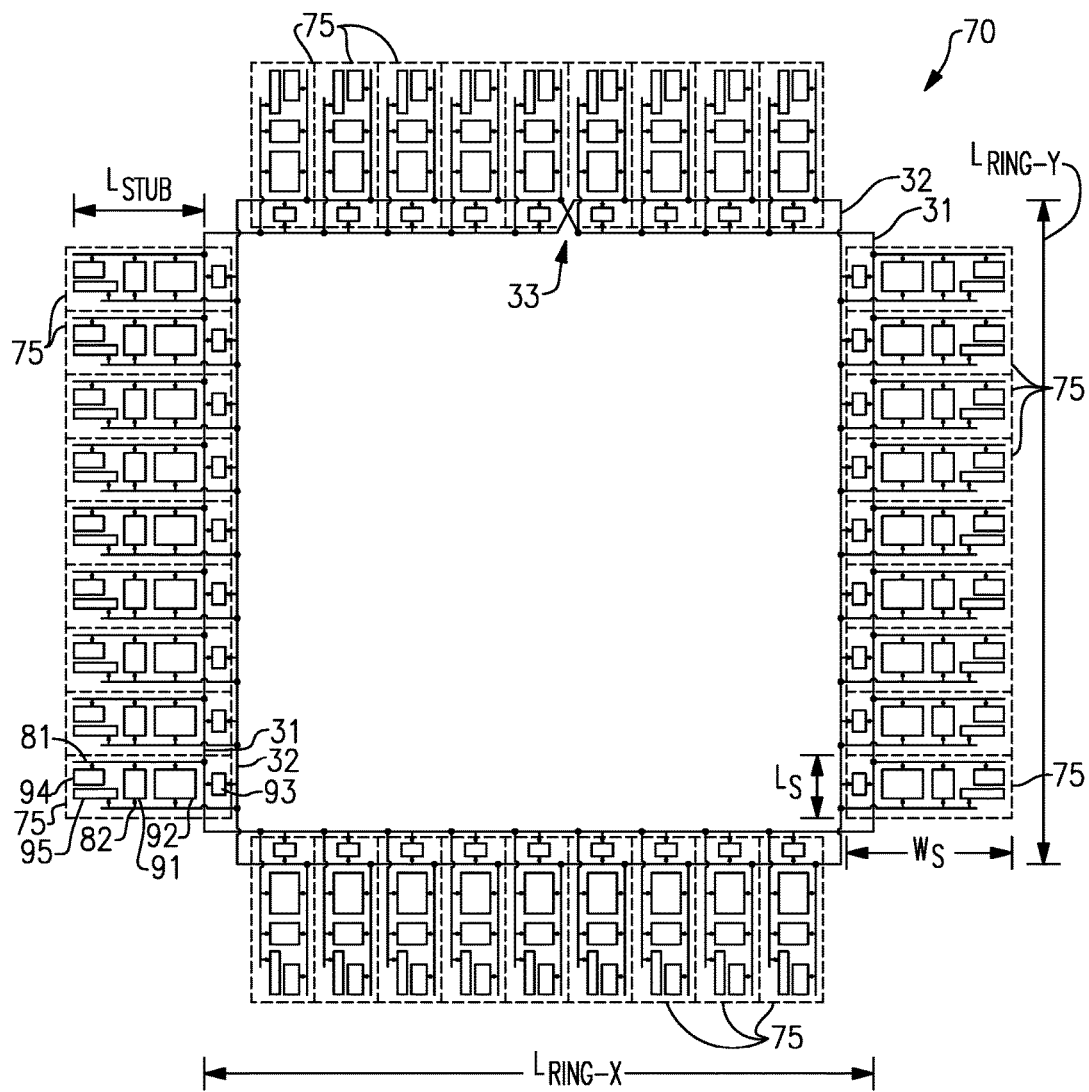
FIG. 6A is a schematic diagram of one embodiment of an RTWO with segments including metal stubs.

FIG. 6A is a schematic diagram of one embodiment of an RTWO 70 with segments including metal stubs. The RTWO 70 includes a differential transmission line including a first conductor 31, a second conductor 32, and a crossover 33. The RTWO 70 further includes and plurality of segments 75.

In the illustrated embodiment, the RTWO 70 includes one crossover and thirty-two segments. However, other configurations are possible, including, for example, configurations using a different number of crossovers and/or more or fewer segments. Additionally, in the illustrated embodiment, the RTWO's differential transmission line is connected in a closed-loop and is folded at each of four corners. However, the RTWO's differential transmission line can be implemented in other ways, including, for example, different implementations of folding and/or routing of the conductors 31, 32. For instance, the teachings herein are applicable not only to RTWOs implemented using rectangular or square loops, but also to RTWOs including transmission lines shaped in other ways. Thus, although the illustrated RTWO 70 includes four sides, the teachings herein are applicable to RTWOs including more or fewer sides.

In the illustrated embodiment, the RTWO 70 includes segments 75, which each include a first metal stub 81 and a second metal stub 82, which extend from the first conductor 31 and the second conductor 32, respectively. The first and second metal stubs 81, 82 are used to provide local clock phase signals from the RTWO's differential transmission line to the circuitry of the segments 75.

In the illustrated embodiment, each segment 75 includes a TDC latch 91, tuning capacitors 92, and a regeneration circuit 93 that operate using both a clock signal phase from the first conductor 31 and a clock signal phase from the second conductor 32. However, other implementations are possible. Although illustrated as being connected between the first and second conductors 31, 32 of the RTWO ring, in another example the regeneration circuit 93 is connected between the first and second metal stubs 81, 82. In the illustrated embodiment, each segment 75 includes a first tap buffer 94 that taps the first conductor 31 to obtain a first clock signal phase, and a second tap buffer 95 that taps the second conductor 32 to obtain a second clock signal phase.

Although one specific implementation of segment circuitry is shown in FIG. 6A, other implementations of segment circuitry are possible, including configurations including more or fewer circuits and/or different circuits. For example, in another embodiment, a first set and a second set of tuning capacitors are connected to the first and second conductors 31, 32, respectively. In yet another embodiment, the segments include circuitry that provides segment programmability.

By including the first and second metal stubs 81, 82 extending from the RTWO's differential transmission line 31, 32, the RTWO's segments 75 can be implemented with a wide layout that provides active area and routing resources suitable for segment circuitry. Additionally, the RTWO includes a differential transmission line 31, 32 in a relatively short loop, and thus the RTWO 70 has a relatively high oscillation frequency.

In one embodiment, an RTWO has a total loop length less than 7,500 µm, and the stub length of each of the first and second metal stubs 81, 82 is at least 25 µm. For instance, with respect to the rectangular loop shown in FIG. 6A, in one embodiment, the RTWO of FIG. 6A has a first length $L_{RING-X}$ less than about 1,875 µm and a second length $L_{RING-Y}$ less than about 1,875 µm.

The stub length can be expressed in terms of a fraction of a wavelength of the RTWO's traveling wave. In one embodiment, the first and second metal stubs 81, 82 each are at least about 0.05λ in length, where λ is the RTWO's wavelength. As skilled artisans will appreciate, the wavelength of an RTWO can expresses as a ratio of the RTWO's wave phase velocity to the RTWO's oscillation frequency, or $v_p/f_{osc}$.

In one embodiment, the segments 75 have a length of less than about 25 µm, and a width of at least about 25 µm.

In one embodiment, an RTWO includes at least 1 segment per 25 µm of loop.

Figure 6B:
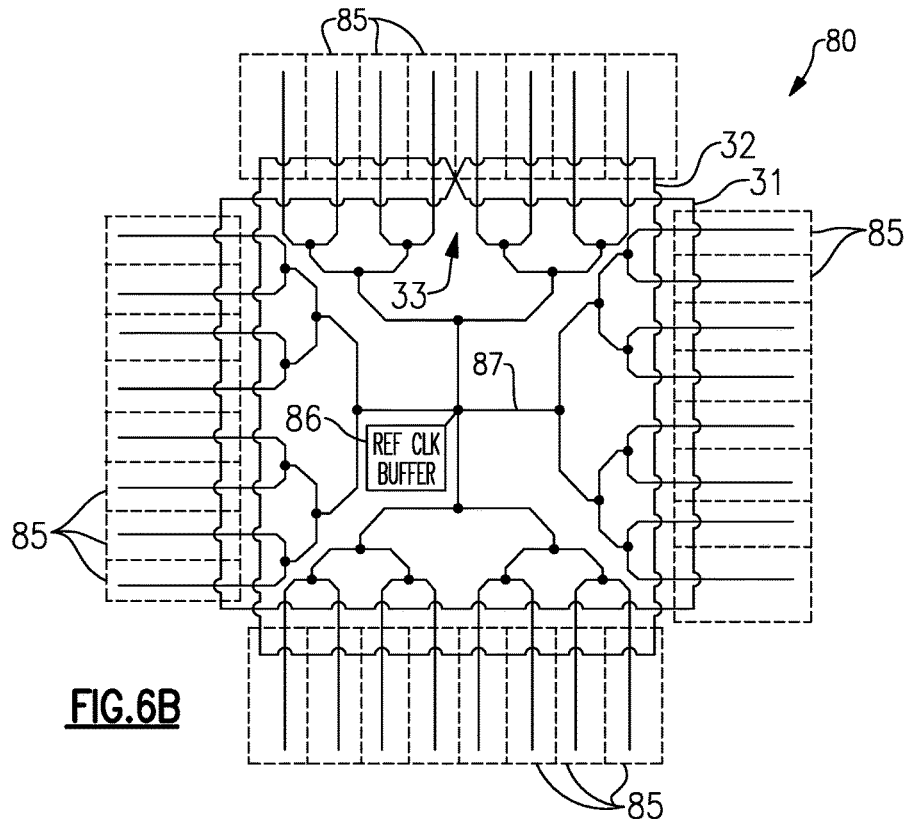
FIG. 6B is a schematic diagram of one embodiment of a clock distribution tree for an RTWO.

FIG. 6B is a schematic diagram of one embodiment of a clock distribution tree 87 for an RTWO 80. The RTWO 80 includes a differential transmission line connected in a loop and including a first conductor 31, a second conductor 32, and a crossover 33. The RTWO 80 further includes segments 85 and a reference clock buffer 86. For clarity of the figures, circuitry of the segments 85 is not illustrated in FIG. 6B.

As shown in FIG. 6B, the reference clock buffer 86 provides a reference clock signal to each of the segments 85. The reference clock buffer 86 provides the reference clock signal to the clock distribution tree 87, which distributes the reference clock signal to each of the segments 85. The clock distribution tree 87 can be used provide the reference clock signal to TDC latches and/or other circuitry of the segments 85 that operates using the reference clock signal.

The illustrated clock distribution tree 87 is implemented using branching such that a length of clock conductor from an output of the reference clock buffer 86 to each segment 85 is substantially the same. Implementing the clock distribution tree 87 in this manner aids in substantially matching a time at which the reference clock signal reaches the TDC latches and/or other circuitry of the segments 85.

Additional details of the RTWO 80 of FIG. 6B can be similar to those described earlier.

Figure 7:
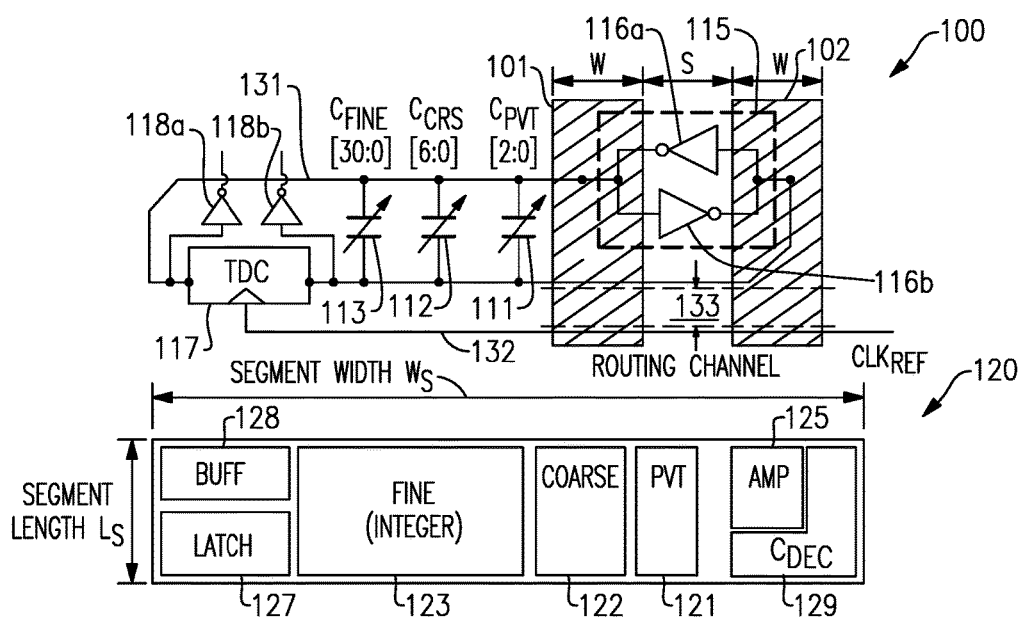
FIG. 7 is a schematic diagram of one embodiment of an RTWO segment with metal stubs.

FIG. 7 is a schematic diagram of one embodiment of an RTWO segment 100 with metal stubs. The RTWO segment 100 is connected to a first transmission line conductor 101 and a second transmission line conductor 102 of a ring of an RTWO.

For clarity of the figures, only a portion of the first transmission line conductor 101 and the second transmission line conductor 102 are shown in FIG. 7. However, the first transmission line conductor 101 and the second transmission line conductor 102 operate as a section of an RTWO's differential transmission line that is connected in a ring.

The RTWO segment 100 of FIG. 7 includes a PVT tuning capacitor bank 111, a coarse tuning capacitor bank 112, a fine tuning capacitor bank 113, a regeneration circuit 115, a TDC latch 117, a first tap buffer 118*a*, a second tap buffer 118*b*, a first metal stub 131, and a second metal stub 132.

The PVT tuning capacitor bank 111 includes selectable capacitors used to compensate for process, temperature, and/or voltage variations. Additionally, the coarse tuning capacitor bank 112 includes selectable capacitors used to provide coarse tuning of the oscillation frequency of the RTWO. Furthermore, the fine tuning capacitor bank 113 includes selectable capacitors used to provide fine tuning of the oscillation frequency of the RTWO. The tuning capacitors banks can be implemented using any suitable tunable capacitor structure, including, but not limited to, banks of parallel capacitor elements digitally selectable via switches.

Although an example of an RTWO segment including three tuning capacitor banks is illustrated in FIG. 7, the teachings herein are applicable to RTWOs tuned using more or fewer capacitor banks.

In the illustrated embodiment, the PVT tuning capacitor bank 111 operates using a PVT tuning code of three bits, the coarse tuning capacitor bank 112 operates using a coarse tuning code of seven bits, and the fine tuning capacitor bank 113 operates using a fine integer tuning code of thirty-one bits. Although one specific example of bit widths is shown, the teachings herein are applicable to tuning with a wide variety of bit widths. Accordingly, other implementations are possible. In certain implementations, the fine tuning capacitor bank 113 is controlled via a PLL feedback loop. For example, the fine integer tuning code can be controlled by a digital filter of a PLL.

The illustrated RTWO segment 100 further includes the TDC latch 117, which is used to detect passage of a traveling wave traveling along first and second transmission line conductors 101, 102. For example, the outputs of the TDC latches around the RTWO's ring can be processed to generate a digital representation of time instances at which the traveling wave passes different positions around the loop. The output of the TDC latches can be used, for example, to determine a fractional number of clock cycles that have elapsed.

As shown in FIG. 7, the TDC latch 117 receives a reference clock signal $CLK_{REF}$. In certain implementations, the reference clock signal $CLK_{REF}$ is provided to the RTWO segment 100 via a clock distribution tree, such as the clock distribution tree 87 of FIG. 6B.

In the illustrated embodiment, the first tap buffer 118*a* and the second tap buffer 118*b* are implemented using inverters. The first tap buffer 118*a* and the second tap buffer 118*b* are used to generate clock signal phases that are about 180° separated from one another. By providing tap buffers along different positions along the RTWO's ring, a set of clock signals of desired phases can be obtained. Although FIG. 7 illustrates a configuration in which inverters are used to provide tapping, an RTWO can include tap buffer circuitry implemented in a wide variety of ways.

In the illustrated embodiment, the regeneration circuit 115 includes a first inverter 116*a* and a second inverter 116*b*. Additionally, an input of the first inverter 116*a* is electrically connected to an output of the second inverter 116*b*, and an output of the first inverter 116*a* is electrically connected to an input of the second inverter 116*b*. However, an RTWO segment can include regeneration circuits implemented in other ways.

The first and second metal stubs 131, 132 provide local clock phases from the RTWO's loop to circuitry of the RTWO segment 100. By using the first and second metal stubs 131, 132, the length of the RTWO segment 100 can be relatively short, which in turn results in a relatively short RTWO ring and a corresponding high RTWO oscillation frequency.

In certain configurations herein, an RTWO segment includes a routing channel 133 used to provide passage of routing tracks through the RTWO segment.

As shown in FIG. 7, the first and second metal stubs 131, 132 provide connections from the first transmission line conductor 101 and the second transmission line conductor 102, respectively, to circuitry of the RTWO segment 100. For example, the first and second metal stubs 131, 132 connect the RTWO's ring to tuning capacitors and other circuitry of the RTWO segment 100.

The first and second metal stubs 131, 132 provide a capacitive load that operates as part of the transmission line's characteristic impedance $Z_o$. In certain implementations, the metal stubs can be implemented with about equal length and can be distributing in substantially even intervals around the RTWO's ring. Although the stubs are illustrated as being substantially identical for each segment, in other configurations the stubs can be implemented differently for one or more of the segments. In one example, design rules of process constrains the layout of transistors to be in one direction, and the stubs along the top and bottom sides of an RTWO are implemented differently than stubs on the left and right sides of the RTWO.

As shown in FIG. 7, the first metal stub 131 is connected to the first transmission line conductor 101 (for instance, by way of a via), and extends from the first transmission line conductor 131 to provide connections to circuitry of the RTWO segment 100. In the illustrated embodiment, the first metal stub 131 connects to a first terminal of the PVT tuning capacitor bank 111, to a first terminal of the coarse tuning capacitor bank 112, to a first terminal of the fine tuning capacitor bank 113, to an input of the first tap buffer 118a, and to a first input of the TDC latch 117. In the illustrated embodiment, an end portion of the first metal stub 131 bends before connecting to the first input of the TDC latch 117. However, other implementations are possible.

With continuing reference to FIG. 7, the second metal stub 132 is connected to the second transmission line conductor 102 (for instance, by way of a via). After an initial turn or bend, the second metal stub 132 extends from the second transmission line conductor 132 to provide connections to circuitry of the RTWO segment 100. In the illustrated embodiment, the second metal stub 132 connects to a second terminal of the PVT tuning capacitor bank 111, to a second terminal of the coarse tuning capacitor bank 112, to a second terminal of the fine tuning capacitor bank 113, to an input of the second tap buffer 118b, and to a second input of the TDC latch 117. However, other implementations are possible.

In one embodiment, the first metal stub 101 and the second metal stub 102 each have a length (including bends) at least about 25 μm. In one example, the stubs 101, 102 are about 95 μm in length, corresponding to about 6% of a wavelength (or 0.06λ) of an RTWO operating at 10 GHz.

As shown in FIG. 7, the transmission line conductors 101, 102 of the RTWO's ring have a width W, and are spaced apart from one another by a spacing S. The width W and spacing S can be any suitable value, for instance, W=12 um and S=8 um.

In certain implementations, the transmission line conductors 101, 102 are positioned on different metal layers relative to the metal stubs 131, 132. In one example, the transmission line conductors 101, 102 of the RTWO's differential transmission line are implemented on two or more adjacent upper metal layers (for instance, a stack of metal-8 and metal-9), and the stubs are implemented on a lower metal layer (for instance, metal-7). As persons having ordinary skill in the art will appreciate, a lower metal layer is closer to a semiconductor substrate relative to an upper metal layer.

As shown in FIG. 7, a floor plan layout 120 of the RTWO segment 100 has been illustrated. The floor plan layout 120 includes a PVT tuning capacitor bank layout 121, a coarse tuning capacitor bank layout 122, a fine tuning capacitor bank layout 123, a regeneration amplifier layout 125, a TDC latch layout 127, a tap buffer layout 128, and a decoupling capacitor layout 129.

The PVT tuning capacitor bank layout 121 corresponds to a boundary of active area (for instance, transistor layouts and/or capacitor sizes) of the PVT tuning capacitor bank 111, the coarse tuning capacitor bank layout 122 corresponds to a boundary of active area of the coarse tuning capacitor bank 112, and the fine tuning capacitor bank layout 123 corresponds to a boundary of active area of the fine tuning capacitor bank 113. Furthermore, the tap buffer layout 128 corresponds to a boundary of active area of the tap buffers 118a, 118b, and the TDC latch layout 127 corresponds to a boundary of active area of the TDC latch 117. Additionally, the regeneration amplifier layout 125 corresponds to a boundary of active area for the inverters 116a, 116b, and the decoupling capacitor layout 129 corresponds to a boundary of active area of a decoupling capacitor between power and ground for the regeneration circuit 115.

In one embodiment, the RTWO segment 100 has a length $S_L$ of less than about 25 μm, and a width $S_W$ of at least about 25 μm. In certain implementations, the RTWO segment 100 has a width greater than the length such that numerous segments can be distributed around the RTWO's ring while maintaining a relatively short RTWO conductor loop length and corresponding high oscillation frequency.

In one embodiment, an RTWO includes at least 1 segment per 25 μm of loop.

Although a specific implementation of RTWO segment circuitry and floor plan layout has been described above, the teachings herein are applicable to a wide variety of implementations of RTWO segments.

Examples of Distributed Quantized Frequency Tuning

An RTWO's segments include one or more tuning capacitor banks to provide control over an oscillation frequency of the RTWO. For example, an RTWO segment can include, for instance, a PVT tuning capacitor bank, a coarse tuning capacitor bank, and/or a fine tuning capacitor bank.

The tuning capacitor banks across the RTWO's segments can be controlled using common tuning code values. For example, a PVT tuning capacitor bank of each segment can be controlled using a common PVT tuning code. Likewise, a coarse tuning capacitor bank of each RTWO segment can be controlled using a common coarse tuning code, and a fine tuning capacitor bank of each RTWO segment can be controlled using a common fine tuning code.

When controlling tuning capacitor banks in this manner, the RTWO segments each provide substantially the same amount of tuning capacitance, and the value of tuning capacitance can be controlled by incrementing or decrementing the tuning capacitance code to achieve a desired RTWO oscillation frequency. In such configurations, the tuning capacitance values of the segments change in lock-step.

Although implementing the RTWO segments in this manner can provide the RTWO with a well-controlled and uniform transmission line characteristic impedance, implementing the RTWO segments in this manner results in a relatively poor step size for frequency tuning. For example, in an RTWO implemented with N segments, the RTWO's LSB capacitance step size corresponds to an LSB tuning capacitance of a segment multiplied by N segments. In one example, the LSB tuning capacitance in each of 32 segments is 18.5 fF, and the RTWO's LSB capacitance step size corresponds 32*18.5 fF since all 32 segments switch together. Additionally, if the frequency step size due to each LSB tuning capacitance is 16 MHz, then the RTWO's LSB frequency step size is 32*16 MHz, which corresponds to a relatively large value of 512 MHz.

However, a relatively large frequency step size may be unsuitable for high performance RTWOs, such as RTWOs providing digitally controlled oscillation and time-to-digital conversion functions in high-speed applications.

Although a size of LSB capacitors in each segment can be reduced by a factor of N to provide finer LSB capacitance step size, reducing the capacitance in this manner may be infeasible. For instance, limitations in processing technology and/or design rules can limit a minimum geometry of devices and/or structures, and thus tuning capacitors with relatively small capacitance values may be unobtainable.

In certain configurations herein, a distributed quantized scheme is provided for tuning a frequency of an RTWO. The RTWO includes segments distributed around the RTWO's ring, and the segments include tuning capacitors, regeneration circuits, and other circuitry. The distributed quantized frequency tuning is used to control the tuning capacitors in the RTWO's segments using separately controllable code values, thereby enhancing the RTWO's frequency step size or resolution. Moreover, in configurations including multiple RTWO rings that are locked to one another to reduce phase noise, the distributed quantized frequency tuning can be used to separately set the tuning capacitors across multiple RTWO rings that are coupled to one another. Thus, distributed quantized tuning can be used not only across segments of an RTWO ring, but also across segments of two or more RTWO rings.

Accordingly, rather than controlling the tuning capacitor bank of each segment with a common tuning code, at least some of the tuning capacitors across segments are quantized. Thus, tuning capacitors of the RTWO's segments are individually activatable, and corresponding tuning capacitors across different segments need not turn on simultaneously. Thus, the RTWO operates with a finer frequency step size for frequency tuning.

FIGS. 8A-8R illustrates an RTWO tuning capacitor sequence for PVT tuning according to one embodiment.

The RTWO tuning sequence depicts an RTWO annotated to show the number of active PVT tuning capacitors in a particular segment as the value of the tuning code is incremented, beginning at a lowest value of a PVT code. For clarity of the description, the lowest value of the PVT code is selected to be zero, and corresponds to the smallest value of PVT tuning capacitance. However, a tuning code can be implemented in a wide variety of ways.

The RTWO tuning sequence is illustrated in the context of an RTWO with 32 segments each including a PVT tuning capacitor bank for compensating for temperature, process, and/or supply voltage variations. Additionally, the PVT tuning capacitor bank is 3-bit in this example, resulting in 96 tuning capacitors for PVT compensation. Although one specific example with 32 segments and 96 tuning capacitors is provided, the teachings herein are applicable to a wide variety of RTWOs, including, but not limited to, RTWOs with more or fewer segments and/or more or fewer tuning capacitors.

Although described in the context of PVT tuning, the distributed quantized tuning scheme of FIGS. 8A-8R can be used for other types of RTWO tuning capacitor banks, including, for example, coarse and/or fine tuning.

FIG. 8A illustrates a first PVT tuning configuration 201 with PVT code 0, in which all PVT tuning capacitors are switched off.

FIG. 8B illustrates a second PVT tuning configuration 202 in which the PVT code is incremented relative to the first PVT tuning configuration 201 of FIG. 8A. As shown in FIG. 8B, incrementing the tuning capacitor code to a value of 1 results in the tuning capacitor of one segment being activated.

Activating a tuning capacitor of one segment at a time results in a relatively small change in frequency step size. For instance, a change in capacitance $\Delta C$ along the RTWO ring corresponds to an LSB tuning capacitance $C_{LSB}$ of the segment's tuning capacitor bank. Thus, a change in frequency $\Delta f$ of the RTWO corresponds to the LSB frequency step $f_{LSB}$ of the LSB tuning capacitance $C_{LSB}$. In one example, when an LSB tuning capacitor has a value of 18.5 fF and a corresponding frequency step size of 16 MHz, the RTWO's LSB tuning capacitance is about 18.5 fF and the RTWO's frequency step size is about 16 MHz.

As shown in FIG. 8C, a third PVT tuning configuration 203 is shown for incrementing the PVT code to 2. In the illustrated example, the tuning capacitor of a segment eight positions apart from the first segment is activated. This, in turn, causes about twice the LSB capacitance change ($2*C_{LSB}$) and about twice the frequency step change (for instance, $2*f_{LSB}$).

In FIG. 8D, a fourth PVT tuning configuration 204 is shown for incrementing the PVT code to 3. As shown in FIG. 8D, a third segment positioned eight segments apart from the second segment is incremented by 1, thereby causing about three times the LSB capacitance change ($3*C_{LSB}$) and about three times frequency step change (for instance, $3*f_{LSB}$).

As shown in FIGS. 8E-8Q, the algorithm can be repeated. FIG. 8E illustrates a fifth PVT tuning configuration 205 in which the PVT code is 4. FIG. 8F illustrates a sixth PVT tuning configuration 206 in which the PVT code is 5. FIG. 8G illustrates a seventh PVT tuning configuration 207 in which the PVT code is 6. FIG. 8H illustrates an eighth PVT tuning configuration 208 in which the PVT code is 7. FIG. 8I illustrates a ninth PVT tuning configuration 209 in which the PVT code is 8. FIG. 8J illustrates a tenth PVT tuning configuration 210 in which the PVT code is 9. FIG. 8K illustrates an eleventh PVT tuning configuration 211 in which the PVT code is 10. FIG. 8L illustrates a twelfth PVT tuning configuration 212 in which the PVT code is 11. FIG. 8M illustrates a thirteenth PVT tuning configuration 213 in which the PVT code is 12. FIG. 8N illustrates a fourteenth PVT tuning configuration 214 in which the PVT code is 13. FIG. 8O illustrates a fifteenth PVT tuning configuration 215 in which the PVT code is 14. FIG. 8P illustrates a sixteenth PVT tuning configuration 216 in which the PVT code is 15. FIG. 8Q illustrates a seventeenth PVT tuning configuration 217 in which the PVT code is 16.

As shown in FIG. 8Q, half of the segments include an activated capacitor. As the PVT code is further incremented, additional capacitors can activate in a manner similar to that described earlier.

In FIG. 8R, an eighteenth PVT tuning configuration 218 in shown in which the PVT code is 32 and each segment includes an activated capacitor.

The sequence that the tuning capacitors of RTWO segments are activated around the RTWO's loop can be chosen to reduce or minimize imbalance of the RTWO due to distribution of the segment selection around the ring. In one embodiment, the RTWO has a rectangular layout, and one segment on each of the bottom (e.g., south), left (e.g., west), top (e.g., north), and right (e.g., east) sides of the ring is selected for PVT a sequence of four consecutive PVT codes, for instance, PVT codes 1 to 4.

In certain implementations, the sequence is selected such that the next selected capacitor in a code sequence is on a different side of the RTWO than the last selected capacitor.

In the illustrated example, when incrementing from PVT codes 1 to 4, the selected capacitors are equidistant (for instance, 32/4=8) segments apart from each other. Additionally, for PVT codes 5 to 8, a segment at the center point of each of the south, west, north and east sides is selected. The chosen segments in this case are equidistant from the segments selected for PVT codes 1 to 4 by 3 segments and are equidistant from each other by 8 segments.

The tuning sequence for selecting segments around the RTWO ring continues for codes 9 to 16, where the segments for PVT codes 9 to 16 are equidistant from the segments selected for PVT codes 5 to 8 by 1 segment and equidistant from each other by 8 segments.

This selection algorithm continues for PVT codes 17 to 32, where finally a capacitor from each segment is selected for code 32.

In certain implementations, when PVT code 32 arrives, the sequence of segment selection repeats and the segment selected for PVT code 1, is selected for PVT code 33. However, for PVT code 33, the PVT tuning capacitor bank is incremented such that 2 capacitors are activated. Thus, the selection algorithm continues for PVT codes beyond 32 up to a maximum value of the PVT code.

Although described in the context of PVT tuning, the tuning scheme is applicable to other tuning capacitor banks. For example, in another embodiment, the quantization technique is applied to a coarse tuning capacitor bank.

Two or more RTWO rings can be coupled to one another to reduce phase noise. For example, when two RTWO rings are coupled, the phase noise of the resulting oscillator can be about 3 dB smaller than the phase noise of each RTWO individually. Further reduction in phase noise can be achieved by coupling three or more RTWO rings. For example, coupling four RTWO rings can reduce noise by about 6 dB.

FIGS. 9A-9J illustrates an RTWO tuning capacitor sequence for fine integer tuning according to one embodiment. The RTWO tuning sequence depicts four-coupled RTWO rings annotated to show the number of active fine integer tuning capacitors in a particular segment of a particular RTWO ring as the value of the fine integer tuning code is incremented, beginning at a lowest value of a fine integer tuning code. For clarity of the description, the lowest value of the fine integer tuning code is selected to be zero, and corresponds to the smallest value of fine integer tuning capacitance. However, a tuning code can be implemented in a wide variety of ways.

In the illustrated embodiment, the RTWO rings are coupled using phase-locking conductors that electrically connect the RTWO rings to one another. Although one example of phase-locking is shown, RTWO rings can be coupled in a wide variety of ways.

The RTWO tuning sequence is illustrated in the context of four coupled RTWO rings each with 32 segments. Additionally, the fine integer tuning capacitor bank of each RTWO segment is 31-bit in this example, resulting in 3,968 tuning capacitors. Although one specific example with, 4 rings, 32 segments, 31 bits, and 3,968 tuning capacitors is provided, the teachings herein are applicable to a wide variety of RTWOs, including, but not limited to, more or fewer coupled RTWO rings, more ore fewer segments, more or fewer bits, and/or more or fewer tuning capacitors.

Although described in the context of fine tuning, the distributed quantized tuning scheme of FIGS. 9A-9J can be used for other types of RTWO tuning capacitor banks, including, for example, coarse and/or PVT tuning.

Figure 9B:
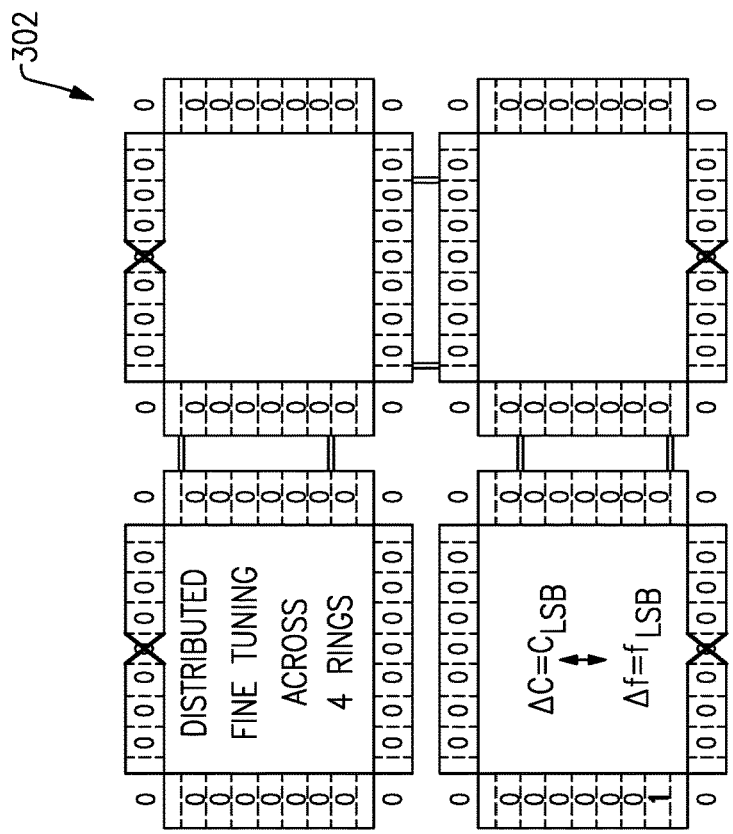
FIGS. 9A-9J illustrates an RTWO tuning capacitor sequence for fine integer tuning according to one embodiment.
Figure 9A:
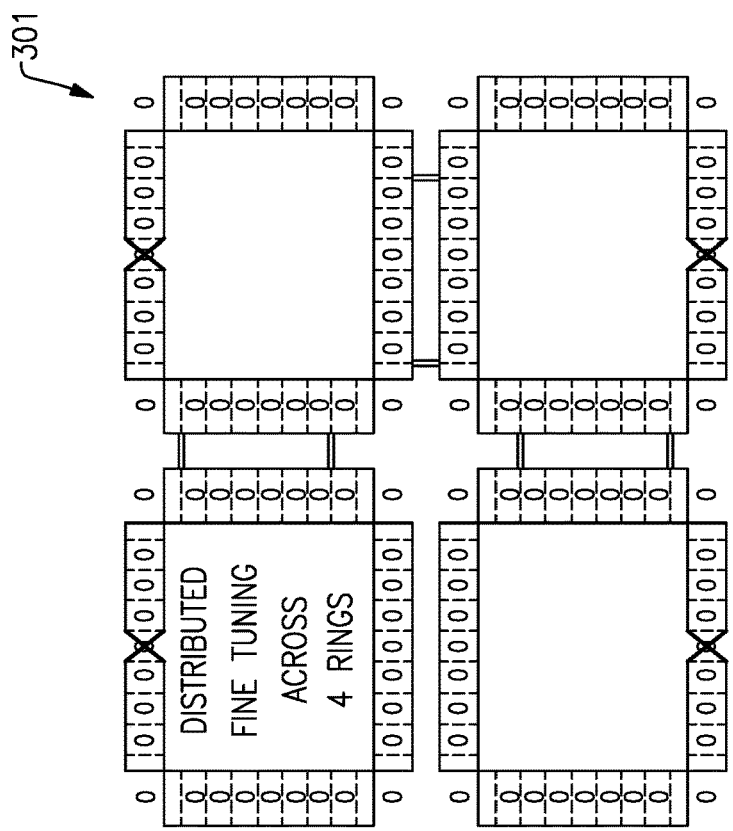

FIG. 9A illustrates a first fine tuning configuration 301 with fine tuning code 0, in which all fine tuning capacitors are switched off.

FIG. 9B illustrates a second fine tuning configuration 302 with fine tuning code 1. As shown in FIG. 9B, incrementing the fine tuning code results in activation of a tuning capacitor of one segment of one RTWO ring (the bottom-left ring, in this example).

Activating a tuning capacitor of one segment of one RTWO ring at a time achieves a relatively fine step size.

For example, if each tuning capacitor of each RTWO segment has a value of 1.5 fF, then activating the tuning capacitors in this manner provides the RTWO with LSB tuning capacitance $C_{LSB}$ of 1.5 fF/4=0.375 fF. In certain processes, such as fine line CMOS processes, a 0.375 fF capacitance provides finer capacitance resolution relative to the smallest standalone tunable LSB capacitor that can be manufactured using the process. Additionally, in an implementation in which the 1.5 fF corresponds to an 800 kHz frequency step size, the RTWO operates with an LSB frequency step $f_{LSB}$ of 200 kHz when tuned in this manner. In contrast, if a tuning capacitor of each segment of each RTWO were turned on collectively, the LSB step size would be about 25.6 MHz when tuning all segments of all rings at the same time.

Accordingly, in the illustrated embodiment, fine integer tuning is quantized across multiple RTWO rings.

Figure 9D:
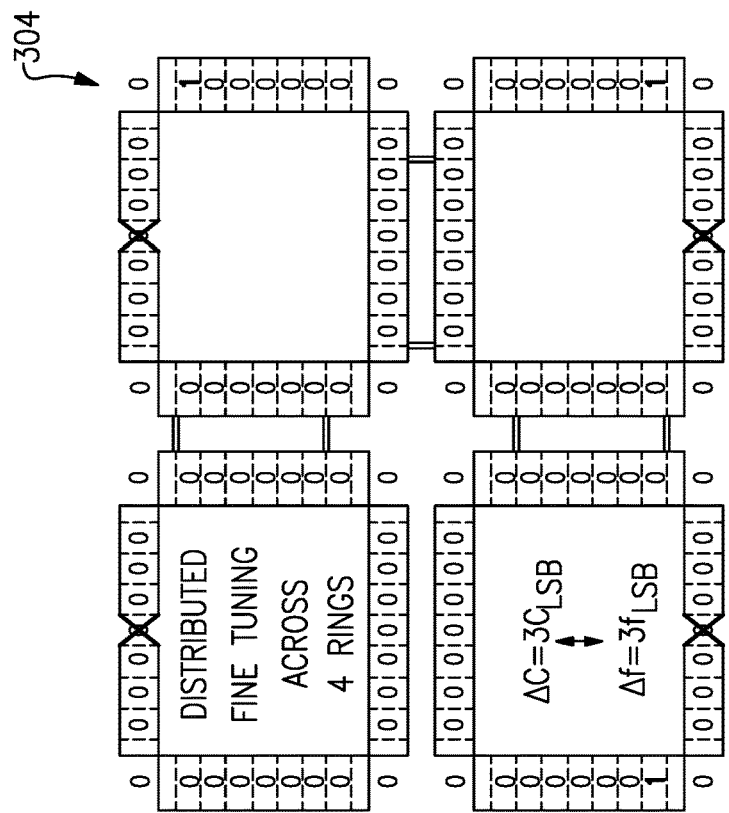
Figure 9C:
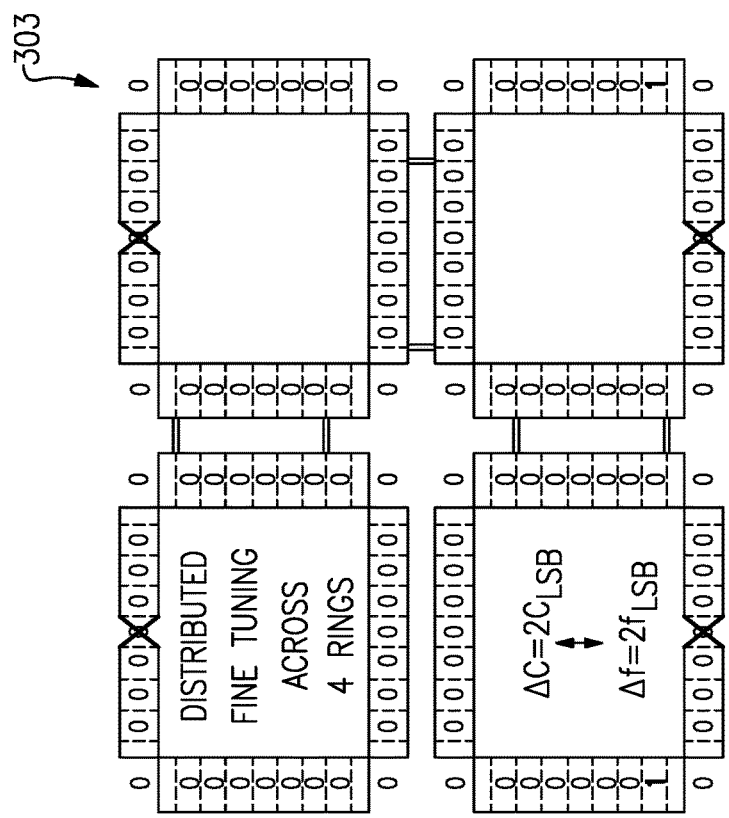

FIG. 9C illustrates a third fine tuning configuration 303 with fine tuning code 2. As shown in FIG. 9C, incrementing the fine tuning code results in activation of a tuning capacitor of one segment for one RTWO ring (the bottom-right ring, in this example). In the illustrated example, the second selected tuning capacitor is positioned at a location that is line symmetrical (or a mirror image) with respect to the first selected tuning capacitor. Activating the second selected tuning capacitor causes about twice the LSB capacitance change and about twice the frequency step.

FIG. 9D illustrates a fourth fine tuning configuration 304 with fine tuning code 3. Incrementing the fine tuning code results in activation of one tuning capacitor of one segment for one RTWO ring (the top-right ring, in this example).

Figure 9F:
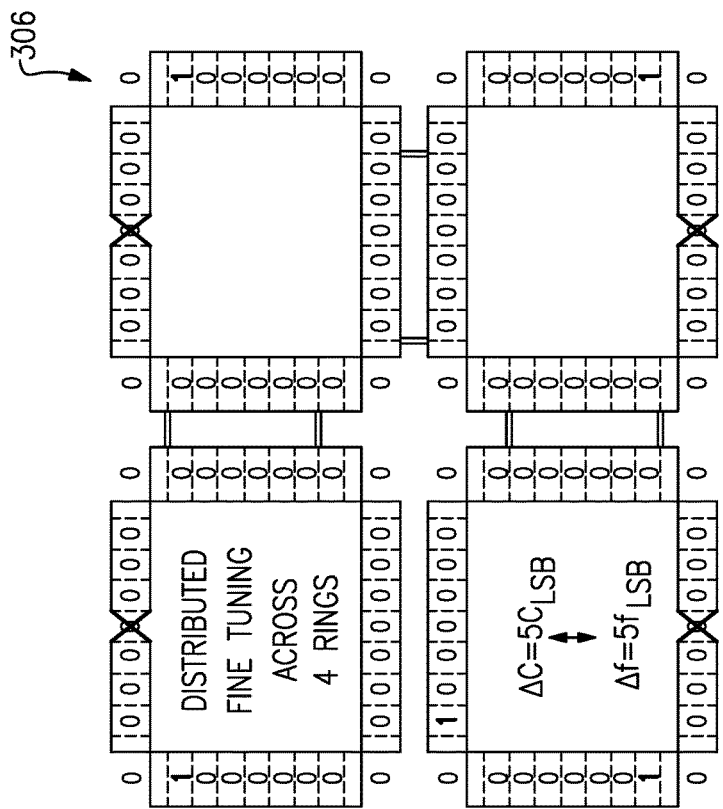
Figure 9E:
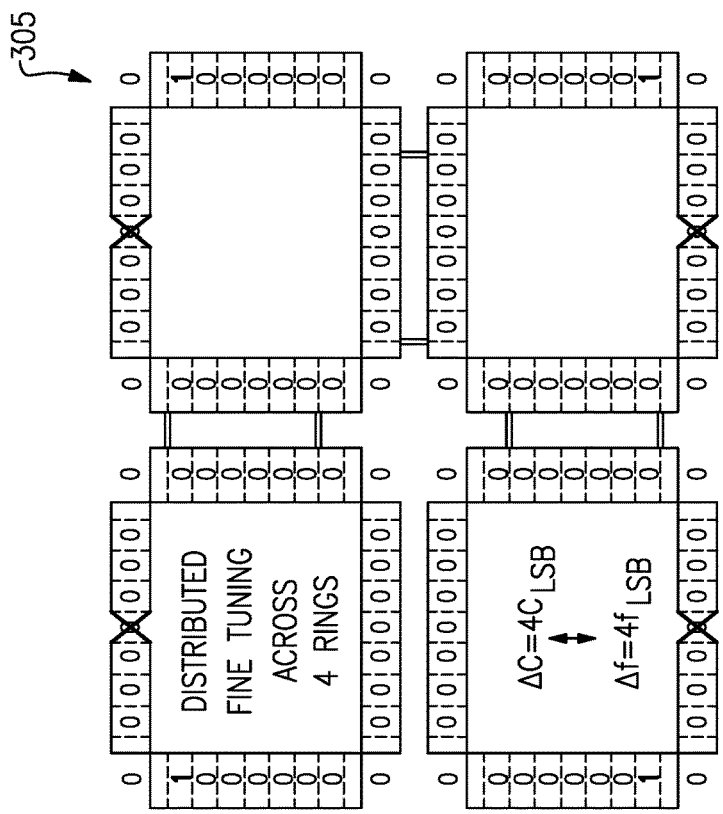

FIG. 9E illustrates a fifth fine tuning configuration 305 with fine tuning code 4. Incrementing the fine tuning code results in activation of one tuning capacitor of one segment for one RTWO ring (the top-left ring, in this example).

As shown in FIGS. 9A-9E, incrementing the fine tuning code through a range of values from 0 to 4 results in a capacitor being activated in one segment of each RTWO. Thus, for consecutive fine frequency tuning codes, a particular one of the RTWO rings has at most one additional activated capacitor relative to the other RTWO rings.

Activating the tunable capacitors in this manner maintains the free running oscillation frequencies of each of the RTWO rings substantially the same as one another. Thus, the fine integer code can be incremented or decremented while maintaining lock between the RTWO rings.

Figure 9H:
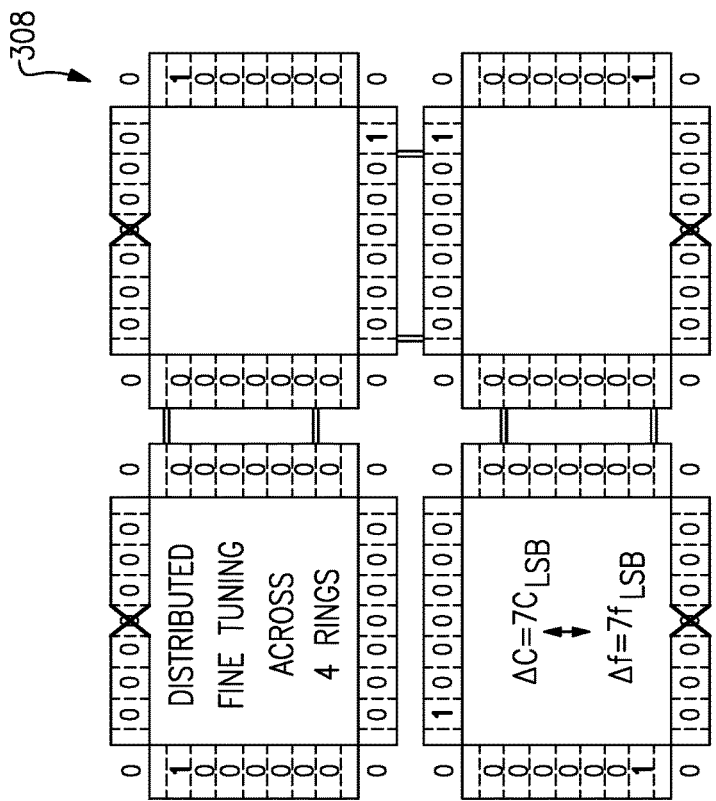
Figure 9G:
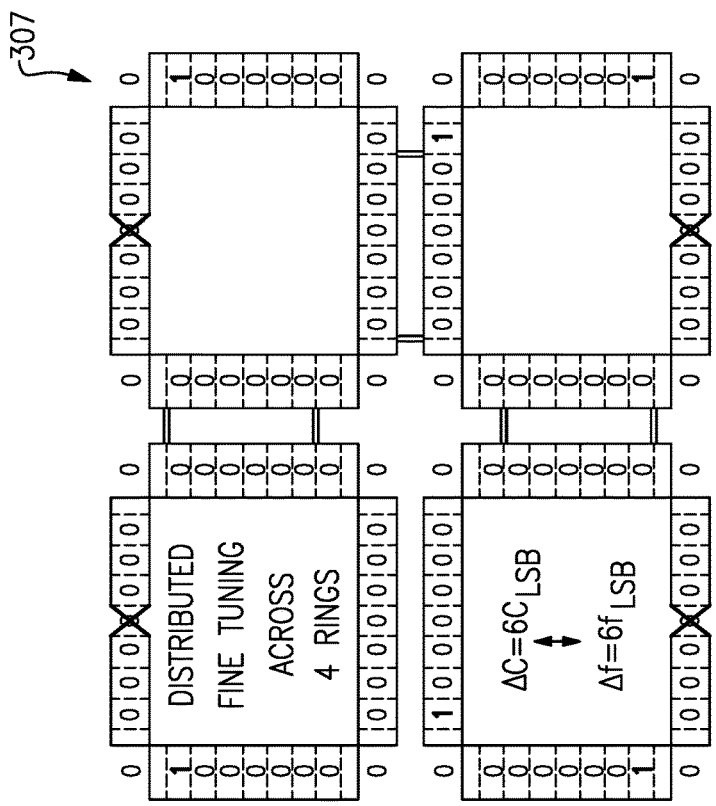
Figure 9J:
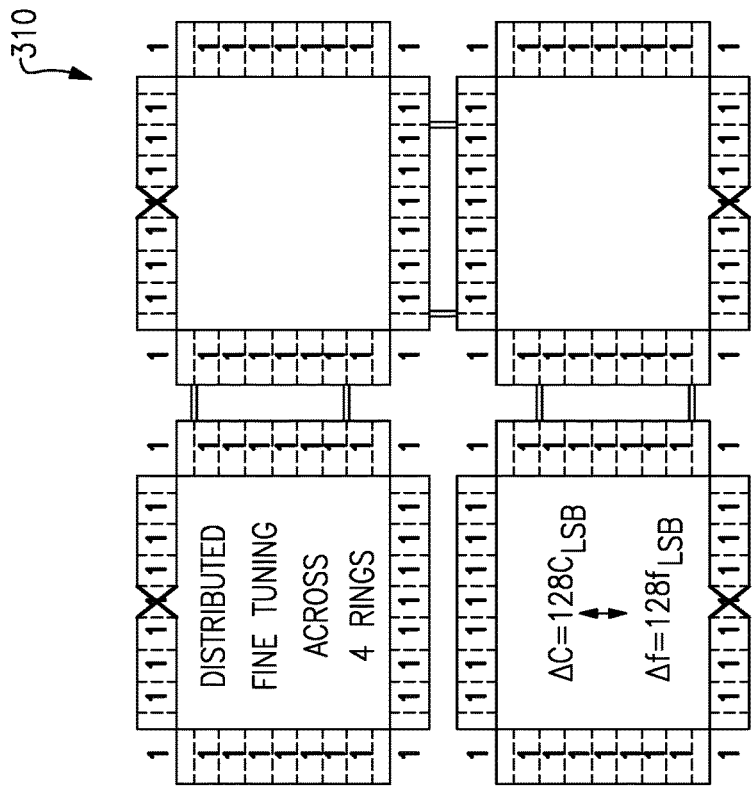
Figure 9I:
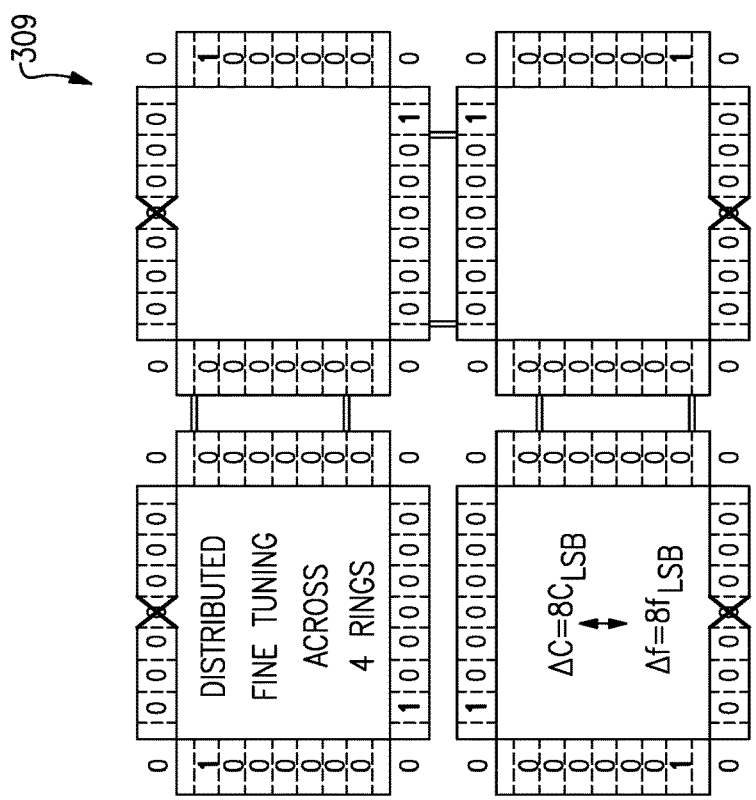

As shown in FIGS. 9F-9I, the algorithm continues. FIG. 9F illustrates a sixth fine tuning configuration 306 in which the fine tuning code is 5. FIG. 9G illustrates a seventh fine tuning configuration 307 in which the fine tuning code is 6. FIG. 9H illustrates an eighth fine tuning configuration 308 in which the fine tuning code is 7. FIG. 9I illustrates a ninth fine tuning configuration 309 in which the fine tuning code is 8.

In FIG. 9J, a tenth fine tuning configuration 310 in shown in which the fine code is 128 and each segment of each RTWO includes an activated capacitor. The selection algorithm continues for fine codes beyond 128 up to a maximum value of the fine code. Thus, the selection of tuning capacitors is distributed across the four RTWO rings up to the total number of fine integer tuning capacitors, which in this specific example is 31 capacitors per segment×32 segments×4 rings=3968 tuning capacitors. Although the illustrated example operates with 3968 tuning capacitors, other implementations are possible.

Although various examples of distributed quantized tuning have been described, distributed quantized tuning can be applied to RTWOs implemented in a wide variety of ways. For example, an RTWO can include one or more rings of a variety of shapes and sizes, and the RTWO can include segments implemented in a multitude of ways. Accordingly, the teachings herein are applicable to RTWOs implemented in a wide variety of ways.

Examples of Segmented Decoding for a Rotary Traveling Wave Oscillator

In certain configurations herein, a segmented decoding scheme is provided for RTWO frequency tuning codes to reduce decoding complexity. The segmented decoding scheme can operate using a combination of global decoding and local decoding to process the frequency tuning codes. By using segmented decoding, a number of signal routes associated with frequency tuning codes can be reduced.

An RTWO can operate with a large number of tuning capacitors, including tuning capacitors for PVT tuning, coarse tuning, and fine tuning (including, for instance, both fine integer and fine fractional tuning). The number of tuning capacitors can be further increased in implementations using multiple rings coupled to one another to reduce phase noise. The large number of tuning capacitors can lead to a large number of signal routes or wires.

In one example, a 4-ring RTWO includes 32 segments per ring, with each segment including a PVT tuning capacitor bank with 2 bits, a coarse tuning capacitor bank with 3 bits, and a fine integer tuning capacitor bank with 5 bits. Additionally, each ring includes one instantiation of a fine fractional tuning capacitor bank with 5 bits. In this example, without segmented decoding the PVT tuning capacitor banks operate with 256 wires (2 bits*32 segments*4 rings), the coarse tuning capacitor banks operate with 384 wires (3 bits*32 segments*4 rings), the fine integer tuning capacitor banks operate with 640 wires (5 bits*32 segments*4 rings), and the fine fractional tuning capacitor banks operate with 20 wires (5 bits*4 rings). Thus, a total number of wires in this example can be 256+384+640+20=1300 wires.

However, routing a voluminous amount of wires leads to routing congestion. Moreover, the routes can lead to an electrical environment subject to potential coupling of digital spurious components to the RTWO. For instance, a large collection of wires can act as a large antenna on a semiconductor chip. Additionally, the flexibility and/or scalability of the RTWO design can be constrained. For instance, such routing congestion can limit a maximum number of RTWO rings that can be coupled to one another to improve phase noise.

In certain configurations herein, tuning capacitors across RTWO segments are quantized, such that the tuning capacitors of each RTWO segment can be controlled separately from tuning capacitors of other segments. Additionally, a global decoder processes frequency tuning codes (for instance, a PVT tuning code, a coarse tuning code, and/or a fine integer tuning code) to generate input codes for local decoders of the RTWO. In certain implementations, thermometer decoding is performed locally for each segment via the local decoders. In multi-ring implementations, the frequency tuning codes can routed to global decoders associated with each of the RTWO's rings.

By using a segmented decoding scheme, a number of metal routes or wires can be reduced.

For instance, in the specific example described above, 1300 wires were used for a 4-ring RTWO that operated without segmented decoding. In contrast, segmented decoding in this specific example can be used to provide PVT tuning with 7 bits (for instance, 3 thermometer bits per segment*32 segments=96 LSB<$2^7$), coarse tuning with 8 bits (for instance, 7 thermometer bits per segment*32 segments=224 LSB<$2^8$), and fine integer tuning with 12 bits (for instance, 31 thermometer bits per segment*32 segments*4 rings=3968 LSB<$2^{12}$). Thus, the PVT tuning operates with 28 wires (7 bits*4 rings), coarse tuning operates with 32 wires (8 bits*4 rings), and fine integer tuning operates with 48 wires (12 bits*4 rings). Thus, a total number of wires in this example can be 28+32+48+20=128 wires, which is about an order of magnitude less than the implementation without segmented decoding.

Figure 10:
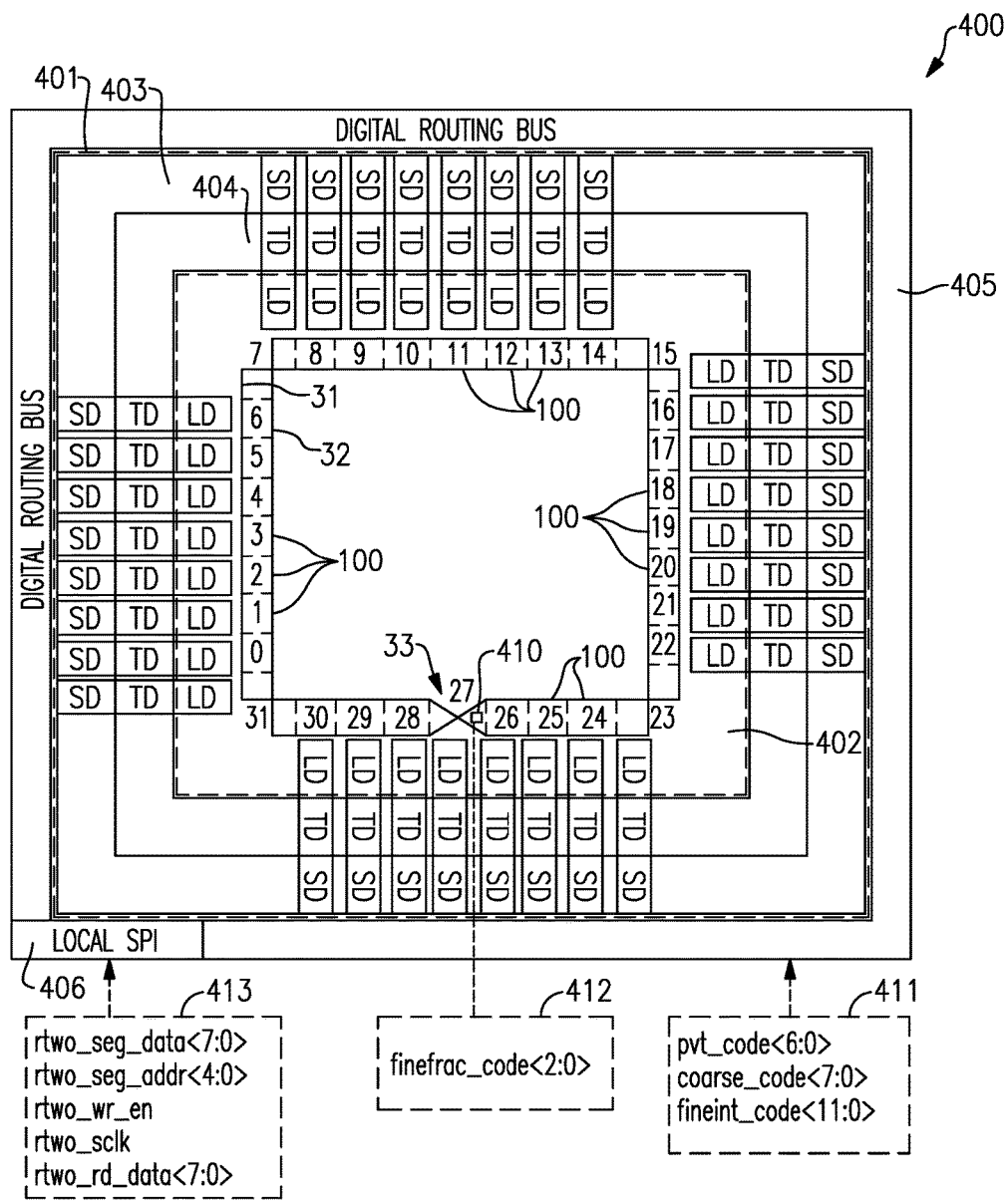
FIG. 10 illustrates one embodiment of an RTWO with segmented decoding.

FIG. 10 illustrates one embodiment of an RTWO 400 with segmented decoding. In certain configurations herein, segmented decoding is provided to reduce a number of wires to route to an RTWO, such as a number of digital signal routes from an ADPLL core to an RTWO.

The RTWO 400 includes a differential transmission line connected in a closed-loop or ring. The differential transmission line includes a first conductor 31, a second conductor 32, and a crossover 33. The RTWO 400 further includes segments 100, which can be as described earlier with respect to FIG. 7. In the illustrated embodiment, thirty-two instantiations of the segment 100 are positioned around the ring, with eight segments per side of the ring. As shown in FIG. 10, the thirty-two segments are labeled with indexes ranging between 0 and 31.

The RTWO 400 further includes a global decoder system 401, a local decoder system 402, a digital routing bus 405, a serial interface 406, and a fine fractional tuning capacitor bank 410.

Although one specific RTWO implementation is shown, the teachings herein are applicable to RTWOs implemented in a wide variety of ways, including, but not limited to, RTWOs with different ring implementations, different segment implementations, and/or different decoder implementations.

Figure 11:
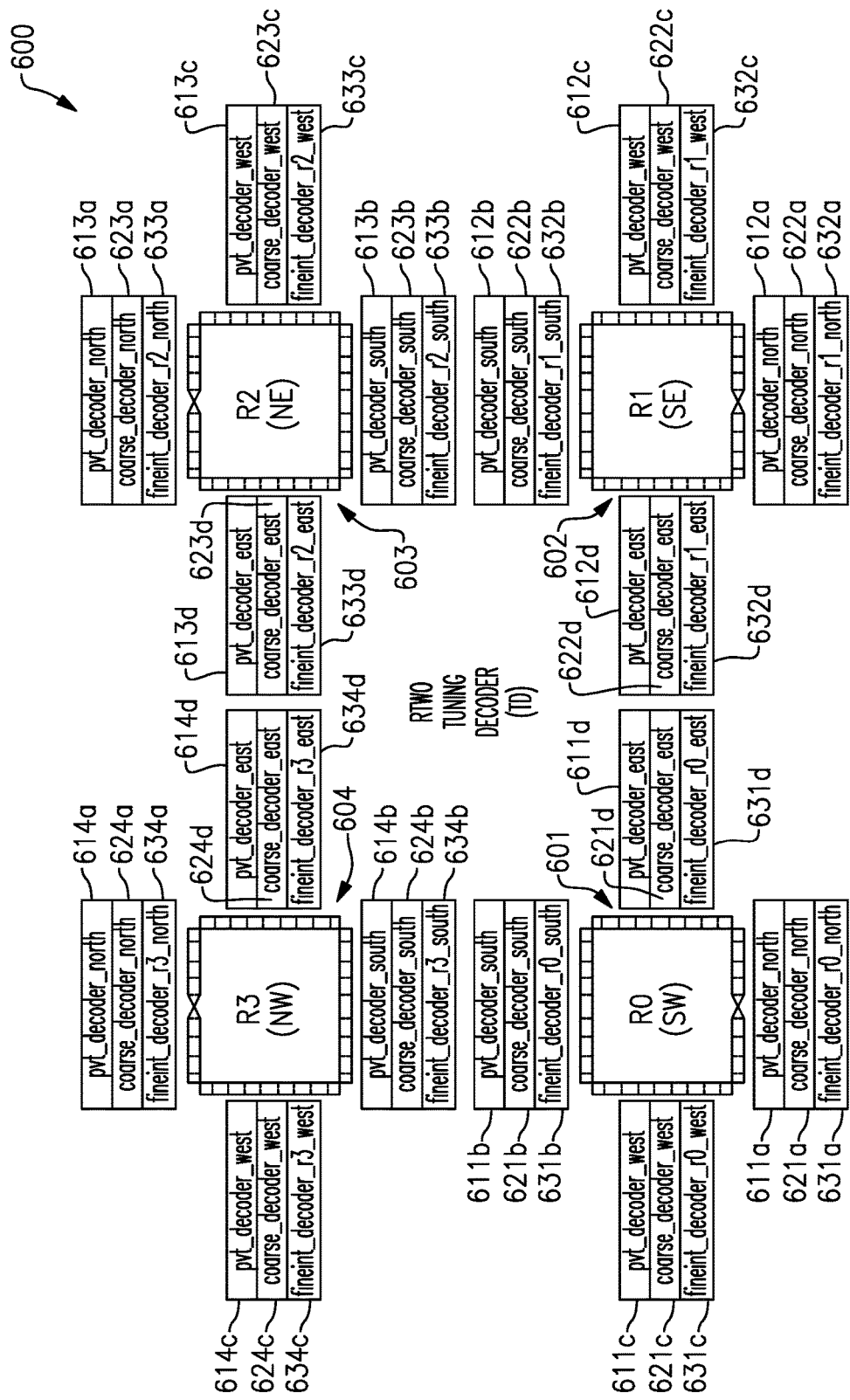
FIG. 11 illustrates one embodiment of tuning decoders for a multi-ring RTWO.

The global decoder system 401 includes a segment decoder system 403 and a tuning decoder system 404. The global decoder system 401 can be implemented using digital logic circuitry, such as digital logic generated via digital synthesis. For instance, the segment decoder system 403 and/or the tuning decoder system 404 can be described using a hardware description language, such as Verilog, which can be synthesized to generate digital logic circuitry. However, other implementations are possible. Although shown as distributed per segment, one or more decoders can be configured to provide decoding to multiple segments. For instance, one decoder can be used per RTWO side, as shown in FIG. 11.

The tuning decoder system 404 serves to decode frequency tuning codes (for instance, PVT, coarse, and/or fine integer tuning codes) to generate input codes to the local decoder system 402. The input codes are processed by the local decoder system 402 to activate appropriate tuning capacitors of the RTWO segments.

In the illustrated embodiment, the tuning decoder system 404 includes a tuning decoder (TD) for each segment 100. Additionally, the local decoder system 402 includes a local decoder (LD) for each segment 100. In certain implementations, a LD is used to convert a binary input code from a corresponding TD to a thermometer encoded output code used to select a number of active tuning capacitors of a particular RTWO segment 100.

As shown in FIG. 10, the digital routing bus 405 surrounds a perimeter of the RTWO 400. The digital routing bus 405 can be used to route a wide variety of input signals to the global decoder system 401.

For example, the global decoder system 4101 of the RTWO 400 has been annotated to illustrate inputs signals 411-412 used for frequency tuning, including a PVT tuning code (pvt_code<6:0>), a coarse tuning code (coarse_code<7:0>), a fine integer tuning code (fineint_code<7:0>), and a fine fractional tuning code (finefrac_code<2:0>). Although not illustrated in FIG. 10 for clarity, the RTWO 400 can receive one or more clock signals used to indicate timing of the tuning codes.

In the illustrated embodiment, the digital routing bus 405 provides the PVT tuning code, the coarse tuning code, and the fine integer tuning code to the tuning decoder system 404, which processes the codes to generate input codes to control the local decoder system 402. The local decoder system 402 processes the inputs codes to control PVT tuning banks, coarse tuning banks, and fine integer tuning banks of the RTWO segments 100.

As shown in FIG. 10, one instantiation of the fine fractional tuning bank 410 is included in the illustrated RTWO 400, and the fine fractional tuning code (finefrac_code<2:0>) is provided to the fine fractional tuning bank 410 to control fine fractional tuning. Thus, the fine fractional tuning code bypasses the tuning decoder system 404, in this example. In certain implementations, an LD is included to decode the fine fractional tuning code to generate thermometer bits to control the fine fractional tuning bank 410.

Although one specific implementation of frequency tuning codes and decoding is shown, the teachings herein are applicable to a wide variety of implementations.

The segment decoder system 403 includes a segment decoder (SD) for each segment 100. The segment decoder system 403 serves to decode data received via the serial interface 406 to the RTWO's segments 100.

As shown in FIG. 10, the serial interface 406 receives input signals 413 including a segment data signal (rtwo_seg_data<7:0>), a segment address signal (rtwo_seg_addr<4:0>), a write enable signal (rtwo_wr_en), a serial interface clock signal (rtwo_sclk), and a read data signal (rtwo_rd_data<7:0>). In certain implementations, the serial interface 406 is implemented as a local serial peripheral interface (SPI).

In the illustrated embodiment, the digital routing bus 405 routes the input signals 413 to each SD of the segment decoding system 403 for decoding.

It can be desirable for the segments of an RTWO, such as the RTWO segments 100, to be configurable. To provide configurability, the RTWO segments 100 can be written or read to via the serial interface 406.

The illustrated RTWO 400 includes the segment decoder system 401, which reduces a number of routes associated with communicating with the RTWO segments 100. In certain implementations, the segment decoder system 403 operates using a local register map. The local register map is used to provide bit addresses for each of the segments, and is used to determine when the serial interface 406 is communicating with a particular one of the RTWO segments 100.

By including the segment decoder system 401, a number of data and address bus bits associated with routing from the serial interface 406 to the RTWO segments 100 can be reduced.

For example, in one specific implementation, a 4-ring RTWO with 32 segments per ring includes a data bus that operates using 8 bits common to 4 rings, and an address bus that operates using 5 bits common to 4 rings. In such an example, the 4-ring RTWO operates with 13 bits and wires.

In contrast, a similar 4-ring RTWO implemented with a segment decoder system can include 2048 bits and wires (16 bits per segment*32 segments*4 rings). Thus, a reduction of over one hundred-fold can be achieved by including a segment decoder system in this specific example.

Additional details of the segment decoder system 403 can be as discussed below with respect to FIGS. 14-15.

FIG. 11 illustrates one embodiment of tuning decoders for a multi-ring RTWO 600. The multi-ring RTWO 600 includes a southwest RTWO ring 601 (R0), a southeast RTWO ring 602 (R1), a northeast RTWO ring 603 (R2), and a northwest RTWO ring 604 (R3). Although a configuration using four rectangular RTWO rings is shown, the teachings herein are applicable to implementations using more or fewer rings and/or rings implemented with other shapes.

Although terms related to cardinal directions (north, south, east, west, northeast, northwest, southeast, southwest) are used in describing the multi-ring RTWO, persons having ordinary skill in the art will appreciate that the terms are used herein for understanding relative orientations, and do not refer to true directions. For example, the multi-ring RTWO 600 is typically implemented at least in part on an integrated circuit (IC) or semiconductor die, and the orientation of the multi-ring RTWO 600 changes as the IC changes position or angle. Similarly, terms related to top, bottom, left, and right are used to describe relative directions.

As shown in FIG. 11, PVT tuning decoders, coarse tuning decoders, and fine integer tuning decoders are provided around the sides of each of the RTWO rings 601-604.

With respect to the northwest RTWO ring 604, a north PVT decoder 614a, a north coarse decoder 624a, and a north fine integer decoder 634a are positioned on a first or top side. Additionally, a south PVT decoder 614b, a south coarse decoder 624b, and a south fine integer decoder 634b are positioned on a second or bottom side. Furthermore, a west PVT decoder 614c, a west coarse decoder 624c, and a west fine integer decoder 634c are positioned on a third or left side. Additionally, an east PVT decoder 614d, an east coarse decoder 624d, and an east fine integer decoder 634d are positioned on a fourth or right side.

Additionally, orientations of corresponding tuning decoders of the northeast RTWO ring 603 are line symmetric with respect to the northwest RTWO ring 604. For example, with respect to the northeast RTWO ring 603, a north PVT decoder 613a, a north coarse decoder 623a, and a north fine integer decoder 633a are positioned on a top side. Additionally, a south PVT decoder 613b, a south coarse decoder 623b, and a south fine integer decoder 633b are positioned on a bottom side. Furthermore, a west PVT decoder 613c, a west coarse decoder 623c, and a west fine integer decoder 633c are positioned on a right side. Additionally, an east PVT decoder 613d, an east coarse decoder 623d, and an east fine integer decoder 633d are positioned on a left side.

Furthermore, orientations of corresponding tuning decoders of the southwest RTWO ring 601 are line symmetric with respect to the northwest RTWO ring 604. For example, with respect to the southwest RTWO ring 601, a north PVT decoder 611a, a north coarse decoder 621a, and a north fine integer decoder 631a are positioned on a bottom side. Additionally, a south PVT decoder 611b, a south coarse decoder 621b, and a south fine integer decoder 631b are positioned on a top side. Furthermore, a west PVT decoder 611c, a west coarse decoder 621c, and a west fine integer decoder 631c are positioned on a left side. Additionally, an east PVT decoder 611d, an east coarse decoder 621d, and an east fine integer decoder 631d are positioned on a right side.

Additionally, orientations of corresponding tuning decoders of the southeast RTWO ring 602 are line symmetric with respect to both the southwest RTWO ring 601 and the northeast RTWO ring 603. For example, with respect to the southeast RTWO ring 602, a north PVT decoder 612a, a north coarse decoder 622a, and a north fine integer decoder 632a are positioned on a bottom side. Additionally, a south PVT decoder 612b, a south coarse decoder 622b, and a south fine integer decoder 632b are positioned on a top side. Furthermore, a west PVT decoder 612c, a west coarse decoder 622c, and a west fine integer decoder 632c are positioned on a right side. Additionally, an east PVT decoder 612d, an east coarse decoder 622d, and an east fine integer decoder 632d are positioned on a left side.

Implementing tuning decoders of one RTWO ring with line symmetry with respect to the tuning decoders of another RTWO ring provides symmetry that reduces mismatch between the rings.

In the illustrated embodiment, tuning decoders are placed at each side of the RTWO ring. Additionally, the tuning decoders control tuning capacitors of adjacent RTWO segments, which reduces connections between the tuning decoders' outputs and RTWO segments. For example, in an implementation with 32 segments per RTWO ring, the north tuning decoders provide decoding to 8 corresponding segments of the RTWO ring. Accordingly, route lengths are reduced. Thus, the illustrated tuning decoders can illustrate a collection of TD blocks as depicted in FIG. 10. However, other implementations are possible. For example, a separate TD block can be provided for each RTWO segment.

As shown in FIG. 11, the PVT tuning decoders of the RTWO rings 601-604 are denoted with text labels pvt_decoder_north, pvt_decoder_west, pvt_decoder_south, and pvt_decoder_east. Additionally, the coarse tuning decoders are denoted with text labels coarse_decoder_north, coarse_decoder_west, coarse_decoder_south, and coarse_decoder_east. In certain implementations, the PVT tuning decoders are substantially identical for each of the RTWO rings and segments, and the PVT tuning decoders operate with common PVT tuning codes. Additionally, in certain implementations the coarse tuning decoders are substantially identical for each of the RTWO rings and segments, and the coarse tuning decoders operate with common coarse tuning codes.

In one embodiment, the PVT and/or coarse tuning decoders operate with distributed quantized tuning, as was discussed earlier with respect to FIGS. 8A-8R.

As shown in FIG. 11, the fine integer tuning decoders of the RTWO rings 601-604 are denoted with text labels fineint_decoder_r0_north, fineint_decoder_r0_west, fineint_decoder_r0_south, fineint_decoder_r0_east, fineint_decoder_r1_north, fineint_decoder_r1_west, fineint_decoder_r1_south, fineint_decoder_r1_east, fineint_decoder_r2_north, fineint_decoder_r2_west, fineint_decoder_r2_south, fineint_decoder_r2_east, fineint_decoder_r3_north, fineint_decoder_r3_west, fineint_decoder_r3_south, and fineint_decoder_r3_east.

In certain implementations, the fine integer tuning decoders are implemented using substantially identical hardware (for instance, substantially identical Verilog), but operate with different values of rtwo_location<3:0>, and thus have different output values. Implementing the decoders in this manner enhances scalability and flexibility.

In one embodiment, the fine integer tuning decoders operate with distributed quantized tuning of tuning codes across both segments and rings, as was discussed earlier with respect to FIGS. 9A-9J. Providing separate fine integer tuning decoders provides a capability of fine-tuning across each of the RTWO's segments as well as across each of the RTWO rings. This, in turn, facilitates individual control of each tuning element of each segment of each RTWO ring. Accordingly, in certain implementations fine integer tuning is performed across each of the RTWO's segments and across each RTWO ring.

Although FIG. 11 illustrates one embodiment of tuning decoders for a multi-ring RTWO, tuning decoders can be implemented in a wide variety of ways.

Figure 12:
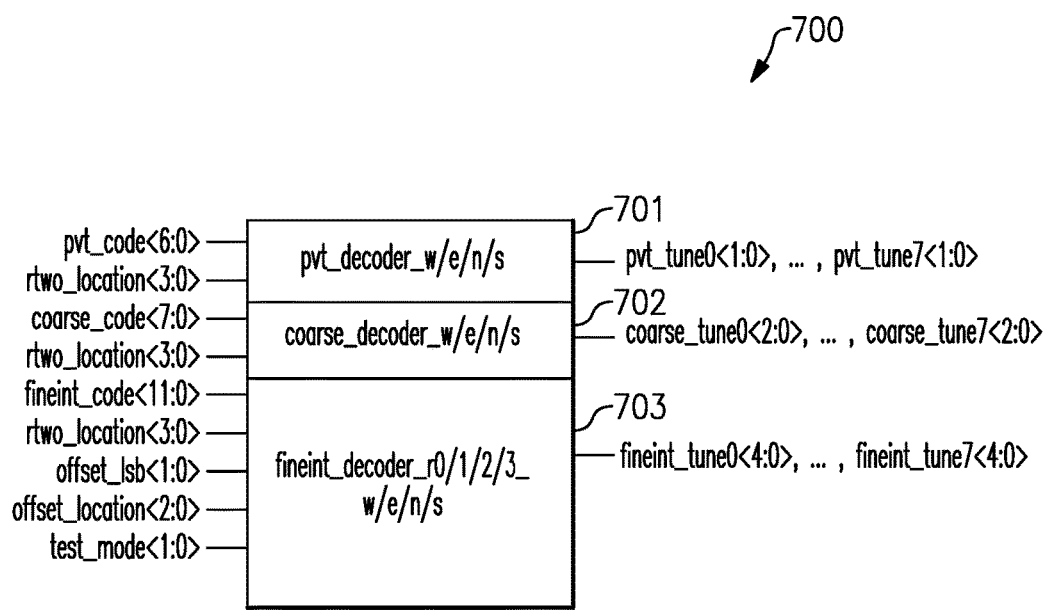
FIG. 12 illustrates one embodiment of an RTWO tuning decoder.

FIG. 12 illustrates one embodiment of an RTWO tuning decoder 700. Multiple instantiations of the RTWO tuning decoder 700 can be positioned along RTWO sides. For example, the RTWO tuning decoder 700 illustrates one implementation of the tuning decoders of FIG. 11 positioned on one side of an RTWO ring.

In the illustrated embodiment, the RTWO tuning decoder 700 includes a PVT tuning decoder 701, a coarse tuning decoder 702, and a fine integer tuning decoder 703.

As shown in FIG. 12, the PVT tuning decoder 701 receives a PVT tuning code (pvt_code<6:0>) and a location code (rtwo_location<3:0>), and generates segment PVT tuning codes (pvt_tune0<1:0>, . . . , pvt_tune7<1:0>). The segment PVT tuning codes are used by local decoders (LDs) of corresponding segments to control selection of PVT tuning capacitors.

The coarse tuning decoder 702 of FIG. 12 receives a coarse tuning code (coarse_code<7:0>) and the location code (rtwo_location<3:0>), and generates segment coarse tuning codes (coarse_tune0<2:0>, . . . , coarse_tune7<2:0>). The segment coarse tuning codes are used by LDs of corresponding segments to control selection of coarse tuning capacitors.

As shown in FIG. 12, the fine integer tuning decoder 703 receives a fine integer tuning code (fineint_code<11:0>), the location code (rtwo_location<3:0>), an LSB offset code (offset_lsb<1:0>), an offset location code (offset_location<2:0>), and a test mode code (test_mode<1:0>), and generates segment fine integer tuning codes (fineint_tune0<4:0>, . . . , fineint_tune7<4:0>). The segment fine integer tuning codes are used by LDs of corresponding segments to control selection of fine integer tuning capacitors.

Multiple instantiations of the RTWO tuning decoder 700 can be positioned along sides of the RTWO rings 601-604 of FIG. 11, and the location code (rtwo_location<3:0>) can be used to control the response of the tuning decoders to a particular tuning code value. In one embodiment, the selected tuning decoder location for different values of the location code (rtwo_location<3:0>) is given by Table 1 below.

TABLE 1

| rtwo_location<3:0> | | | | |
| --- | --- | --- | --- | --- |
| <3> | <2> | <1> | <0> | Selected Tuning Decoder |
| 0 | 0 | 0 | 0 | West, R0 |
| 0 | 0 | 0 | 1 | South, R0 |
| 0 | 0 | 1 | 0 | East, R0 |
| 0 | 0 | 1 | 1 | North, R0 |
| 0 | 1 | 0 | 0 | West, R1 |
| 0 | 1 | 0 | 1 | South, R1 |
| 0 | 1 | 1 | 0 | East, R1 |
| 0 | 1 | 1 | 1 | North, R1 |
| 1 | 0 | 0 | 0 | West, R2 |
| 1 | 0 | 0 | 1 | South, R2 |
| 1 | 0 | 1 | 0 | East, R2 |
| 1 | 0 | 1 | 1 | North, R2 |
| 1 | 1 | 0 | 0 | West, R3 |
| 1 | 1 | 0 | 1 | South, R3 |
| 1 | 1 | 1 | 0 | East, R3 |
| 1 | 1 | 1 | 1 | North, R3 |

In certain implementations, the address of a particular tuning decoder is hardwired when the tuning decoder is instantiated in a particular location around an RTWO ring.

The tuning decoders positioned around the RTWO rings decode the PVT tuning code (pvt_code<6:0>), the coarse tuning code (coarse_code<7:0>), and the fine integer tuning code (fineint_code<11:0>). The tuning codes indicate a total number of tuning capacitors in the RTWO to be activated or selected.

In the illustrated embodiment, each of the tuning decoders generate segment tuning codes for multiple RTWO segments. For example, the PVT tuning decoder 701 outputs segment PVT tuning codes (pvt_tune0<1:0>, . . . , pvt_tune7<1:0>) for eight RTWO segments. Additionally, the coarse tuning decoder 702 outputs segment coarse tuning codes (coarse_tune0<2:0>, . . . , coarse_tune7<2:0>) for eight RTWO segments. Furthermore, fine integer tuning decoder 703 outputs segment fine integer tuning codes (fineint_tune0<4:0>, . . . , fineint_tune7<4:0>) for eight RTWO segments. Although the illustrated tuning decoders output segment tuning codes for eight segments, other implementations are possible.

In the illustrated embodiment, the outputs of the tuning decoders represent a binary representation of the tuning capacitors being selected for each of the tuning capacitor banks. Corresponding local decoder (LDs) are used to process the output of the tuning decoders to control selection of tuning capacitors of corresponding segments. In certain implementations, the LDs generate a thermometer code for each of the tuning capacitor banks based on the binary outputs of the tuning decoders.

In one example, a PVT tuning capacitor bank of each segment includes 3 PVT capacitors represented by 2 binary bits, and the LD processes the 2 binary bits to generate a thermometer code for controlling selection of the 3 PVT capacitors. In another example, a coarse tuning bank of each segment include 7 coarse tuning capacitors represented by 3 binary bits, and the LD processes the 3 binary bits to generate a thermometer code for controlling selection of the 7 coarse tuning capacitors. In yet another example, a fine integer tuning bank has 31 capacitors represented by 5 binary bits, and the LD processes the 5 binary bits to generate a thermometer code for controlling selection of the 31 capacitors.

In the illustrated embodiment, the fine integer tuning decoder 703 further receives the LSB offset code (offset_lsb<1:0>), the offset location code (offset_location<2:0>), and the test mode code (test_mode<1:0>).

In one embodiment, the test mode code controls whether or not fine fractional tuning is quantized across segments and across multiple rings (for instance, as shown in FIGS. 9A-9J) or quantized across segments but not across multiple rings. Quantizing across segments and across multiple rings provides enhanced tuning resolution.

The LSB offset code (offset_lsb<1:0>) and the offset location code (offset_location<2:0>) can be used to add a number of offset LSBs to the fine integer tuning code (fineint_code<11:0>). Advantageously, the offset LSBs can be added by adjusting a value of the fine integer tuning code, rather than by selecting tuning capacitors of a special tuning bank. Providing an offset allows for compensation of non-linearity across an RTWO ring, where capacitance mismatches can occur particularly at segments near corners and/or crossovers. Thus, capacitance mismatch can be compensated by adding an offset digital code to any particular segment taken from any of the segments of any of the rings of the RTWO (for instance from any of 128 segments for a 4-ring RTWO with 32 segments per ring). The offset digital code is added to the segment identified by the offset location code (offset_location<2:0>).

One embodiment of the added number of LSBs for different values of the LSB offset code (offset_lsb<1:0>) is given by Table 2 below. However, other implementations are possible.

TABLE 2

| offset_lsb<1> | offset_lsb<0> | Added Number of LSBs |
| --- | --- | --- |
| 0 | 0 | 2 |
| 0 | 1 | 4 |
| 1 | 0 | 6 |
| 1 | 1 | 10 |

The LSB offset code (offset_lsb<1:0>) can also be used to assess the sensitivity of a multi-ring RTWO to mismatch in any of the segments. Thus, the LSB offset code (offset_lsb<1:0>) serves as a powerful investigative tool to assess the quality of the physical layout of an RTWO. For example, the 2, 4, 6 or 10 LSBs can be added to any of the 128 segments in the RTWO by programming a digital code without the need of additional fixed tuning capacitors in each of the RTWO segments.

One embodiment of the selected segment for different values of the offset location code (offset_location<2:0>) is given by Table 3 below. However, other implementations are possible.

TABLE 3

| offset_location<2:0> | | | |
| --- | --- | --- | --- |
| <2> | <1> | <0> | Selected Segment |
| 0 | 0 | 0 | Segment[0] |
| 0 | 0 | 1 | Segment[1] |

TABLE 3-continued

| offset_location<2:0> | | | |
|---|---|---|---|
| <2> | <1> | <0> | Selected Segment |
| 0 | 1 | 0 | Segment[2] |
| 0 | 1 | 1 | Segment[3] |
| 1 | 0 | 0 | Segment[4] |
| 1 | 0 | 1 | Segment[5] |
| 1 | 1 | 0 | Segment[6] |
| 1 | 1 | 1 | Segment[7] |

The LSB offset code (offset_lsb<1:0>) and the offset location code (offset_location<2:0>) can be used to write a desired number of LSBs to any of the segments of the RTWO. In certain embodiments, offset is provided via a segment decoder system (for instance, the segmented digital addressing system of FIG. 14), rather than via a decoder. For example, with respect to the embodiment of FIG. 10, the SPI interface 406 can be used to write a desired number of LSBs to a particular segment.

In one embodiment, a random or pseudo random number of offset LSBs is regularly written while the RTWO is operational. The process of writing a random number of offset LSBs can be done at an arbitrary speed while the RTWO is oscillating at its fundamental frequency. By implementing the RTWO in this manner, the linearity of the RTWO is improved by randomizing the mismatches in fine-integer tuning capacitors. For example, the LSB offset code (offset_lsb<1:0>) and the offset location code (offset_location<2:0>) can be used to provide dynamic adjustment to the capacitance values of the segments, thereby providing linearizing the fine-tuning gain characteristics.

Although FIG. 12 illustrates one embodiment of an RTWO tuning decoder, RTWO tuning decoders can be implemented in a wide variety of ways.

Examples of algorithms for a tuning decoder system are provided below. The tuning decoding algorithm can be used to implement the tuning decoders of the multi-ring RTWO 700 of FIG. 11 when implementing the tuning decoders using the embodiment shown in FIG. 12. In certain configurations, the hardware description language describing the algorithms can be synthesized to generate digital logic circuitry. However, other implementations are possible.

Although specific tuning decoder algorithms are described, the teachings herein are applicable to a wide variety of tuning decoding algorithms.

A tuning decoder can be implemented to map the binary tuning codes (for instance, pvt_code<6:0>, coarse_code<7:0> and fineint_code<11:0>) to the segments of an RTWO.

In one example, the PVT tuning and coarse tuning algorithms are implemented to have different maximum code values (for instance, 96 codes for PVT versus 224 codes for coarse tuning), but otherwise to be substantially identical.

Thus, although the following example focuses on quantized PVT tuning, a coarse tuning algorithm can be implemented in similar manner.

As a PVT code increments, the computations described by the hardware description language below (hereinafter "Hardware Description 1") determines which of the four sides (west, south, east and north) of the RTWO ring is selected. Once a side is selected, the algorithm sets the segments within that side. The offset numbers 1, 2, 3 and 4 selects one of the west, south, east or north sides of the RTWO as the PVT code increments by 1.

pvt_seg_counter_west=mod(pvt_code,32)−1 pvt_seg_counter_south=mod(pvt_code,32)−2 pvt_seg_counter_east=mod(pvt_code,32)−3 pvt_seg_counter_north=mod(pvt_code,32)−4

The modulus of 32 indicates that a cycle of 32 segments in one RTWO ring lapses before these computations reset back to zero. For instance, this corresponds to when all 32 segments within the RTWO ring have fired by 1 LSB (see for example, FIG. 8R). Accordingly, when pvt_code=32, all the PVT tuning capacitors in each of the segments will have 1 LSB of capacitance, when pvt_code=2×32, all the PVT tuning capacitors in each of the segments will have 2 LSB of capacitance, and when pvt_code=3×32, all the PVT tuning capacitors in each of the segments will have 3 LSB of capacitance.

The computations above serve as an input to the block counter computations described by the hardware description language below (hereinafter "Hardware Description 2"). As set forth in Hardware Description 2, the block counter increments by 1 for every 4 codes of the pvt_seg_counter. This indicates that each side of the RTWO rings has an equal number of LSB capacitors activated, or that a full cycle around the west, south, east and north sides of the RTWO is completed (in that sequence, in this example). On the 5th count, the block counter indicates that it is time to circle back to the west side of the RTWO and add an LSB at a different segment on that side.

pvt_seg_block_counter_west_decoder=
floor(pvt_seg_counter_west/4)+1 pvt_seg_block_counter_south_decoder=
floor(pvt_seg_counter_south/4)+1 pvt_seg_block_counter_east_decoder=
floor(pvt_seg_counter_east/4)+1 pvt_seg_block_counter_north_decoder=
floor(pvt_seg_counter_north/4)+1

The PVT code assigned to each of the 32 segments is computed by the hardware description language below (hereinafter "Hardware Description 3"). Additionally, for the first 32 PVT codes, the PVT code assigned to any of the 32 segments is 1 indicating that 1 LSB is added to the tuning capacitor banks in any of the segments. For the next 32 PVT codes (and so on), the PVT code assigned to any of the 32 segments is 2, indicating that 2 LSB is added to the tuning capacitor banks in any of the segments. The value of pvt_code_assign ranges between 1 and 3, in this example.

pvt_code_assign=floor(pvt_code/32)+1

Based on the value of the block counter set forth in Hardware Description 2, the individual tuning capacitor banks in each of the west, south, east and north sides of the RTWO ring are set according to the hardware description language below (hereinafter "Hardware Description 4"). Although Hardware Description 4 shows computations for the west tuning decoder only, the south, east and north decoders can use similar computations. For example, if pvt_seg_block_counter_west_decoder=0 and pvt_code_assign=1, the PVT code for the tuning capacitor banks on the west side of the RTWO ring are all zeros and the tuning capacitors are switched out. Additionally, if pvt_seg_block_counter_west_decoder=1, all but the PVT of segment 0 on the west side of the RTWO is set to 1 or 1 LSB of tuning capacitance. Furthermore, if pvt_seg_block_counter_west_decoder=2, the PVT code for segment 0 and segment 4 of the tuning capacitor banks on the west side of the RTWO ring are set to 1. By the time pvt_seg_block_counter_west- _decoder equals to 2, the input pvt_code is 5, which indicates that the block counter circled back to the west side of the RTWO after adding an LSB on each of the RTWO 4 sides.

if pvt_seg_block_counter_west_decoder==0 pvt_tune0=pvt_code_assign−1 pvt_tune1=pvt_code_assign−1 pvt_tune2=pvt_code_assign−1 pvt_tune3=pvt_code_assign−1 pvt_tune4=pvt_code_assign−1 pvt_tune5=pvt_code_assign−1 pvt_tune6=pvt_code_assign−1 pvt_tune7=pvt_code_assign−1 elseif pvt_seg_block_counter_west_decoder==1 pvt_tune0=pvt_code_assign pvt_tune1=pvt_code_assign−1 pvt_tune2=pvt_code_assign−1 pvt_tune3=pvt_code_assign−1 pvt_tune4=pvt_code_assign−1 pvt_tune5=pvt_code_assign−1 pvt_tune6=pvt_code_assign−1 pvt_tune7=pvt_code_assign−1 elseif pvt_seg_block_counter_west_decoder==2 pvt_tune0=pvt_code_assign pvt_tune1=pvt_code_assign−1 pvt_tune2=pvt_code_assign−1 pvt_tune3=pvt_code_assign−1 pvt_tune4=pvt_code_assign pvt_tune5=pvt_code_assign−1 pvt_tune6=pvt_code_assign−1 pvt_tune7=pvt_code_assign−1 elseif pvt_seg_block_counter_west_decoder==3 pvt_tune0=pvt_code_assign pvt_tune1=pvt_code_assign−1 pvt_tune2=pvt_code_assign pvt_tune3=pvt_code_assign−1 pvt_tune4=pvt_code_assign pvt_tune5=pvt_code_assign−1 pvt_tune6=pvt_code_assign−1 pvt_tune7=pvt_code_assign−1 elseif pvt_seg_block_counter_west_decoder==4 pvt_tune0=pvt_code_assign pvt_tune1=pvt_code_assign−1 pvt_tune2=pvt_code_assign pvt_tune3=pvt_code_assign−1 pvt_tune4=pvt_code_assign pvt_tune5=pvt_code_assign−1 pvt_tune6=pvt_code_assign pvt_tune7=pvt_code_assign−1 elseif pvt_seg_block_counter_west_decoder==5 pvt_tune0=pvt_code_assign pvt_tune1=pvt_code_assign−1 pvt_tune2=pvt_code_assign pvt_tune3=pvt_code_assign pvt_tune4=pvt_code_assign pvt_tune5=pvt_code_assign−1 pvt_tune6=pvt_code_assign pvt_tune7=pvt_code_assign−1 elseif pvt_seg_block_counter_west_decoder==6 pvt_tune0=pvt_code_assign pvt_tune1=pvt_code_assign pvt_tune2=pvt_code_assign pvt_tune3=pvt_code_assign pvt_tune4=pvt_code_assign pvt_tune5=pvt_code_assign−1 pvt_tune6=pvt_code_assign pvt_tune7=pvt_code_assign−1 elseif pvt_seg_block_counter_west_decoder==7 pvt_tune0=pvt_code_assign pvt_tune1=pvt_code_assign pvt_tune2=pvt_code_assign pvt_tune3=pvt_code_assign pvt_tune4=pvt_code_assign pvt_tune5=pvt_code_assign pvt_tune6=pvt_code_assign pvt_tune7=pvt_code_assign−1

```
elseif pvt_seg_block_counter_west_decoder==8 pvt_tune0=pvt_code_assign pvt_tune1=pvt_code_assign pvt_tune2=pvt_code_assign pvt_tune3=pvt_code_assign pvt_tune4=pvt_code_assign pvt_tune5=pvt_code_assign pvt_tune6=pvt_code_assign pvt_tune7=pvt_code_assign endif
```

Using the PVT tuning algorithm described above, the block counter increments every 4 PVT codes at the input of the decoder. By the end of those 4 PVT codes, 1 LSB is set at segments 0, 8, 16 and 24. At PVT code 32, the block counter resets and each of the 32 segments has 1 LSB of tuning capacitance (all the segments from 0 to 31 have code 1 assigned to them). At code 33, the block counters start incrementing and segment 0 has 2 LSB. The algorithm continues until PVT code 64 is reached when all 32 segments have 2 LSB and the algorithm repeats until PVT code reaches 96.

A fine integer quantized tuning algorithm is provided in the following example. The fine integer quantized tuning algorithm follows a similar approach to that of the quantized PVT tuning algorithm described above. However, the fine integer quantized tuning algorithm also provides quantization of the tuning code across multiple RTWO rings (4, in this example) as well as across segments (32 per each ring, in this example). In contrast, the PVT tuning algorithm described above was quantized across RTWO segments but not across RTWO rings.

The computations described by the hardware description language below (hereinafter "Hardware Description 5") determines the location of the segment to be selected at one of the west, south, east or north sides of the four RTWO rings as fineint_code increases.

```
fineint_seg_counter_west_r0=mod(fineint_code,
    32*4)-1 fineint_seg_counter_west_r1=mod(fineint_code,
    32*4)-2 fineint_seg_counter_west_r2=mod(fineint_code,
    32*4)-3 fineint_seg_counter_west_r3=mod(fineint_code,
    32*4)-4 fineint_seg_counter_south_r0=mod(fineint_code,
    32*4)-5 fineint_seg_counter_south_r1=mod(fineint_code,
    32*4)-6 fineint_seg_counter_south_r2=mod(fineint_code,
    32*4)-7 fineint_seg_counter_south_r3=mod(fineint_code,
    32*4)-8 fineint_seg_counter_east_r0=mod(fineint_code,
    32*4)-9 fineint_seg_counter_east_r1=mod(fineint_code,
    32*4)-10 fineint_seg_counter_east_r2=mod(fineint_code,
    32*4)-11 fineint_seg_counter_east_r3=mod(fineint_code,
    32*4)-12 fineint_seg_counter_north_r0=mod(fineint_code,
    32*4)-13 fineint_seg_counter_north_r1=mod(fineint_code,
    32*4)-14 fineint_seg_counter_north_r2=mod(fineint_code,
    32*4)-15 fineint_seg_counter_north_r3=mod(fineint_code,
    32*4)-16
```

The offset numbers 1 to 16 in Hardware Description 5 above selects one of the 16 segments of the 4-ring RTWO as the code increments by 1. The modulus of 32*4=128 indicates that a cycle 128 segments lapses before the computations reset back to zero. This corresponds to when all 128 segments in the 4-ring RTWO have fired by 1 LSB. Accordingly, when fineint_code=128, all the fine integer tuning capacitors in each of the 128 segments have 1 LSB of capacitance. When fineint_code=2×128, all the fine integer tuning capacitors in each of the 128 segments have 2 LSB of capacitance, and so on. R0, R1, R2 and R3 indicate the ring numbers in the 4-ring coupled RTWO, as designated in FIG. 11.

As the fine code (fineint_code) increases, the sequence of decoders selected is shown in Table 4 below. This sequence repeats every 16 codes of the fineint_code.

TABLE 4

| fineint_code | Decoder |
| --- | --- |
| 0 | West, R0 |
| 1 | West, R1 |
| 2 | West, R2 |
| 3 | West, R3 |
| 4 | South, R0 |
| 5 | South, R1 |
| 6 | South, R2 |
| 7 | South, R3 |
| 8 | East, R0 |
| 9 | East, R1 |
| 10 | East, R2 |
| 11 | East, R3 |
| 12 | North, R0 |
| 13 | North, R1 |
| 14 | North, R2 |
| 15 | North, R3 |

The computations above in Hardware Description 5 serve as an input to the block counter computations set forth in the hardware description language below (hereinafter "Hardware Description 6"). As set forth below, the block counter increments by 1 for every 4×4=16 codes of the fineint_seg_ counter. This indicates that all 16 sides of the 4-ring RTWO have an equal number of LSB capacitance, and that a full cycle around the west, south, east and north sides of each of the 4 RTWO rings. On the 17th count, the block counter indicates that it is time to circle back to the west side of ring number 0 of the RTWO and add an LSB at a different segment on that side.

```
fineint_seg_block_counter_west_decoder_r0=floor
    (fineint_seg_counter_west_r0/(4*4))+1
``` fineint_seg_block_counter_west_decoder_$r$1=floor(fineint_seg_counter_west_$r$1/(4*4))+1 fineint_seg_block_counter_west_decoder_$r$2=floor(fineint_seg_counter_west_$r$2/(4*4))+1 fineint_seg_block_counter_west_decoder_$r$3=floor(fineint_seg_counter_west_$r$3/(4*4))+1 fineint_seg_block_counter_south_decoder_$r$0=floor(fineint_seg_counter_south_$r$0/(4*4))+1 fineint_seg_block_counter_south_decoder_$r$1=floor(fineint_seg_counter_south_$r$1/(4*4))+1 fineint_seg_block_counter_south_decoder_$r$2=floor(fineint_seg_counter_south_$r$2/(4*4))+1 fineint_seg_block_counter_south_decoder_$r$3=floor(fineint_seg_counter_south_$r$3/(4*4))+1 fineint_seg_block_counter_east_decoder_$r$0=floor(fineint_seg_counter_east_$r$0/(4*4))+1 fineint_seg_block_counter_east_decoder_$r$1=floor(fineint_seg_counter_east_$r$1/(4*4))+1 fineint_seg_block_counter_east_decoder_$r$2=floor(fineint_seg_counter_east_$r$2/(4*4))+1 fineint_seg_block_counter_east_decoder_$r$3=floor(fineint_seg_counter_east_$r$3/(4*4))+1 fineint_seg_block_counter_north_decoder_$r$0=floor(fineint_seg_counter_north_$r$0/(4*4))+1 fineint_seg_block_counter_north_decoder_$r$1=floor(fineint_seg_counter_north_$r$1/(4*4))+1 fineint_seg_block_counter_north_decoder_$r$2=floor(fineint_seg_counter_north_$r$2/(4*4))+1 fineint_seg_block_counter_north_decoder_$r$3=floor(fineint_seg_counter_north_$r$3/(4*4))+1

The computations described by the hardware description language below (hereinafter "Hardware Description 7") determines the fine integer code assigned to each of the 128 segments. Additionally, for the first 128 fine integer codes, the code assigned to any of the 128 segments is 1, indicating that 1 LSB is added to the tuning capacitor banks in any of the segments. For the next 128 fine integer codes, the fine integer code assigned to any of the 128 segments is 2 indicating that 2 LSB is added to the tuning capacitor banks in any of the segments, and so on. The value of fineint_code_assign ranges between 1 and 8.

fineint_code_assign=floor(fineint_code/(32*4))+1

Based on the value of the block counter set forth in Hardware Description 6, the individual tuning capacitor banks in each of the west, south, east and north sides of the RTWO ring are set according to computations set forth in the hardware description language below (hereinafter "Hardware Description 8"). Although Hardware Description 8 shows the computations for the west tuning decoder of ring number 0 only and for certain values of fineint_seg_block_counter_west_decoder_r0, the rest of the decoders and other values of fineint_seg_block_counter_west_decoder_r0 can use similar computations. For example, if fineint_seg_block_counter_west_decoder_r0=0 and fineint_code_assign=1, the fine integer code for the tuning capacitor banks on the west side of the RTWO ring number 0 are all zeros and the tuning capacitors are switched out. Additionally, if fineint_seg_block_counter_west_decoder_r0=1, all but the fine integer code of segment 0 on the west side of the RTWO ring 0 is set to 1 (1 LSB of tuning capacitance). Furthermore, if fineint_seg_block_counter_west_decoder_r0=2, the fine integer code for segment 0 and segment 4 of the tuning capacitor banks on the west side of the RTWO ring 0 are set to 1. By the time fineint_seg_block_counter_west_decoder_r0 equals to 2, the input fineint_code is 17 which means that the block counter circled back to the west side of the RTWO ring 0 after adding an LSB on each of the RTWO 16 sides.

if fineint_seg_block_counter_west_decoder_$r$0==0 fineint_tune0$r$0=fineint_code_assign−1 fineint_tune1$r$0=fineint_code_assign−1 fineint_tune2$r$0=fineint_code_assign−1 fineint_tune3$r$0=fineint_code_assign−1 fineint_tune4$r$0=fineint_code_assign−1 fineint_tune5$r$0=fineint_code_assign−1 fineint_tune6$r$0=fineint_code_assign−1 fineint_tune7$r$0=fineint_code_assign−1 elseif fineint_seg_block_counter_west_decoder_$r$0==1 fineint_tune0$r$0=fineint_code_assign fineint_tune1$r$0=fineint_code_assign−1 fineint_tune2$r$0=fineint_code_assign−1 fineint_tune3$r$0=fineint_code_assign−1 fineint_tune4$r$0=fineint_code_assign−1 fineint_tune5$r$0=fineint_code_assign−1 fineint_tune6$r$0=fineint_code_assign−1 fineint_tune7$r$0=fineint_code_assign−1 elseif fineint_seg_block_counter_west_decoder_$r$0==2 fineint_tune0$r$0=fineint_code_assign fineint_tune1$r$0=fineint_code_assign−1 fineint_tune2$r$0=fineint_code_assign−1 fineint_tune3$r$0=fineint_code_assign−1 fineint_tune4$r$0=fineint_code_assign fineint_tune5$r$0=fineint_code_assign−1 fineint_tune6$r$0=fineint_code_assign−1 fineint_tune7$r$0=fineint_code_assign−1

Using the tuning algorithm described above, the block counter increments every 16 fine integer codes at the input of the decoder. By the end of those 16 fine integer codes, 1 LSB is set at segments 0, 8, 16 and 24 for each of the rings R0 (SW), R1 (SE), R2 (NE) and R3 (NW). At fine integer code 128, the block counter resets and each of the 128 segments has 1 LSB of tuning capacitance (all the segments from 0 to 31 have code 1 assigned to them). At code 129, the block counters restarts incrementing and segment 0 has 2 LSB. The algorithm continues until fine integer code 256 is reached when all 128 segments have 2 LSB and the algorithm repeats until fine integer code reaches 3968.

Although specific examples of algorithms for a tuning decoder system were provided above, tuning decoding algorithms can be implemented in a wide variety of ways.

Examples of Dynamic Element Matching to Linearize Fine-Tuning Gain of an RTWO

In certain configurations herein, a dynamic element matching scheme is provided to linearize the fine-tuning gain characteristics of an RTWO. For example, dynamic element matching can be used to break a periodicity of a fixed sequence of segment selection used in the segmented decoding scheme for the RTWO. By reducing or eliminating periodicity in segment sequence selection, undesirable spurious frequency components can be mitigated. In contrast, a fixed sequence of selecting RTWO segments can degrade spectral integrity by generating spurious frequency components.

For example, a wide frequency ramp can straddle a full range of fine tuning codes. When a fixed sequence of segment selection is used, a spurious component appears at a frequency offset from the fundamental frequency. The frequency of the spurious component is based on the period of the fixed sequence of segment selection.

Table 5 below illustrates one example of a fixed sequence selection for one implementation of the multi-ring RTWO 600 of FIG. 11. In Table 5, W0, W1, W2, and W3 indicate the west tuning decoders of RTWO rings R0, R1, R2, and R3 respectively. Similarly, S0, S1, S2, and S3 indicate the south tuning decoders of RTWO rings R0, R1, R2, and R3 respectively. Likewise, E0, E1, E2, and E3 indicate the east tuning decoders of RTWO rings R0, R1, R2, and R3 respectively. Additionally, N0, N1, N2, and N3 indicate the north tuning decoders of RTWO rings R0, R1, R2, and R3 respectively.

sequence. The periodicity in segment selection can result in a degradation of the spectral purity of the RTWO's output clock phases.

In certain implementations herein, an RTWO decoding system is implemented with a dynamic element matching scheme to linearize the fixed sequence. Additionally, the dynamic element matching scheme can increase the period of the fixed sequence and/or remove periodicity altogether.

Figures 1, 13A:
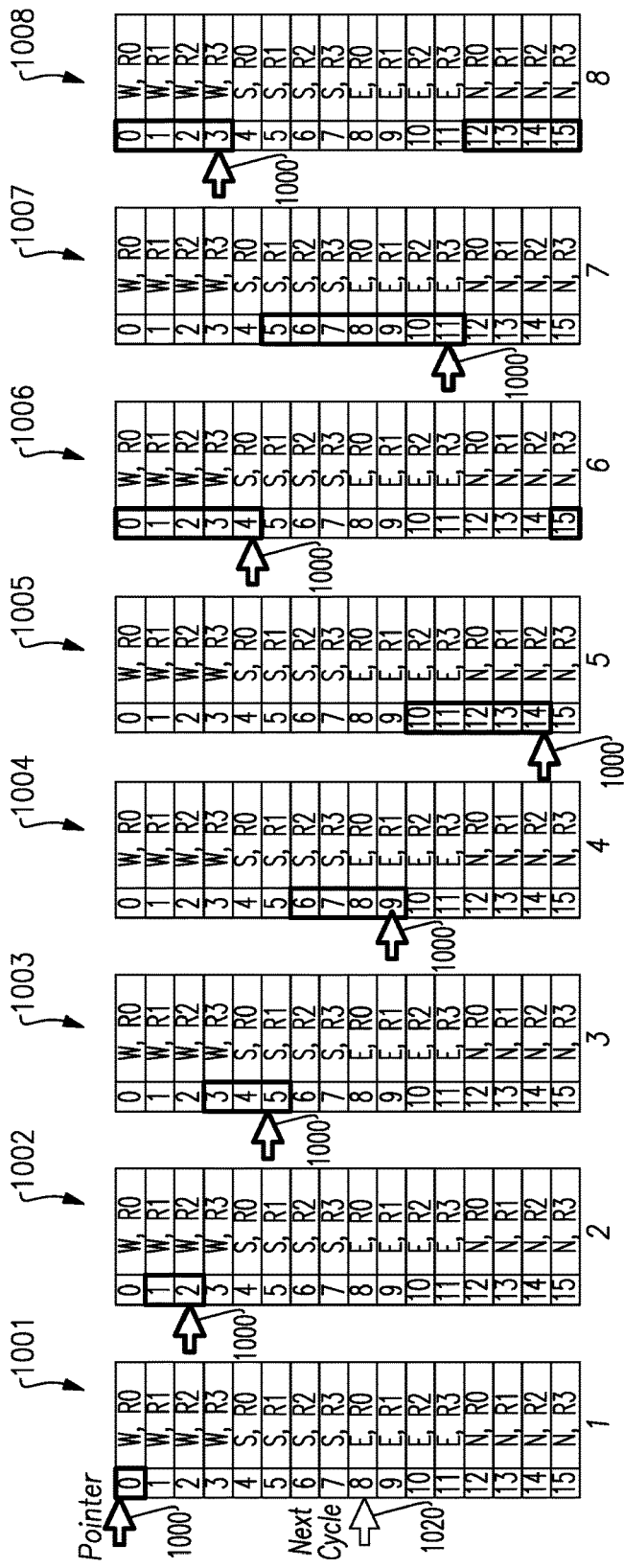
Figures 2, 13A:
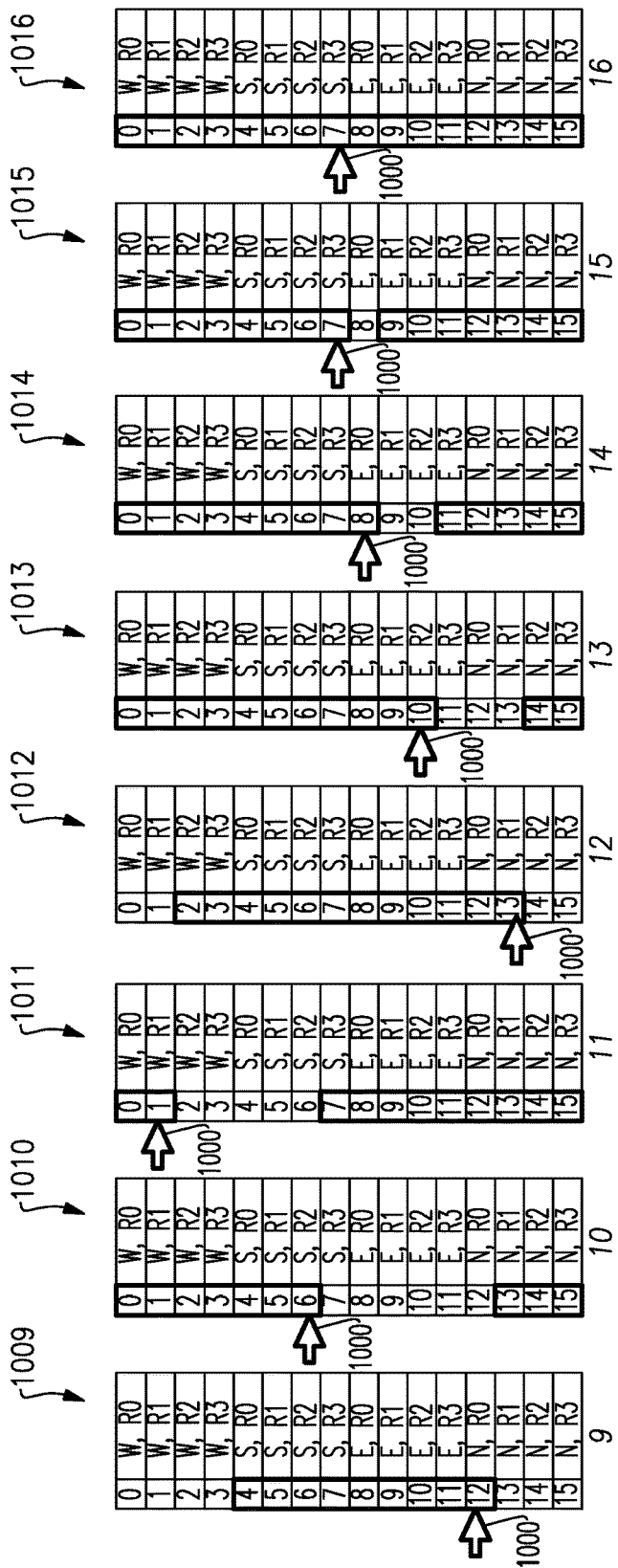

FIGS. 13A-1 and 13A-2 illustrate one embodiment of dynamic element matching for segment selection of an RTWO. The dynamic element matching scheme of FIGS. 13A-1 and 13A-2 illustrates one embodiment of dynamic element matching for the multi-ring RTWO 600 of FIG. 11. Thus, the illustrated embodiment of dynamic element matching is used in the context of sixteen tuning decoders, labeled as decoder 0 to decoder 15, respectively.

However, dynamic element matching schemes can be used for a wide variety of RTWOs, including, but not limited to, RTWOs including more or fewer rings, different implementations of rings, more or fewer segments, different implementations of segments, more or fewer tuning decoders, and/or different implementations of tuning decoders.

As shown in FIGS. 13A-1 and 13A-2, a sequence of a 16-decoder cycle (in this example) is shown, with the sequence of selected decoders labeled as first to sixteenth decoder selections 1001-1016, respectively. The decoder cycle indicates the selection of decoders in response to a ramp up in the fine integer code received by the RTWO. As discussed above, in certain applications, a wide frequency ramp can straddle the full range of fine tuning codes.

A pointer 1000 is used to indicate the last tuning decoder that has been selected. Additionally, a next cycle pointer 1020 indicates a tuning decoder that will be used at the start of a next decoder cycle (16-decoder cycle, in this example). As shown by the first decoder selection 1001, the next cycle pointer 1020 is positioned at a different decoder location than the pointer 1000 is located in the first decoder selection 1001. Implementing the dynamic element matching in this manner reduces periodicity in decoder selection by preventing two consecutive 16-decoder cycles from starting at the same decoder location.

TABLE 5

| fineint code | Decoder Outputs | | | | | | | | | | | | | | | |
|---|---|---|---|---|---|---|---|---|---|---|---|---|---|---|---|---|
| | W0 | W1 | W2 | W3 | S0 | S1 | S2 | S3 | E0 | E1 | E2 | E3 | N0 | N1 | N2 | N3 |
| 0 | 0 | 0 | 0 | 0 | 0 | 0 | 0 | 0 | 0 | 0 | 0 | 0 | 0 | 0 | 0 | 0 |
| 1 | 1 | 0 | 0 | 0 | 0 | 0 | 0 | 0 | 0 | 0 | 0 | 0 | 0 | 0 | 0 | 0 |
| 2 | 1 | 1 | 0 | 0 | 0 | 0 | 0 | 0 | 0 | 0 | 0 | 0 | 0 | 0 | 0 | 0 |
| 3 | 1 | 1 | 1 | 0 | 0 | 0 | 0 | 0 | 0 | 0 | 0 | 0 | 0 | 0 | 0 | 0 |
| 4 | 1 | 1 | 1 | 1 | 0 | 0 | 0 | 0 | 0 | 0 | 0 | 0 | 0 | 0 | 0 | 0 |
| 5 | 1 | 1 | 1 | 1 | 1 | 0 | 0 | 0 | 0 | 0 | 0 | 0 | 0 | 0 | 0 | 0 |
| 6 | 1 | 1 | 1 | 1 | 1 | 1 | 0 | 0 | 0 | 0 | 0 | 0 | 0 | 0 | 0 | 0 |
| 7 | 1 | 1 | 1 | 1 | 1 | 1 | 1 | 0 | 0 | 0 | 0 | 0 | 0 | 0 | 0 | 0 |
| 8 | 1 | 1 | 1 | 1 | 1 | 1 | 1 | 1 | 0 | 0 | 0 | 0 | 0 | 0 | 0 | 0 |
| 9 | 1 | 1 | 1 | 1 | 1 | 1 | 1 | 1 | 1 | 0 | 0 | 0 | 0 | 0 | 0 | 0 |
| 10 | 1 | 1 | 1 | 1 | 1 | 1 | 1 | 1 | 1 | 1 | 0 | 0 | 0 | 0 | 0 | 0 |
| 11 | 1 | 1 | 1 | 1 | 1 | 1 | 1 | 1 | 1 | 1 | 1 | 0 | 0 | 0 | 0 | 0 |
| 12 | 1 | 1 | 1 | 1 | 1 | 1 | 1 | 1 | 1 | 1 | 1 | 1 | 0 | 0 | 0 | 0 |
| 13 | 1 | 1 | 1 | 1 | 1 | 1 | 1 | 1 | 1 | 1 | 1 | 1 | 1 | 0 | 0 | 0 |
| 14 | 1 | 1 | 1 | 1 | 1 | 1 | 1 | 1 | 1 | 1 | 1 | 1 | 1 | 1 | 0 | 0 |
| 15 | 1 | 1 | 1 | 1 | 1 | 1 | 1 | 1 | 1 | 1 | 1 | 1 | 1 | 1 | 1 | 0 |
| 16 | 1 | 1 | 1 | 1 | 1 | 1 | 1 | 1 | 1 | 1 | 1 | 1 | 1 | 1 | 1 | 1 |

As shown in the example set forth in Table 5, as fineint_code increases the decoders activate or fire in a specific In the illustrated embodiment, the pointer 1000 begins at decoder 0 at the first decoder selection 1001. In certain implementations, if the pointer 1000 has never been set, for instance, at a chip power-up or reset, the pointer 1000 can be set to a particular starting value (for instance, decoder 0) or set to a random or pseudorandom decoder position.

As shown in FIGS. 13A-1 and 13A-2, the selected decoders change when transitioning from one decoder selection to the next decoder selection. For example, in the illustrated embodiment, the selected decoders in the next decoder selection begin after an end of the decoders of the current decoder selection. Thus, in this embodiment, all previously selected decoders are switched off when transitioning to the next decoder selection.

For example, when transitioning from the first decoder selection 1001 to the second decoder selection 1002, the decoder 0 is turned off and the decoders 1-2 are turned on. Additionally, when transitioning from the second decoder selection 1002 to the third decoder selection 1003, the decoders 1-2 are turned off and the decoders 3-5 are turned on. Furthermore, when transitioning from the third decoder selection 1003 to the fourth decoder selection 1004, the decoders 3-5 are turned off and the decoders 6-9 are turned on. Additionally, when transitioning from the fourth decoder selection 1004 to the fifth decoder selection 1005, the decoders 6-9 are turned off and the decoders 10-14 are turned on.

In the illustrated embodiment, the selected decoders are labeled in a numerical sequence beginning with a starting index 0 and ending with an ending index 15. Additionally, when the ending index is exceeded during decoder selection, the selected decoders wrap to include decoders beginning at the starting index. For example, when transitioning from the fifth decoder selection 1005 to the sixth decoder selection 1006, the decoders 10-14 are turned off and the decoders 15 and 0-4 are turned on.

As shown in the sixth to sixteenth decoder selections 1006-1016, the algorithm repeats until the sixteenth decoder selection 1016, in which all sixteen decoders are selected.

The number of selected decoders can be chosen based on the fine integer code. For example, in this embodiment, mod(fineint_code, 16)+1 can be computed in the case of distributed quantization across four rings. Additionally, fineint_code 0 does not select any decoders, in this example. Accordingly, a result will be a value between 1 to 16.

Depending on the current position of the pointer 1000, the result will select a certain number of decoders from the current pointer location. In one example, the pointer 1000 is located at decoder 5 and fineint_code=200, and mod(200, 16)+1=9, the 9 selected decoders correspond to decoders 6 through 14. Thereafter, the position of the pointer 1000 is located at decoder 14.

Dynamic element matching can operate in combination with quantized tuning. In one example, the embodiment of dynamic element matching of FIGS. 13A-1 and 13A-2 is used in combination with the embodiment of quantized tuning discussed earlier with respect to FIGS. 9A-9J. Implementing an RTWO in this manner results in a given RTWO ring being at most 1 LSB apart from other RTWO rings, thereby enhancing performance. Thus, both the benefits of dynamic element matching and quantized tuning can be realized. However, other implementations are possible.

Figures 1, 13B:
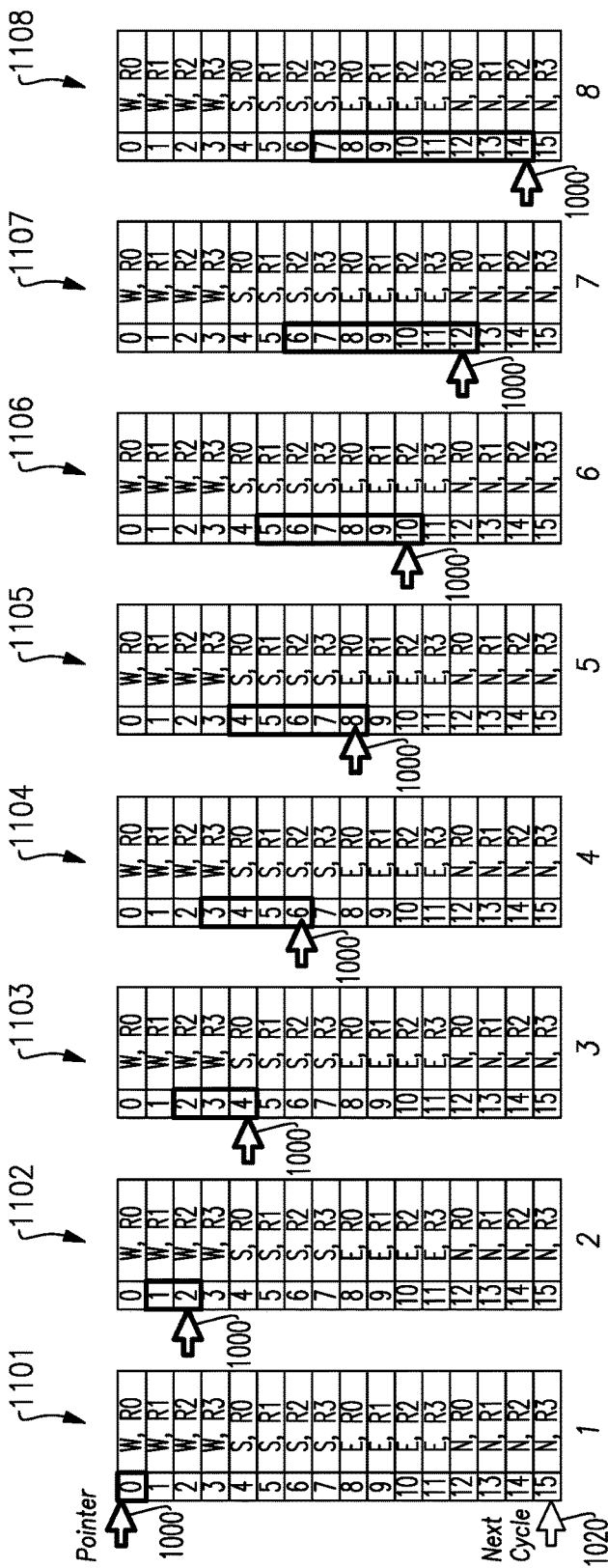
Figures 2, 13B:
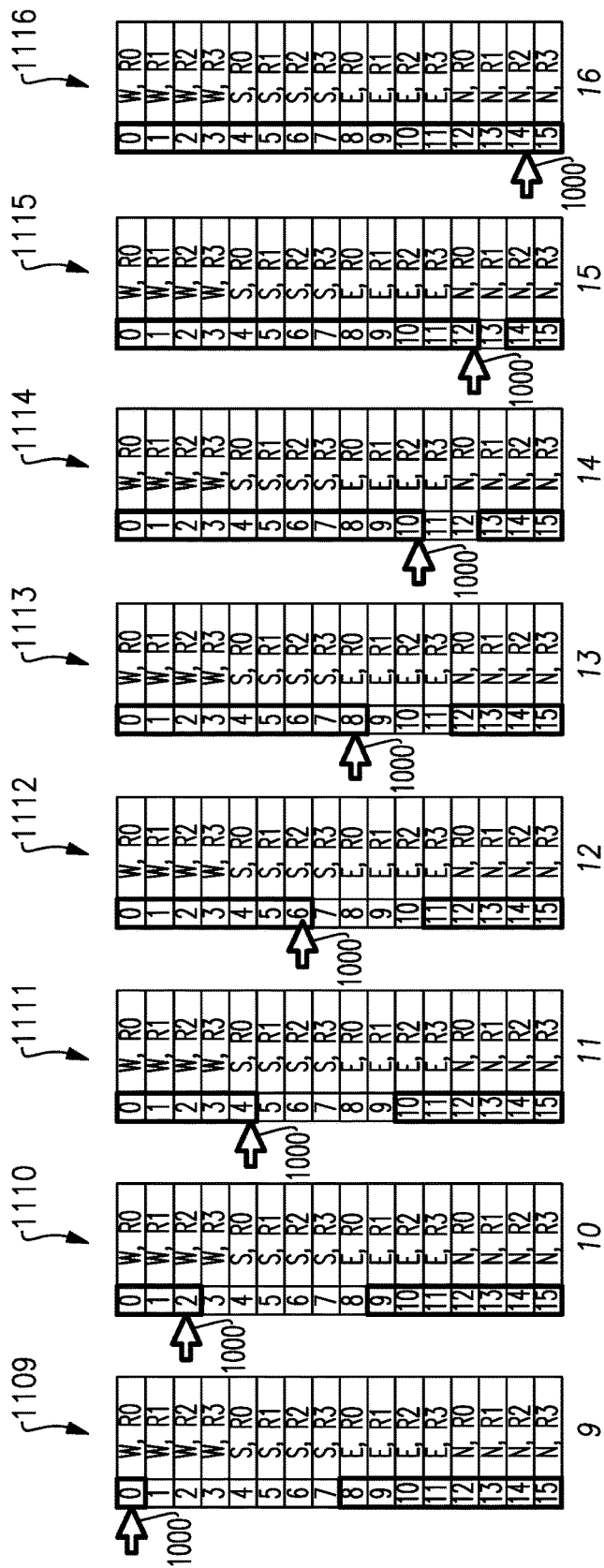

FIGS. 13B-1 and 13B-2 illustrate another embodiment of dynamic element matching for segment selection of an RTWO. The dynamic element matching scheme of FIGS. 13B-1 and 13B-2 illustrates one embodiment of dynamic element matching for the multi-ring RTWO 600 of FIG. 11. Thus, the illustrated embodiment of dynamic element matching is used in the context of sixteen tuning decoders, labeled as decoder 0 to decoder 15, respectively.

However, dynamic element matching schemes can be used for a wide variety of RTWOs, including, but not limited to, RTWOs including more or fewer rings, different implementations of rings, more or fewer segments, different implementations of segments, more or fewer tuning decoders, and/or different implementations of tuning decoders.

As shown in FIGS. 13B-1 and 13B-2, a sequence of a 16-decoder cycle (in this example) is shown, with the sequence of selected decoders labeled as first to sixteenth decoder selections 1101-1116, respectively. The decoder cycle indicates the selection of decoders in response to a ramp up in the fine integer code received by the RTWO.

The embodiment of dynamic element matching of FIGS. 13B-1 and 13B-2 is similar to the embodiment of dynamic element matching of FIGS. 13A-1 and 13A-2, except that dynamic element matching of FIGS. 13B-1 and 13B-2 is implemented to turn off only one decoder when transitioning from one decoder selection to the next decoder selection.

For example, when transitioning from the first decoder selection 1101 to the second decoder selection 1102, the decoder 0 is turned off and the decoders 1-2 are turned on. Additionally, when transitioning from the second decoder selection 1102 to the third decoder selection 1103, the decoder 1 is turned off, decoder 2 remains on, and decoders 3-4 are turned on. Furthermore, when transitioning from the third decoder selection 1103 to the fourth decoder selection 1104, the decoder 2 is turned off, decoders 3-4 remain on, and decoders 5-6 are turned on. Additionally, when transitioning from the fourth decoder selection 1104 to the fifth decoder selection 1105, the decoder 3 is tuned off, decoders 4-6 remain on, and decoders 7-8 are turned on.

As shown in the sixth to sixteenth decoder selections 1106-1116, the algorithm repeats until the sixteenth decoder selection 1116, in which all sixteen decoders are selected.

Additional details of the dynamic element matching of FIGS. 13B-1 and 13B-2 can be similar to those described earlier.

The dynamic element matching scheme of FIGS. 13A-1 and 13A-2 and the dynamic element matching scheme of FIGS. 13B-1 and 13B-2 are rotational dynamic element matching schemes. In the example with 16 decoder selections, there are 256 starting possibilities (16*16) for a rotational cycle. Although rotational dynamic element matching schemes reduce periodicity by increasing a length of the period of the fixed sequence, a degree of periodicity nevertheless can remain.

In certain embodiments, a segment decoder system is implemented to operate with a random or pseudorandom dynamic element matching.

For example, in certain embodiments, a pseudorandom binary sequence (PRBS) is used to change the selection sequence of the decoders. The PRBS can be generated in any suitable way, such as using digital logic circuitry.

In one example, the PRBS changes the selection pointer every certain number of codes, for instance, every 16 fine integer codes, every 128 fine integer codes, etc. Thus, an even longer rotational sequence can be achieved to break the periodicity of the decoder selection.

In another example, dynamic element matching is used to randomize the sequence in which segments are selected by a particular tuning decoder. Thus, rather than activating tuning capacitors associated with a particular tuning decoder in a given sequence, the order in which the tuning capacitors controlled by a particular tuning decoder is dynamically selected. Accordingly, dynamic element matching can be used both for breaking the periodicity in the selection of tuning decoders (a tuning decoder sequence) and/or in breaking the periodicity in tuning capacitors selected by the tuning decoders (a segment selection sequence).

Figures 1, 13C:
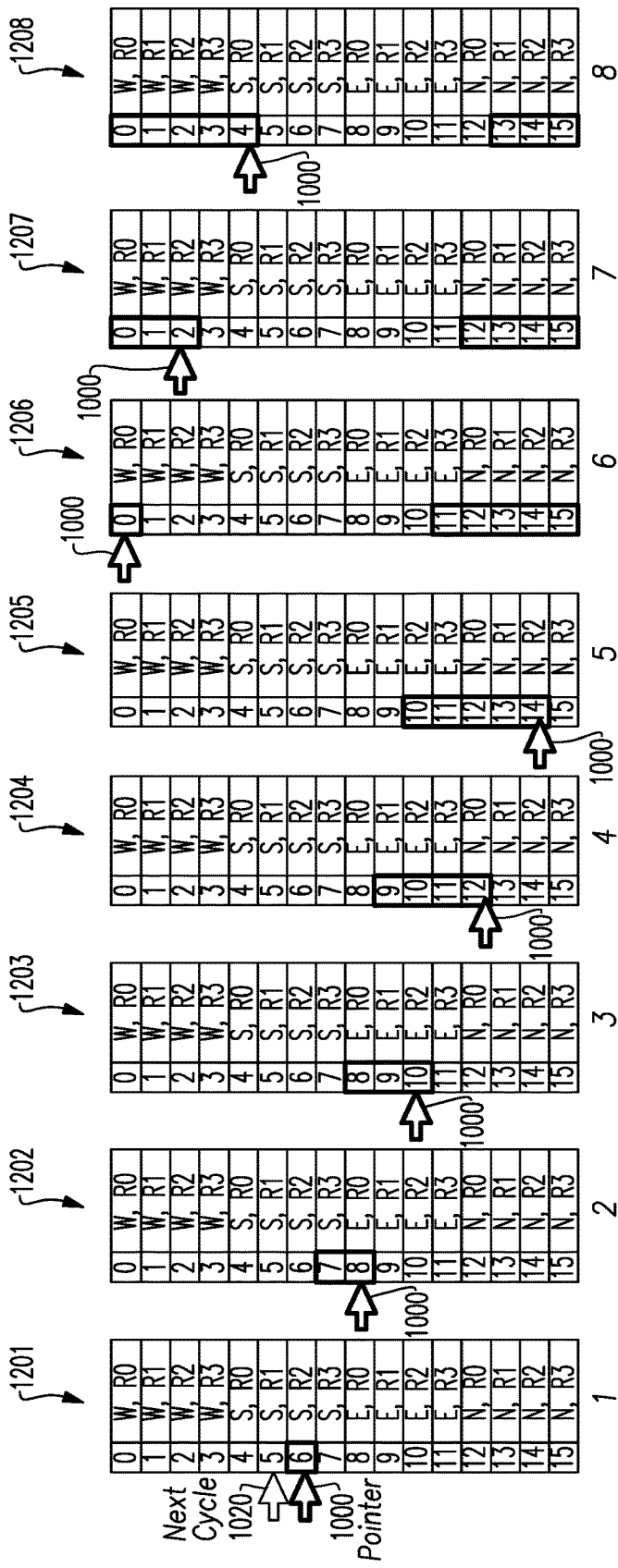
Figures 2, 13C:
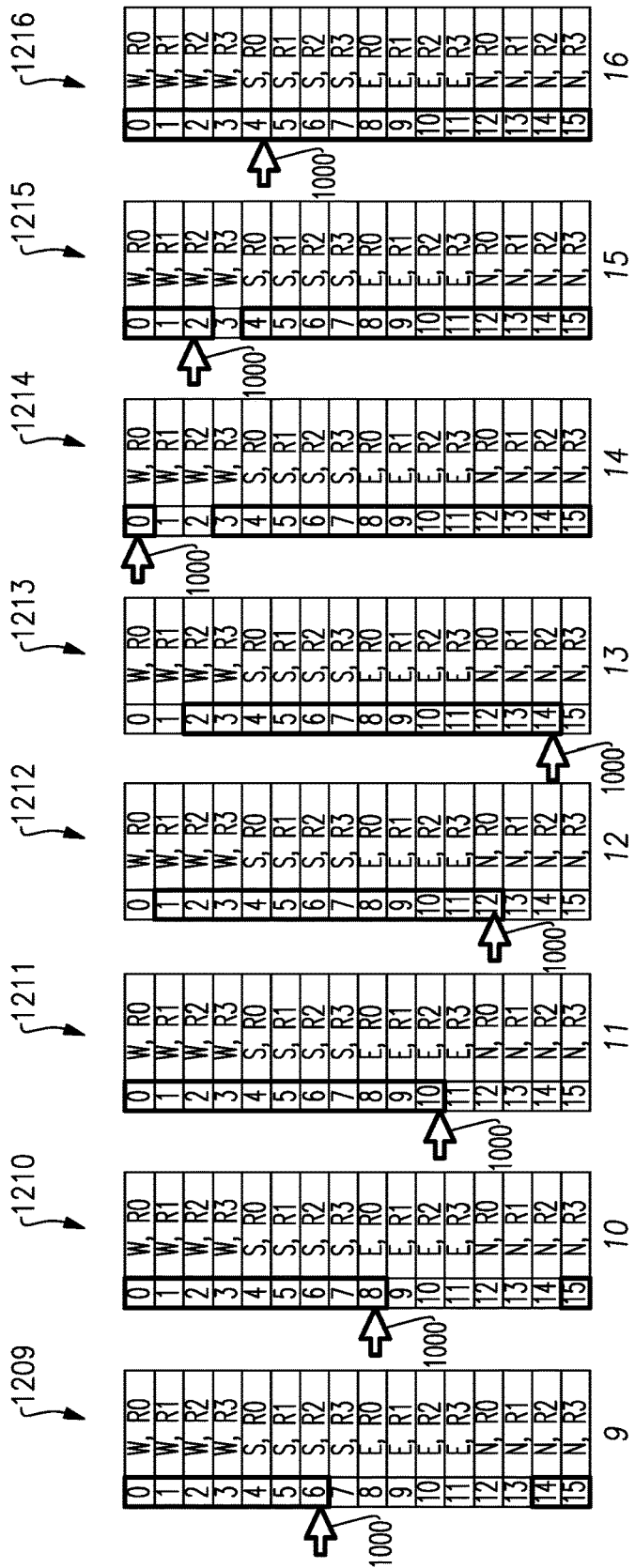

FIGS. 13C-1 and 13C-2 illustrate another embodiment of dynamic element matching for segment selection of an RTWO. The dynamic element matching of FIGS. 13C-1 and 13C-2 illustrates a sequence of a 16-decoder cycle (in this example), with the sequence of selected decoders labeled as first to sixteenth decoder selections 1201-1216, respectively. The decoder cycle indicates the selection of decoders in response to a ramp up in the fine integer code received by the RTWO.

The embodiment of dynamic element matching of FIGS. 13C-1 and 13C-2 is similar to that of FIGS. 13B-1 and 13B-2, except that a PRBS is used to choose selection of the next cycle pointer 1020 (position 5 has been pseudo randomly selected, in this example). Accordingly, the next cycle pointer 1020 has been selected via a pseudorandom process to begin at decoder 5 for the next decoder cycle.

Thus, an RTWO can be implemented to operate with dynamic element matching in a variety of ways. In one example, a tuning decoder system, such as the tuning decoder system 404 of FIG. 10, includes digital logic circuitry implemented to provide dynamic element matching.

Although specific examples of algorithms for dynamic element matching were provided above, dynamic element matching algorithms can be implemented in a wide variety of ways. In a first example, a random set of decoders is selected for a given fine tuning code. For instance, when three tuning decoders are activated in response to a particular fine tuning code, the selected tuning decoders can be randomly or pseudo randomly selected. In another example, PRBS is used to select between two or more fixed selections sequences. Thus, dynamic element matching can be implemented in a wide variety of ways.

Example of Segmented Digital Addressing Scheme for RTWO Segments

In certain configurations herein, a segmented digital addressing scheme is provided to individually control parameters of an RTWO's segments. In certain implementations, a serial interface communicates with the segments via segment decoders that operate with shared or common wires to reduce routing congestion. The controllable parameters can include, but are not limited to, bias settings (for instance, a bias current level) of the amplifiers used in the RTWO's regeneration circuits, bias settings of a sampling latch of the RTWO (for instance, for a time-to-digital converter function), and/or to provide a segment-specific capacitance adjustment to provide a linearity correction. Thus, the settings of a particular RTWO segment can be selected to provide adjustments or corrections for linearity or other operating characteristics, thereby enhancing performance.

With reference back to FIG. 10, the RTWO 400 includes the segment decoder system 403 including a segment decoder (SD) for each segment 100. The segment decoder system 403 serves to decode data received via the serial interface 406 to the RTWO's segments 100.

For example, the serial interface 406 of FIG. 10 receives input signals 413 including a segment data signal (rtwo_seg_ data<7:0>), a segment address signal (rtwo_seg_addr<4:0>), a write enable signal (rtwo_wr_en), a serial interface clock signal (rtwo_sclk), and a read data signal (rtwo_rd_ data<7:0>). In certain implementations, the serial interface 406 is implemented as a local serial peripheral interface (SPI).

In the illustrated embodiment, the digital routing bus 405 routes the input signals 413 to each SD of the segment decoding system 403 for decoding.

It can be desirable for the segments of an RTWO, such as the RTWO segments 100, to be configurable. To provide configurability, the RTWO segments 100 can be written or read to via the serial interface 406.

The illustrated RTWO 400 includes the segment decoder system 401, which reduces a number of routes associated with communicating with the RTWO segments 100. In certain implementations, the segment decoder system 403 operates using a local register map. The local register map is used to provide bit addresses for each of the segments, and is used to determine when the serial interface 406 is communicating with a particular one of the RTWO segments 100.

By including the segment decoder system 401, a number of data and address bus bits associated with routing from the serial interface 406 to the RTWO segments 100 can be reduced.

For example, in one specific implementation, a 4-ring RTWO with 32 segments per ring includes a data bus that operates using 8 bits common to 4 rings, and an address bus that operates using 8 bits common to 4 rings. In such an example, the 4-ring RTWO operates with 16 bits and wires.

In contrast, a similar 4-ring RTWO implemented with a segment decoder system can include 2048 bits and wires (16 bits per segment*32 segments*4 rings). Routing 2,048 wires from a serial interface to every segment of the RTWO is a daunting task, and can constrain the flexibility and/or scalability of the RTWO design. Moreover, a large collection of wires can act as a large antenna on a semiconductor chip.

FIG. 14 illustrates one embodiment of an RTWO 1500 with segmented digital addressing. The RTWO 1500 includes a ring including a first conductor 31, a conductor 32, and a crossover 33. The RTWO 1500 further includes a plurality of segments distributed around the ring. The RTWO 1500 further includes a segment decoder system including segment decoders 1501, 1502, 1503, and 1508. For clarity of the figures, only a portion of the ring, the segments, and the segmented decoder system are shown in FIG. 14. For example, FIG. 14 illustrates circuitry on a left-hand side of the RTWO ring.

Although one specific RTWO implementation is shown, the teachings herein are applicable to RTWOs implemented in a wide variety of ways, including, but not limited to, RTWOs with different ring implementations (including, for example, more rings and/or rings of different shape), different segment implementations, and/or different decoder implementations.

As shown in FIG. 14 segments on a left-hand side of the RTWO's ring have been labeled as segment 0, segment 1, segment 2, . . . , and segment 7. Thus, 8 segments are present on the left-hand side of the ring, in this example. Additionally, the segment decoder system includes a corresponding segment decoder for each segment. For example, a segment decoder 1501 is coupled to the segment 0, a segment decoder 1502 is coupled to the segment 1, a segment decoder 1503 is coupled to the segment 2, and the segment decoder 1508 is coupled to the segment 7. Thus, 8 segment decoder are present on the left-hand side of the ring, in this example.

In the illustrated embodiment, the segment decoder system receives data and address signals 1510. As shown in FIG. 14, the data and address signals 1510 includes an 8-bit segment data signal rtwo_seg_data<7:0>, and a 5-bit segment address signal rtwo_seg_addr<4:0>. Although an example with 8 data bits and 5 address bits is shown, other implementations are possible.

In certain implementations, the segmented decoder system 401 is implemented to provide addressing of segments associated with multiple rings. In one example, the segment address signal is implemented as an eight-bit signal rtwo_seg_addr<7:0>, with a first portion of the bits used to identify a segment location and a second portion of the bits used to identify a particular ring.

It can be desirable for the segments of an RTWO to be configurable. To provide configurability, the RTWO segments can be written to via the data and address signals 1510. In certain implementations, a segment decoder system is further implemented to read from segments, such as by using the read data signal rtwo_rd_data<7:0> shown in FIG. 10.

As shown in FIG. 14, each segment decoder communicates with a corresponding segment. For example, as shown in box 1511, the segment decoder 1501 provides a segment write signal seg_data_wr<15:0> to the segment 0. Additionally, as shown in box 1512, the segment decoder 1502 provides a segment write signal seg_data_wr<15:0> to the segment 1. Furthermore, as shown in box 1513, the segment decoder 1503 provides a segment write signal seg_data_wr<15:0> to the segment 2. Additionally, as shown in box 1518, the segment decoder 1508 provides a segment write signal seg_data_wr<15:0> to the segment 7.

Thus, each segment includes one or more configurable circuits that are programmed or configured using configuration bits provided via a segment write signal. In one embodiment, the one or more configurable circuits includes at least one of a regeneration circuit, a latch, a tuning capacitor, or a tap buffer.

In the illustrated embodiment, the segment write signal seg_data_wr<15:0> has a greater bit width than the segment data signal rtwo_seg_data<7:0>. Thus, in this example, a segment can be written in two cycles. By implementing segment writes over multiple cycles, a number of global segment data bits and corresponding wires can be reduced.

The illustrated segment decoders 1501, 1502, 1503, and 1508 each receive a segment address set signal seg_addr_set<4:0>, which have different values for different segment decoders (for instance, 00000, 00001, 00010, 00011, etc.). The segment address set signal seg_addr_set<4:0> is used to program a segment decoder with a code that indicates the segment decoder's location. In certain implementations, the segment address set signal seg_addr_set<4:0> is hard-wired, and has a value selected based on its position around the ring.

The segment decoder compares the segment address set signal seg_addr_set<4:0> to the segment address signal rtwo_seg_addr<4:0> to determine when the segment is being accessed.

In one embodiment, a segment decoder writes data to a corresponding segment when the segment address signal rtwo_seg_addr<4:0> matches the segment address set signal seg_addr_set<4:0>. When a address match is present, the segment decoder uses the segment write signal seg_data_wr<15:0> to write to the segment, with the written data corresponding to the bits of the segment data signal rtwo_seg_data<7:0>.

The written data can include, but is not limited to, a setting of an amplifier of the segment, a setting of a latch of the segment, and/or a capacitance setting of the segment (for instance, to add capacitance to provide a linearity correction to a particular segment). Thus, the settings of a particular RTWO segment can be selected to provide adjustments or corrections for linearity or other operating characteristics, thereby enhancing performance. The written data can be stored in a segment in any suitable way. In one example, a segment includes state elements, such as memory elements and/or latches (including, but not limited to registers) that store data for configuring the segment.

Although one example, of data and address signals 1510 is shown, other implementations are possible. In another example, one or more of the input signals 413 shown in FIG. 10 are provided to each of the segment decoders.

Although one embodiment of segmented digital addressing is shown in FIG. 14, the teachings herein are applicable to segmented digital addressing implemented in a wide variety of ways.

Figure 15:
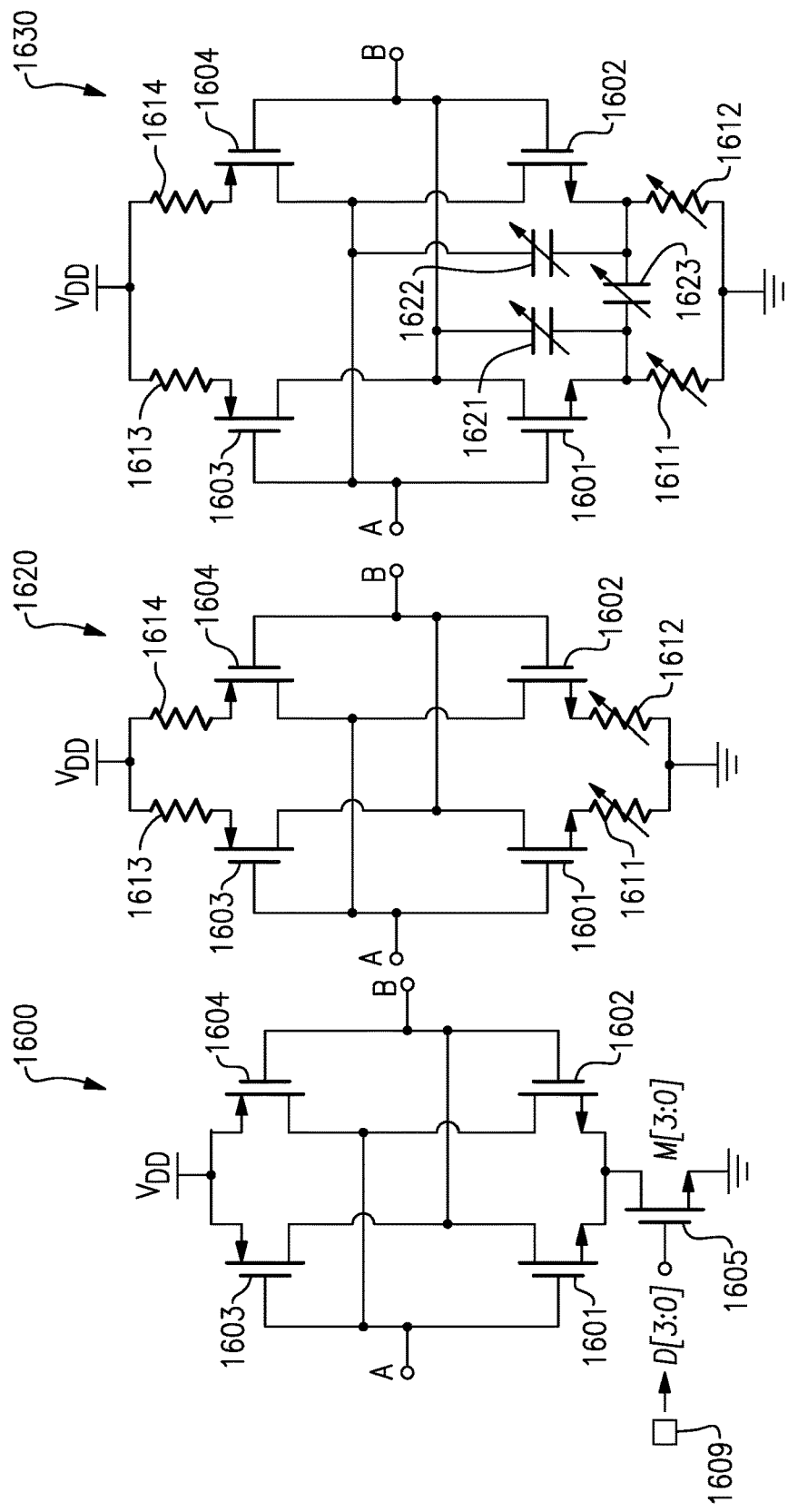
FIG. 15 illustrates various embodiments of programmable segment circuitry.

FIG. 15 illustrates various embodiments of programmable segment circuitry.

As shown in FIG. 15, one embodiment of a regeneration circuit 1600 with programmable bias current is shown. The regeneration circuit 1600 includes a first n-type field effect transistor (NFET) 1601 and a first p-type field effect transistor (PFET) 1603 that operate as a first inverter, and a second NFET 1602 and a second PFET 1604 that operate as a second inverter. The first and second inverters are connected back-to-back with an input of the first inverter connected to an output of the second inverter, and vice-versa. An instantiation of the regeneration circuit 1600 can be included in a segment, with a first terminal A connected to a first conductor of the RTWO's ring, and a second terminal B connected to a second conductor of the RTWO's ring.

The regeneration circuit 1600 includes a configurable bias current source implemented using a bank of parallel NFET transistors M[3:0], in this example. Additionally, four program bits D[3:0] from a configuration register 1609 of the segment are used to control selection of a number of active transistors and a corresponding amount of bias current of the inverters, in this embodiment.

With continuing reference to FIG. 15, one embodiment of a regeneration circuit 1620 with programmable degeneration resistors 161, 162 is shown. Each of the programmable degeneration resistors 161, 162 can include a plurality of parallel resistor elements selected via control bits, thereby controlling an amount of degeneration resistance. Additional details of the regeneration circuit 1620 can be similar to those of the regeneration circuit 1600.

As shown in FIG. 15, one embodiment of a regeneration circuit 1630 with programmable noise filter capacitors 1621, 1622, and 1623 is shown. Each of the noise filter capacitors 1621-1623 can include a plurality of parallel capacitor elements selected via control bits, thereby controlling an amount of capacitance. Additional details of the regeneration circuit 1640 can be similar to those of the regeneration circuit 1620.

Although FIG. 15 illustrates three examples of programmable segment circuitry, a wide variety of segment circuitry can be programmable. Examples of segment programmability include, but are not limited to, settings of amplifiers (for instance, bias current), settings of a TDC latch (for instance, sampling point), and/or tuning capacitance adjustment settings (for instance, fine code offset LSBs).

Example of RTWO-Based PLL System

Figure 16:
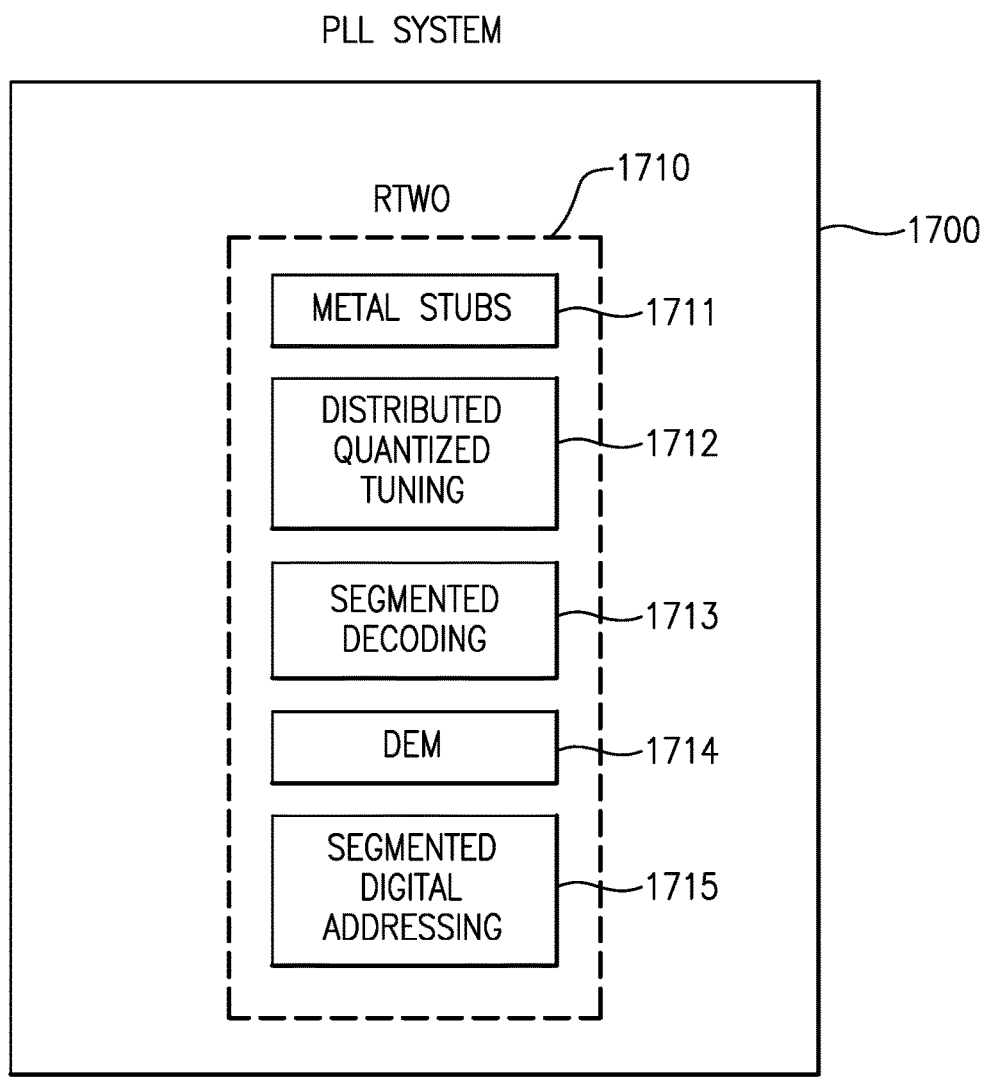
FIG. 16 illustrates one embodiment of an RTWO-based PLL system.

FIG. 16 illustrates one embodiment of an RTWO-based PLL system 1700. The PLL system 1700 includes an RTWO 1710. As shown in FIG. 16, the RTWO 1710 includes metal stubs 1711, a distributed quantized tuning system 1712, a segmented decoding system 1713, a dynamic element matching (DEM) system 174, and a segmented digital addressing system 1715.

The metal stubs 1711 are included in the RTWO's segments, and aid in providing access to additional layout resources for tuning capacitors and other circuitry, while permitting the length of RTWO's ring to be relative short. Thus, the metal stubs 1711 do not inhibit the RTWO 1710 from operating with relatively high oscillation frequency, for instance, 10 GHz or more, while providing connectivity to tuning capacitors that tune the RTWO's oscillation frequency over a wide tuning range and/or provide fine frequency step size.

The distributed quantized tuning system 1712 is used to control the tuning capacitors in the RTWO's segments using separately controllable code values, thereby enhancing the RTWO's frequency step size or resolution. In certain implementations, the RTWO 1710 includes multiple rings, and the distributed quantized tuning system 1712 separately sets the tuning capacitors across multiple RTWO rings. Implementing the RTWO with distributed quantized frequency tuning achieves a relatively fine frequency resolution, for instance, an LSB tuning resolution of 50 kHz/LSB or smaller.

The segmented decoding system 1713 is provided for RTWO frequency tuning codes to reduce decoding complexity. The segmented decoding system 1713 can include global and local decoders for processing frequency tuning codes to reduce routing congestion.

The dynamic element matching system 1714 linearizes the fine-tuning gain characteristics of the RTWO 1710. For example, the dynamic element matching system 1714 can be used to reduce or eliminate periodicity of a fixed sequence of segment selection used in the segmented decoding system 1713. By reducing or eliminating periodicity in segment sequence selection, undesirable spurious frequency components can be mitigated, thereby improving performance of the PLL system 1700.

The segmented digital addressing system 1715 can be used to individually control parameters of the RTWO's segments, and includes segment decoders that operate with shared or common wires to reduce routing congestion. The controllable parameters can include, but are not limited to, bias settings (for instance, a bias current level) of the amplifiers used in the RTWO's regeneration circuits, bias settings of a sampling latch of the RTWO (for instance, for a time-to-digital converter function), and/or to provide a segment-specific capacitance adjustment to provide a linearity correction to the RTWO 1710.

The PLL system 1700 illustrates one example of an electronic system that can include an RTWO implemented in accordance with the teachings herein. However, the RTWOs described herein can be used in a wide variety of electronic systems, including, but not limited to, a wide variety of data converters and/or frequency synthesizers.

Applications

Devices employing RTWOs including one or more of the above-described features can be implemented into various electronic devices. Examples of the electronic devices can include, but are not limited to, consumer electronic products, parts of the consumer electronic products, electronic test equipment, radar systems, etc. Examples of the electronic devices can also include circuits of optical networks or other communication networks. The consumer electronic products can include, but are not limited to, an automobile, a camcorder, a camera, a digital camera, a portable memory chip, a washer, a dryer, a washer/dryer, a copier, a facsimile machine, a scanner, a multifunctional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A rotary traveling wave oscillator (RTWO) comprising:
a first RTWO ring;
a plurality of segments positioned around the first RTWO ring and including a first segment and a second segment;
a plurality of tuning capacitors that are selectable to control an oscillation frequency of the RTWO and including a first plurality of capacitors in the first segment and a second plurality of capacitors in the second segment; and
segmented decoder circuitry positioned around the first RTWO ring, the segmented decoder circuitry operable to control selection of the plurality of tuning capacitors based on one or more frequency tuning codes wherein the segmented decoder circuitry includes a first decoder of the first segment configured to control selection of the first plurality of capacitors based on decoding a first input code, and a second decoder of the second segment configured to control selection of the second plurality of capacitors based on decoding a second input code that is separately controllable from the first input code.

2. The RTWO of claim 1, wherein the segmented decoder circuitry comprises a plurality of local decoders each configured to control a number of selected capacitors for a corresponding one of the plurality of segments, and a plurality of tuning decoders configured to control the plurality of local decoders based on the one or more frequency tuning codes.

3. The RTWO of claim 2, wherein the one or more frequency tuning codes comprises a fine frequency tuning code, wherein the segmented decoder circuitry is implemented such that a selection of one or more tuning decoders in response to a given value of the fine frequency tuning code is dynamically chosen.

4. The RTWO of claim 3, wherein the segmented decoder circuitry is implemented such that a sequence of selecting each of the plurality of tuning decoders is different for a first ramp of the fine frequency tuning code relative to a second ramp of the fine frequency tuning code.

5. The RTWO of claim 4, wherein the sequence of selecting rotates through a plurality of different selection sequences.

6. The RTWO of claim 4, wherein the sequence of selecting is chosen randomly or pseudo-randomly.

7. The RTWO of claim 1, wherein the segmented decoder circuitry is implemented such that a selection of one or more tuning capacitors in response to a given value of the one or more frequency tuning codes is dynamically chosen.

8. The RTWO of claim 1, where the first RTWO ring comprises a plurality of sides, wherein the segmented decoder circuitry is further configured to balance a number of selected tuning capacitors for each side of the RTWO ring.

9. The RTWO of claim 8, wherein the decoder circuitry is implemented such that the number of selected tuning capacitors per side of the RTWO ring is at most one tuning capacitor apart for each value of the one or more frequency tuning codes.

10. The RTWO of claim 1, further comprising a second RTWO ring in phase lock with the first RTWO ring, wherein the segmented decoder circuitry separately controls a number of selected capacitors of the first RTWO ring and the second RTWO ring.

11. The RTWO of claim 10, wherein the segmented decoder circuitry is further configured to balance a number of selected tuning capacitors for the first RTWO ring and the second RTWO ring.

12. The RTWO of claim 11, wherein the segmented decoder circuitry is implemented such that a number of selected tuning capacitors per RTWO ring is at most one tuning capacitor apart for each value of the one or more frequency tuning codes.

13. The RTWO of claim 1, wherein the plurality of tuning capacitors comprises a plurality of fine tuning capacitors and at least one of a plurality of coarse tuning capacitors or a plurality of process, voltage, and temperature (PVT) tuning capacitors, wherein the first plurality of capacitors controlled by the first decoder are fine tuning capacitors, and wherein the second plurality of capacitors controlled by the second decoder are fine tuning capacitors.

14. The RTWO of claim 1, wherein the one or more frequency tuning codes comprises a fine frequency tuning code, wherein the segmented decoder circuitry is further configured to receive an offset code operable to provide a capacitance adjustment to a particular segment of the plurality of segments by adjusting a value of the fine frequency tuning code.

15. The RTWO of claim 14, wherein the offset code is configured to provide a dynamic capacitance adjustment to the plurality of segments while the RTWO is operational to linearize the RTWO.

16. A rotary traveling wave oscillator (RTWO) comprising:
a first RTWO ring;
a plurality of segments positioned around the first RTWO ring, each segment of the plurality of segments comprising a plurality of fine tuning capacitors that are selectable to control an oscillation frequency of the RTWO; and
segmented decoder circuitry comprising a plurality of local decoders positioned around the first RTWO ring and including at least four local decoders for fine tuning, wherein each respective local decoder of the plurality of local decoders is configured to receive a respective fine integer tuning code for a respective segment of the plurality of segments to control the fine tuning capacitors in the respective segment, wherein the four local decoders receive separately controllable fine integer tuning codes.

17. The RTWO of claim 16, wherein the segmented decoder circuitry further comprises respective tuning decoders configured to control the respective fine integer tuning codes based on one or more frequency tuning codes.

18. The RTWO of claim 17, wherein the one or more frequency tuning codes comprises a fine frequency tuning code, wherein the segmented decoder circuitry is implemented such that a selection of one or more tuning decoders in response to a given value of the fine frequency tuning code is dynamically chosen.

19. The RTWO of claim 17, wherein the one or more frequency tuning codes comprises a fine frequency tuning code, wherein the segmented decoder circuitry is further configured to receive an offset code operable to provide a capacitance adjustment to a particular segment of the plurality of segments by adjusting a value of the fine frequency tuning code.

20. The RTWO of claim 16, further comprising a second RTWO ring in phase lock with the first RTWO ring, wherein the segmented decoder circuitry separately controls a number of selected capacitors of the first RTWO ring and the second RTWO ring.

* * * * *

UNITED STATES PATENT AND TRADEMARK OFFICE
CERTIFICATE OF CORRECTION

PATENT NO. : 10,277,233 B2
APPLICATION NO. : 15/288313
DATED : April 30, 2019
INVENTOR(S) : Hyman Shanan Page 1 of 1

It is certified that error appears in the above-identified patent and that said Letters Patent is hereby corrected as shown below:

On the Title Page

On page 3 in Column 3, Line 7, item (56) under Other Publications, after "Hakan," delete "37".

In the Specification

Column 11, Lines 56-58, in equation 2, change
"$f_{osc} = f_{rtwo} + n_{pvt,lsb} + n_{coarse} * \Delta f_{coarse,lsb} + n_{finei} * \Delta f_{finei,lsb} + n_{finef} * \Delta f_{finef,lsb}$" to
--$f_{osc} = f_{rtwo} + n_{pvt}\ \Delta f_{pvt,lsb} + n_{coarse}\ \Delta f_{coarse,lsb} + n_{finei}\ \Delta f_{finei,lsb} + n_{finef}\ \Delta f_{finef,lsb}$--.

Column 25, Line 59, change "seg_ data" to --seg_data--.

Column 25, Line 62, change "rd_ data" to --rd_data--.

Column 43, Line 65, change "seg_ data" to --seg_data--.

Column 44, Line 1, change "rd_ data" to --rd_data--.

Signed and Sealed this
Thirtieth Day of July, 2019

Andrei Iancu
*Director of the United States Patent and Trademark Office*